(12) United States Patent
Myung et al.

(10) Patent No.: US 11,177,830 B2
(45) Date of Patent: Nov. 16, 2021

(54) METHOD AND APPARATUS FOR DATA DECODING IN COMMUNICATION OR BROADCASTING SYSTEM

(71) Applicant: SAMSUNG ELECTRONICS CO., LTD., Suwon-si (KR)

(72) Inventors: Seho Myung, Suwon-si (KR); Min Jang, Suwon-si (KR); Yangsoo Kwon, Suwon-si (KR); Jeongho Yeo, Suwon-si (KR); Hongsil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/016,915

(22) Filed: Sep. 10, 2020

(65) Prior Publication Data
US 2021/0075442 A1    Mar. 11, 2021

(30) Foreign Application Priority Data

Sep. 10, 2019 (KR) ........................ 10-2019-0112447
Mar. 6, 2020 (KR) ........................ 10-2020-0028354

(51) Int. Cl.
*H03M 13/11* (2006.01)
*H04L 1/00* (2006.01)
(Continued)

(52) U.S. Cl.
CPC ..... *H03M 13/1102* (2013.01); *H03M 13/616* (2013.01); *H04L 1/0057* (2013.01); *H04L 25/03184* (2013.01); *G16Y 10/75* (2020.01)

(58) Field of Classification Search
None
See application file for complete search history.

(56) References Cited

U.S. PATENT DOCUMENTS 8,732,565 B2  5/2014  Pisek et al.
8,918,696 B2  12/2014  Ng et al.
(Continued)

FOREIGN PATENT DOCUMENTS

JP    2013-005124    1/2013
KR  10-2016-0140209  12/2016
(Continued)

OTHER PUBLICATIONS

International Search Report dated Dec. 8, 2020 in corresponding International Application No. PCT/KR2020/012247.

*Primary Examiner* — Phung M Chung
(74) *Attorney, Agent, or Firm* — Nixon & Vanderhye, P.C.

(57) ABSTRACT

The disclosure relates to a communication technique for converging a 5G communication system for supporting a higher data transfer rate beyond a 4G system with an IoT technology, and a system therefor. The disclosure may be applied to intelligent services (for example, smart home, smart buildings, smart cities, smart cars or connected cars, health care, digital educations, retail business, security and safety-related services, etc.) based on a 5G communication technology and an IoT-related technology. The disclosure provides an apparatus and a method for efficiently decoding a low-density parity-check (LDPC) code in a communication or broadcasting system. Further, the disclosure provides an LDPC decoding device and method for improving decoding performance without increasing the decoding complexity by applying suitable decoding scheduling according to the structural or algebraic characteristics of the LDPC code in a process of decoding the LDPC code using layered scheduling or a scheme similar thereto. Further, a method of a low density parity check (LDPC) decoding performed by a receiving device in a wireless communication system is provided, the method comprising: receiving, from a trans- (Continued)

mitting device, a signal corresponding to input bits; performing demodulation based on the signal to determine values corresponding to the input bits; identifying a number of the input bits based on the signal; identifying a base matrix and a lifting size based on the number of the input bits; identifying a parity check matrix based on the base matrix; identifying an index corresponding to the values; determining a number of layers based on the index and the lifting size; determining an order for LDPC decoding based on the number of layers and a predetermined sequence; and performing LDPC decoding to determine the input bits based on the values, the parity check matrix and the order.

12 Claims, 20 Drawing Sheets

(51) Int. Cl.
*H04L 25/03* (2006.01)
*H03M 13/00* (2006.01)
*G16Y 10/75* (2020.01)

(56) References Cited

U.S. PATENT DOCUMENTS

| | | | |
|---|---|---|---|
| 9,048,871 | B2 | 6/2015 | Varnica et al. |
| 9,088,302 | B2 | 7/2015 | Yang et al. |
| 11,012,185 | B2 * | 5/2021 | Jeong .................. H03M 13/15 |
| 2014/0082452 | A1 | 3/2014 | Shinohara et al. |
| 2015/0067440 | A1 | 3/2015 | Owen et al. |
| 2016/0352462 | A1 | 12/2016 | Oh et al. |
| 2017/0093435 | A1 | 3/2017 | Ikegaya et al. |
| 2019/0222229 | A1 | 7/2019 | Montorsi et al. |
| 2020/0366317 | A1 * | 11/2020 | Myung ................ H04L 1/0065 |

FOREIGN PATENT DOCUMENTS

| | | |
|---|---|---|
| KR | 10-2018-0133557 | 12/2018 |
| KR | 10-2019-0008335 | 1/2019 |

* cited by examiner

FIG. 16

| | | | | | | | | | | | | | | | |
|---|---|---|---|---|---|---|---|---|---|---|---|---|---|---|---|
| 9 | 117 | 204 | 26 | | 189 | | 205 | 0 | 0 | | | | | | |
| 167 | | 166 | 253 | 125 | 226 | 156 | 224 | 252 | | 0 | 0 | | | | |
| 81 | 114 | | 44 | 52 | | | 240 | 1 | | 0 | 0 | | | | |
| | 8 | 58 | | 158 | 104 | 209 | 54 | 18 | 128 | 0 | | | 0 | | |
| 179 | 214 | | | | | | | 71 | | | 0 | | | | |
| 231 | 41 | | | 194 | | 159 | | 103 | | | | 0 | | | |
| 155 | | | | 228 | | 45 | | 28 | 158 | | | | 0 | | |
| | 129 | | | 147 | | 140 | | | 3 | 116 | | | | 0 | |
| 142 | 94 | | | | | | | | 230 | | | | | | 0 |
| | 203 | | | | | | 205 | 61 | 247 | | | | | | 0 |

[1602]

[1606]

METHOD AND APPARATUS FOR DATA DECODING IN COMMUNICATION OR BROADCASTING SYSTEM

CROSS-REFERENCE TO RELATED APPLICATIONS

This application is based on and claims priority under 35 U.S.C. § 119 to Korean Patent Application Number 10-2019-0112447, filed on Sep. 10, 2019, in the Korean Intellectual Property Office, and Korean Patent Application Number 10-2020-0028354, filed on Mar. 6, 2020, in the Korean Intellectual Property Office, the disclosures of which are incorporated by reference herein in their entireties.

BACKGROUND

Field

The disclosure relates to a method and apparatus for data decoding using an LDPC decoder in an LDPC code-based communication or broadcasting system.

Description of Related Art

To meet the demand for wireless data traffic having increased since deployment of 4G communication systems, efforts have been made to develop an improved 5G or pre-5G communication system. Therefore, the 5G or pre-5G communication system may also be referred to as a "Beyond 4G Network" or a "Post LTE System". The 5G communication system is considered to be implemented in higher frequency (mmWave) bands, e.g., 60 GHz bands, so as to accomplish higher data rates. To decrease propagation loss of the radio waves and increase the transmission distance, beamforming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which may refer, for example, to a human centered connectivity network where humans generate and consume information, is now evolving to the Internet of things (IoT) where distributed entities, such as things, exchange and process information without human intervention. The Internet of everything (IoE), may refer, for example, to a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, machine type communication (MTC), and machine-to-machine (M2M) communication may be implemented by beamforming, MIMO, and array antennas. Application of a cloud radio access network (RAN) as the above-described big data processing technology may also be considered an example of convergence of the 5G technology with the IoT technology.

In a communication/broadcasting system, link performance may be significantly deteriorated due to several types of noise in a channel, a fading phenomenon, and inter-symbol interference (ISI). Therefore, in order to implement high speed digital communication/broadcasting systems requiring a high data throughput and reliability, such as the next generation mobile communication, digital broadcasting, and portable Internet, it has been required to develop a technology to overcome problems occurring from the noise, fading, ISI, and the like. Recently, as a part of research for overcoming noise and the like, studies on an error-correcting code have been conducted actively as to a method for increasing reliability of communication by efficiently reconstructing distorted information.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an apparatus and method for efficiently decoding a low-density parity-check (LDPC) code in a communication or broadcasting system.

Embodiments of the disclosure also provide an LDPC decoding device and method for improving decoding performance without increasing the decoding complexity by applying suitable decoding scheduling according to the structural or algebraic characteristics of an LDPC code in the process of decoding the LDPC code using layered scheduling or a scheme similar thereto.

According to an example embodiment, the disclosure provides a method of a low density parity check (LDPC) decoding performed by a receiving device in a wireless communication system comprising: receiving, from a transmitting device, a signal corresponding to input bits; performing demodulation based on the signal to determine values corresponding to the input bits; identifying a number of the input bits based on the signal; identifying a base matrix and a lifting size based on the number of the input bits; identifying a parity check matrix based on the base matrix; identifying an index corresponding to the values; determining a number of layers based on the index and the lifting size; determining an order for low-density parity-check (LDPC) decoding based on the number of layers and a predetermined sequence; and performing LDPC decoding to determine the input bits based on the values, the parity check matrix and the order.

According to an example embodiment, the disclosure provides a receiving device for low density parity check (LDPC) decoding in a wireless communication system comprising: a transceiver; and a controller coupled with the transceiver, the controller configured to: control the receiving device to receive, from a transmitting device, a signal corresponding to input bits, perform demodulation based on the signal to determine values corresponding to the input bits, identify a number of the input bits based on the signal, identify a base matrix and a lifting size based on the number of the input bits, identify a parity check matrix based on the base matrix, identify an index corresponding to the values, determine a number of layers based on the index and the lifting size, determine an order for LDPC decoding based on the number of layers and a predetermined sequence, and perform LDPC decoding to determine the input bits based on the values, the parity check matrix and the order.

According to an example embodiment, the disclosure provides a method for performing LDPC decoding by a receiver in a communication system, the method including: receiving a signal corresponding to a transport block and a code block; and performing low-density parity-check (LDPC) decoding using the signal and a parity-check matrix to decode the code block, wherein the performing of LDPC decoding includes performing decoding using at least a partial area of the parity-check matrix based on a predetermined decoding scheduling rule.

According to an example embodiment, the disclosure provides a communication system including: a transceiver; and a controller configured to perform control to receive a signal corresponding to a transport block and a code block; and perform low-density parity-check (LDPC) decoding using the signal and a parity-check matrix to decode the code block, wherein the performing of LDPC decoding i includes decoding using at least a partial area of the parity-check matrix based on a predetermined decoding scheduling rule.

According to an example embodiment, the disclosure provides a receiver configured to receive and process a signal corresponding to a transport block and a code block in a communication system, the receiver including: a controller configured to perform control to determine values corresponding to LDPC information word bits, first parity bits, and second parity bits from the received signal, and perform decoding using at least a part of a parity check matrix of an LDPC code, wherein the parity check matrix of the LDPC code includes: a first part including a first submatrix corresponding to the LDPC information word bits and a second submatrix configured by columns of degree 2 and columns of degree 3 and corresponding to the first parity bits; and a second part including a third submatrix corresponding to the LDPC information word bits, a fourth submatrix corresponding to the first parity bits, and a fifth submatrix corresponding to the second parity bits and configured by an identity matrix.

According to an example embodiment, the disclosure provides a decoding method by a receiver, the method including: receiving a signal corresponding to an input bit transmitted from a transmitter; identifying a number of input bits based on the signal; identifying a size of a code block based on the number of input bits; and performing layered decoding based on a parity-check matrix corresponding to the size of the code block, wherein the layered decoding is first performed on a layer corresponding to at least one row block among row blocks of degree 1 in a submatrix corresponding to a column block to be punctured.

According to an example embodiment, the disclosure provides a receiver including: a transceiver; and a controller configured to: control the receiver to receive a signal corresponding to an input bit transmitted from a transmitter; identify a number of input bits based on the signal; identify a size of a code block based on the number of input bits; and perform layered decoding based on a parity-check matrix corresponding to the size of the code block, wherein the layered decoding is first performed on a layer corresponding to at least one row block among row blocks of degree 1 in a submatrix corresponding to a column block to be punctured.

According to an example embodiment, the disclosure provides a decoding method by a receiver, the method including: receiving a signal corresponding to an input bit transmitted from a receiver; identifying a number of input bits based on the signal; identifying a size of a code block based on the number of input bits; and performing layered decoding based on a parity-check matrix corresponding to the size of the code block, wherein the layered decoding is performed based on the decoding order as follows:

Pattern-1:

[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

Pattern-2:

[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

According to an example embodiment, the disclosure provides a receiver including: a transceiver; and a controller configured to: control the receiver to receive a signal corresponding to an input bit transmitted from a transmitter; identify a number of input bits based on the signal; identify a size of a code block based on the number of input bits; and perform layered decoding based on a parity-check matrix corresponding to the size of the code block.

Pattern-1:

[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

Pattern-2:

[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

According to various embodiments of the disclosure, efficient decoding performance may be supported according to LDPC decoding scheduling. For example, in a case where a layered scheduling-based LDPC decoding scheme is applied, LDPC decoding performance, e.g., improved error-correcting performance or fast decoding convergence performance can be improved without increasing the decoding complexity.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 16 is a diagram illustrating an example of a parity-check matrix for an LDPC code according to an embodiment;

DETAILED DESCRIPTION

Figure 1:
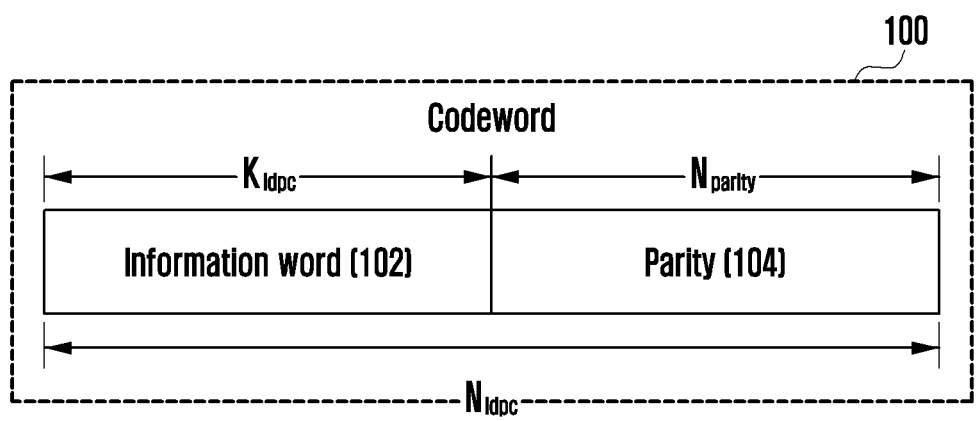
FIG. 1 is a diagram illustrating an example structure of a systematic LDPC codeword according to an embodiment.

Hereinafter, various example embodiments of the disclosure will be described in greater detail in conjunction with the accompanying drawings. In the following description of the disclosure, a detailed description of known functions or configurations incorporated herein may be omitted when it may make the subject matter of the disclosure rather unclear. The terms which will be described below are terms defined in consideration of the functions in the disclosure, and may be different according to users, intentions of the users, or customs. Therefore, the terms should be understood based on the contents throughout the disclosure.

It is to be understood that the subject matter of the disclosure is also applicable to other systems having similar technical backgrounds, with a slight variation not exceeding the scope of the disclosure, and can be carried out by a person skilled in the art. For reference, a communication system is a term generally including a broadcasting system, but in the disclosure, in the case where a broadcasting service is a major service in a communication system, the communication system may be more clearly referred to as a broadcasting system.

The advantages and features of the disclosure and ways to achieve them will be apparent by making reference to embodiments as described below in conjunction with the accompanying drawings. However, the disclosure is not limited to the embodiments set forth below, but may be implemented in various different forms. The following example embodiments are provided merely by way of non-limiting example. Throughout the disclosure, the same or like reference numerals designate the same or like elements.

Methods disclosed in the claims and/or methods according to various example embodiments described in the disclosure may be implemented by hardware, software, or a combination of hardware and software.

A low density parity check (hereinafter, LDPC) code initially introduced by Gallager in the 1960s has been long forgotten due to the technological complexity of the LDPC code that could not be implemented at a technological level in those days. However, as a turbo code suggested by Berrou, Glavieux, and Thitimajshima in 1993 shows performance approaching Shannon's channel capacity of many analyses for performance and features of the turbo code have been conducted. Therefore, many studies on channel encoding based on a graph and iterative decoding have been conducted. As a result, the LDPC code was again studied in the latter half of the 1990s, and it has been revealed that the performance approaches the Shannon's channel capacity when decoding is performed by applying iterative decoding based on a sum-product algorithm on a Tanner graph corresponding to the LDPC code.

The LDPC code generally includes a parity-check matrix and may be expressed by a bipartite graph commonly referred to as a Tanner graph. In general, the LDPC code may include a kind of parity check code. However, it is usual that the proportion (e.g., the density) of the number of is in a very long parity-check matrix is very low, and thus this code is referred to as a "low-density" parity check (LPDC) code. Therefore, proposed discussion based on an LPDC code in the disclosure is easily extendable to a general parity check matrix code.

FIG. 1 is a diagram illustrating an example structure of a systematic LDPC codeword according to an embodiment.

According to FIG. 1, the LDPC codes are encoded by receiving an information word 102 formed of Kiapc bits or symbols to generate a codeword 100 formed of Niapc bits or symbols. Hereinafter, for convenience of explanation, it is assumed that the codeword 100 formed of Niapc bits is generated by receiving the information word 102 including Kiapc bits. For example, when the information word $I=*[i_0, i_1, i_2, \ldots, i_{K_{ldpc}-1}]$ 102 which is formed of $K_{ldpc}$ input bits is LDPC encoded, the codeword $c=[c_0, c_1, c_2, c_3, \ldots, c_{N_{ldpc}-1}]$ 100 is generated. For example, the information word and the codeword are a bit string formed of a plurality of bits, and information word bits and codeword bits denote bits configuring the information word and the codeword, respectively. Generally, in the case of a systematic code, the LDPC-encoded bit includes information words such as $C=[c_0, c_1, c_2, c_3, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$. Here, $P=[p_0, p_1, p_2, \ldots,$ $p_{N_{ldpc}-K_{ldpc}-1}$] is a parity bit 104 and the number $N_{parity}$ of parity bits is expressed by $N_{parity}=N_{ldpc}-K_{ldpc}$.

The LDPC codes may include, for example, a kind of linear block code and include a process of determining a codeword satisfying conditions of <Equation 1> below.

$$H \cdot c^T = [h_1 \ h_2 \ h_3 \ \ldots \ h_{N_{ldpc}-1}] \cdot c^T = \sum_{i=0}^{N_{ldpc}} c_i \cdot h_i = 0 \quad \text{[Equation 1]}$$

Here, $c=[c_0, c_1, c_2, c_3, \ldots, c_{N_{ldpc}-1}]$

In mathematical expression of equation 1 above, H represents a parity-check matrix, C represents a codeword, $c_i$ represents an i-th bit of the codeword, and $N_{ldpc}$ represents a codeword length. Here, hi represents an i-th column of the parity-check matrix H.

The parity-check matrix H is configured by the same $N_{ldpc}$ columns as the number of bits of the LDPC codeword. The <mathematical expression 1> represents that, since a sum of a product of the i-th column hi of the parity-check matrix and the i-th bit $c_i$ of the codeword becomes "0", the i-th column hi has a relationship with the i-th bit $c_i$ of the codeword.

Figure 2:
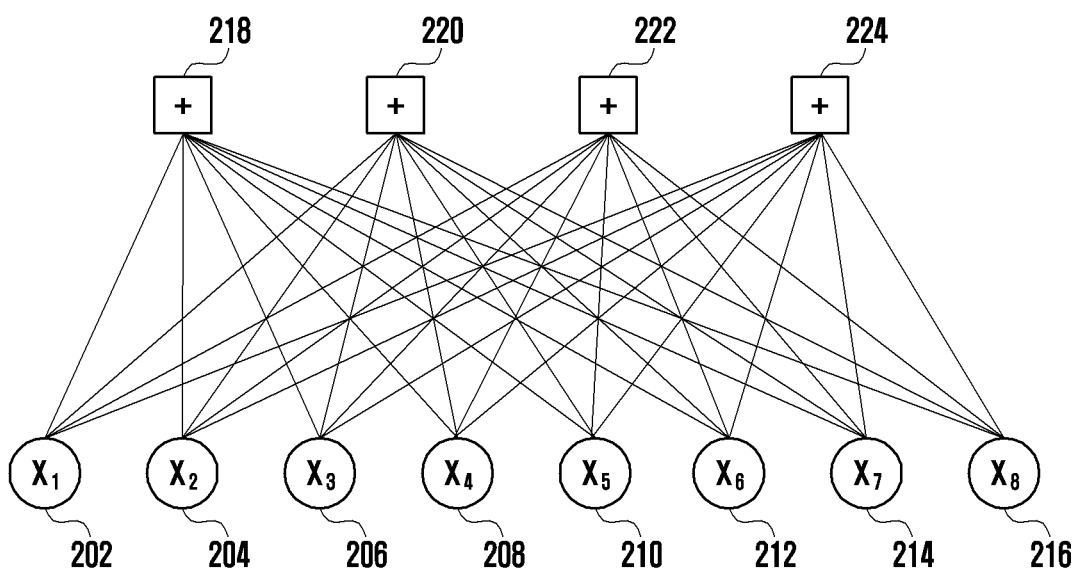
FIG. 2 is a diagram illustrating an example graph representation method of an LDPC code according to an embodiment.

FIG. 2 is a diagram illustrating an example graph representation method of an LDPC code according to an embodiment.

A graph representation method of an LDPC code will be described with reference to FIG. 2.

FIG. 2 is a diagram illustrating an example of a parity-check matrix $H_1$ of an LDPC code configured of four rows and eight columns and a Tanner graph thereof. Referring to FIG. 2, since the parity-check matrix $H_1$ has eight columns, it generates a codeword having a length of eight, a code generated through $H_1$ denotes an LDPC code, and each column corresponds to eight encoded bits.

Referring to FIG. 2, a Tanner graph of the LDPC code encoded and decoded based on the parity-check matrix $H_1$ is configured of eight (8) variable nodes, that is, $x_1$ 202, $x_2$ 204, $x_3$ 206, $x_4$ 208, $x_5$ 210, $x_6$ 212, $x_7$ 214, and $x_8$ 216 and four check nodes 218, 220, 222, and 224. Here, an i-th column and a j-th row of the parity-check matrix $H_1$ of the LDPC code correspond to a variable node $x_i$ and a j-th check node, respectively. In addition, a value one (that is, a value that is not zero) of a point at which a i-th column and j-th row of the parity-check matrix $H_1$ of the LDPC code intersect with each other may, for example, be that an edge connecting the variable node $x_1$ and the j-th check node to each other is presented in the Tanner graph as shown in FIG. 2.

Degrees of variable nodes and check nodes in the Tanner graph of the LDPC code denote the number of edges connected to the respective nodes, which is the number of entries that are not zero in a column or a row corresponding to a corresponding node in the parity-check matrix of the LDPC code. For example, in FIG. 2, degrees of the variable nodes $x_1$ 202, $x_2$ 204, $x_3$ 206, $x_4$ 208, $x_5$ 210, $x_6$ 212, $x_7$ 214, and $x_8$ 216 are sequentially 4, 3, 3, 3, 2, 2, 2 and 2, respectively, and degrees of the check nodes 218, 220, 222, and 224 are sequentially 6, 5, 5 and 5, respectively. In addition, the numbers of entries that are not zero in the respective columns of the parity-check matrix $H_1$ of FIG. 2 corresponding to the variable nodes of FIG. 2 sequentially coincide with the above-mentioned degrees 4, 3, 3, 3, 2, 2, 2 and 2, and the numbers of entries that are not zero in the respective rows of the parity-check matrix $H_1$ of FIG. 2 corresponding to the check nodes of FIG. 2 sequentially coincide with the above-mentioned degrees 6, 5, 5 and 5. For this reason, the degree of each variable node is also referred to as a column degree or column weight, and the degree of a check node is also referred to as a row degree or row weight.

In summary, the degree in the parity-check matrix of the LDPC code denotes the number of entries that are not zero in a column or row. In addition, in the parity-check matrix, the number of entries that are not zero in one column may be expressed as the degree of the column or the weight of the column, and the number of non-zero entries in one row may be expressed as the degree of the row or the weight of the row. In addition, the entries of the parity-check matrix or the edges on the Tanner graph may be expressed as hardware-connected inside the variable node processor (VNU) or the check node processor (CNU) in the LDPC decoder, and also may be expressed differently in various methods such as a line, a connection line, an edge, an interconnection network, a shift network, and the like. The interconnection networks are used to input or output appropriate values for LDPC decoding between node processors of the LDPC decoder.

The LDPC code may be decoded using an iterative decoding algorithm based on a sum-product algorithm on a bipartite graph arranged in FIG. 2. The sum-product algorithm may refer, for example, to a kind of message passing algorithm, which is an algorithm exchanging messages through edges on the bipartite graph and calculating and updating an output message from messages input to variable nodes or check nodes.

The value of the i-th encoded bit may be determined based on the message of the i-th variable node. The value of the i-th encoded bit may be determined by both hard decision and soft decision. Therefore, the performance of $c_i$, which is the i-th bit of the LDPC codeword, corresponds to the performance of the i-th variable node of the Tanner graph, which may be determined according to the position and the number of is in the i-th column of the parity-check matrix. In other words, the performance of the Niapc codeword bits of the codeword may be influenced by the position and number of 1 s in the parity-check matrix, which denotes that the performance of the LDPC code is greatly affected by the parity-check matrix. Therefore, in order to design an LDPC code having excellent performance, a method of designing a good parity-check matrix is required.

The parity-check matrix used in the communication and broadcasting system uses a quasi-cyclic (QC) LDPC code (hereinafter QC-LDPC code) that generally uses a parity-check matrix in a quasi-cyclic type for ease of implementation.

The QC-LDPC code is characterized by including a zero matrix having a shape of a small square matrix or a parity-check matrix formed of circulant permutation matrices. Here, the permutation matrix refers to a matrix in which each row or column includes only one 1 and the remaining entries are 0. In addition, the circulant permutation matrix denotes a matrix in which respective entries of an identity matrix are circularly shifted to the right or left.

Hereinafter, the QC-LDPC code will be described in detail.

First, a circulant permutation matrix $P=(P_{i,j})$ having the size of L×L is defined as shown in <Equation 2>. Here, $P_{i,j}$ denotes an entry of the i-th row and j-th column of the matrix P (0≤i, j<L).

$$P_{i,j} = \begin{cases} 1 & \text{if } i+1 \equiv j \bmod L \\ 0 & \text{otherwise} \end{cases} \quad \text{[Equation 2]}$$

In regard to the permutation matrix P defined as above, $P^i$ ($0 \leq i < L$) is a circulant permutation matrix in the form in which each entry of the identity matrix having the size of L×L is circularly shifted i times to the right.

The parity-check matrix H of the QC-LDPC code can be expressed in the form of <Equation 3> below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{[Equation 3]}$$

If $P^{-1}$ is defined as a zero matrix having the size of L×L, each exponent $\alpha_{i,j}$ of the circulant permutation matrix or zero-matrix in <Equation 3> may have one value among $\{-1, 0, 1, 2, \ldots, L-1\}$ values. In addition, since the parity-check matrix H of <Equation 3> is formed of n column blocks and m row blocks, it can be seen that the parity-check matrix H has a size of mL×nL.

If the parity-check matrix of <Equation 3> has a full rank, it would be apparent that the size of information word bits of QC-LDPC code corresponding to the parity-check matrix is (n−m)L. For convenience of explanation, (n−m) column blocks corresponding to information word bits are called information word column blocks, and m column blocks corresponding to the remaining parity bits are called parity column blocks. When the parity-check matrix of <Equation 3> does not have a full rank, the size of the information word bit becomes larger than (n−m)L.

In general, a binary matrix having the size of m×n, obtained by replacing each circulant permutation matrix and zero-matrix in the parity-check matrix of <Equation 3> by "1" and "0", respectively, is called a mother matrix of the parity-check matrix H or a base matrix M(H), and an integer matrix having the size of m×n obtained by selecting the exponent of each circulant permutation matrix or zero-matrix as in <Equation 4> is called an exponent matrix E(H of the parity-check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix} \quad \text{[Equation 4]}$$

As a result, since one integer included in the exponent matrix corresponds to the circulant permutation matrix in the parity-check matrix or a zero-matrix, the exponent matrix may be expressed as sequences of integers, for convenience. In general, the parity-check matrix can be expressed as not only the exponent matrix but also as various sequences that can express the algebraically equivalent characteristics. In the disclosure, for convenience, the parity-check matrix is expressed as a sequence indicating the location of "1" in the exponent matrix or the parity-check matrix. However, there are various sequence notation that can distinguish the location of "1" or "0" included in the parity-check matrix, and the parity-check matrix may be indicated in the form of various sequences having algebraically equivalent effect without being limited to the method expressed in the specification. The sequence may be referred to in various ways such as an LDPC sequence, an LDPC code sequence, an LDPC matrix sequence, or a parity-check matrix sequence, etc. in order to be distinguished from other sequences.

In addition, even if the transmission or reception apparatus on a device may perform LDPC encoding and decoding by directly generating the parity-check matrix, it may also perform the LDPC encoding and decoding using an exponent matrix or a sequence having algebraically the same effect as that of the parity-check matrix according to implementation characteristics. Accordingly, in the disclosure, for convenience, although the encoding and decoding using a parity-check matrix have been described, it may be considered that the encoding and decoding can be implemented on an actual device through various methods capable of obtaining the same effect as that of the parity-check matrix.

For reference, the algebraically same effect denotes that it is possible to explain or convert two or more different expressions so that they are logically or mathematically perfectly identical to each other.

In the disclosure, for convenience, a case where one circulant permutation matrix corresponds to one block has been described. However, the disclosure can be applied in the same manner even in the case where several circulant permutation matrices are included in one block. For example, when a sum of two circulant permutation matrices $P^{a_{ij}^{(1)}}$, $P^{a_{ij}^{(2)}}$ is included in the location of one i-th row block and j-th column as shown in <Equation 5> below, the exponent matrix can be expressed as <Equation 6>. Referring to the <Equation 6>, it can be seen that the exponent matrix is a matrix in which two integers correspond to the i-th row and the j-th column corresponding to the row block and column block including the sum of the plurality of circulant permutation matrices.

$$H = \begin{bmatrix} \ddots & \square & \square & \cdot^{\cdot} \\ \square & P^{a_{ij}^{(1)}} + P^{a_{ij}^{(2)}} & \square & \square \\ \square & & \square & \square \\ \cdot^{\cdot} & \square & \square & \ddots \end{bmatrix} \quad \text{[Equation 5]}$$

$$E(H) = \begin{bmatrix} \ddots & \square & \square & \cdot^{\cdot} \\ \square & (a_{ij}^{(1)}, a_{ij}^{(2)}) & \square & \square \\ \square & & \square & \square \\ \cdot^{\cdot} & \square & \square & \ddots \end{bmatrix} \quad \text{[Equation 6]}$$

In general, as in the embodiment described above, in the QC-LDPC code, a plurality of circulant permutation matrices may correspond to a single row block and a single column block in the parity-check matrix, but in the disclosure, it has been described that only a case where one circulant permutation matrix corresponds to one block for convenience of description, and the gist of the disclosure is not limited thereto. For reference, a matrix having the size of L×L in which a plurality of circulant permutation matrices overlap in a single row block and a single column block is called a circulant matrix (or circulant).

Meanwhile, a mother matrix or an base matrix for the parity-check matrix and the exponent matrix in <Equation 5> and <Equation 6> denotes a binary matrix having been obtained by replacing each circulant permutation matrix and zero-matrix by "1" and "0" in a similar manner to the definition used in <Equation 3> above, and it may be replaced by the sum of the plurality of circulant permutation matrices included in one block (e.g., circulant matrix) or simply by "1".

Since the performance of the LDPC code is determined according to the parity-check matrix, it is required to design the parity-check matrix for an LDPC code having excellent performance. In addition, an LDPC encoding or decoding method capable of supporting various input lengths and code rates is required.

Lifting refers to a method used not only to efficiently design the QC-LDPC codes, but also to generate a parity check matrix having various lengths from a given exponent matrix or to generate an LDPC codeword therefrom. That is, lifting refers to a method applied to efficiently design a very large parity-check matrix by configuring an L value that determines the size of a circulant permutation matrix or zero-matrix from a given small mother matrix according to a specific rule, or to generate a parity-check matrix having various lengths or to generate an LDPC codeword by applying an appropriate L value to a given exponent matrix or a sequence corresponding thereto.

The existing lifting method and characteristics of a QC-LDPC code designed through the lifting will be briefly described with reference to the following reference S. Myung, K. Yang, and Y. Kim, "Lifting Methods for Quasi-Cyclic LDPC Codes," IEEE Communications Letters. vol. 10, pp. 489-491, June 2006, which is incorporated by reference herein in its entirety.

It will be assumed that, if an LDPC code $C_0$ is given, S QC-LDPC codes to be designed by the lifting method are $C_1, \ldots, C_S$, and a value corresponding to the size of row blocks and column blocks of the parity-check matrix of each QC-LDPC code is $L_k$. Here, $C_0$ corresponds to the smallest LDPC code having the mother matrix of codes $C_1, \ldots, C_S$ as a parity-check matrix, and the $L_0$ value corresponding to the size of the row blocks and the column blocks is 1. Further, for convenience of explanation, the parity-check matrix $H_k$ of each code $C_k$ has an exponent matrix $E(H_k)=(e_{i,j}^{(k)})$ a having the size of m×n, and each exponent $e_{i,j}^{(k)}$ is selected as one from the values of $\{-1, 0, 1, 2, \ldots, L_k-1\}$.

The existing lifting method includes the steps such as $C_0 \rightarrow C_1 \rightarrow \ldots \rightarrow C_S$, and is characterized by satisfying a condition such as $L_{k+1}=q_{k+1}L_k$ ($q_{k+1}$ is a positive integer, k=0, 1, ..., S−1). In addition, if only the parity-check matrix $H_S$ of $C_s$ is stored due to the characteristics of the lifting process, all of the QC-LDPC codes $C_0, C_1, \ldots, C_S$ can be expressed using <Equation 7> below according to the lifting scheme.

$$E(H_k) \equiv \left\lfloor \frac{L_k}{L_s} E(H_s) \right\rfloor \quad \text{[Equation 7]}$$

or $$E(H_k) \equiv E(H_s) \bmod L_k \quad \text{[Equation 8]}$$

As described above, not only the method for designing larger QC-LDPC codes $C_1, \ldots, C_S$, etc. from $C_0$, but also the method for generating small codes $C_i$ (i=k−1, k−2, ... 1, 0) from a large code $C_k$ using an appropriate method as in <Equation 7> or <Equation 8> are referred to as lifting.

In the lifting schemed defined by <Equation 7> or <Equation 8>, Lks corresponding to the size of row blocks or column blocks in the parity-check matrix of each QC-LDPC code $C_k$ have a multiple relationship with each other, and the exponent matrix is also selected by a specific scheme. Such an existing lifting scheme improves the algebraic or graph characteristics of each parity-check matrix designed through lifting, and thus helps designing of a QC-LDPC code having improved error floor characteristics.

In general, lifting may be considered as the scheme in which the exponent matrix in <Equation 4> is used for LDPC encoding and decoding by changing values of the entries thereof with respect to various L values. For example, assuming that the exponent matrix in <Equation 4> is $E=(a_{i,j})$, and the exponent matrix converted according to the L value is $E_L=(a_{i,j}^{(L)})$, a conversion formula as defined in <Equation 9> may be applied generally.

$$a_{i,j}^{(L)} = \begin{cases} a_{i,j} & a_{i,j} < 0 \\ f(a_{i,j}, L) & a_{i,j} \geq 0 \end{cases} \quad \text{[Equation 9]}$$

or $$a_{i,j}^{(L)} = \begin{cases} a_{i,j} & a_{i,j} \leq 0 \\ f(a_{i,j}, L) & a_{i,j} > 0 \end{cases}$$

In <Equation 9> above, f(x,L) may be defined in various forms, for example, definitions such as the following <Equation 10> may also be used.

$$f(x, L) = \bmod(x, 2^{\lfloor \log_2 L \rfloor}) \quad \text{[Equation 10]}$$

or $$f(x, L) = \left\lfloor \frac{x}{2^{D-\lfloor \log_2 L \rfloor}} \right\rfloor$$

or $$f(x, L) = \left\lfloor \frac{L}{D} x \right\rfloor$$

In <Equation 10> above, mod(a, b) denotes a modulo-b operation with respect to a, and D denotes a constant which is a predefined positive integer.

For reference, although it has been indicated, that in the conversion formula of <Equation 9> above, the reference for applying conversion formula f is "0" for convenience of description, the reference value may be differently configured according to the block size L value to be supported. In addition, in regard to the expression of the exponent matrix or the LDPC sequence, in the case of defining the exponent matrix or the LDPC sequence by excluding an exponent corresponding to 0 matrix from the beginning, the rule for values having an exponent less than 0 in <Equation 9> may be omitted.

According to an embodiment, a case where LDPC encoding and decoding is applied based on a plurality of exponent matrices or LDPC sequences on one determined base matrix is described. That is, one base matrix is fixed, an exponent matrix or sequence, etc. of LDPC codes defined on the base matrix is determined, and lifting is applied according to the block size included in each block size group from the exponent matrix or sequence, whereby the encoding and decoding of LDPC codes having variable lengths are performed. According to the method above, entries or numbers configuring the exponent matrix of the LDPC code or the LDPC sequence may have different values, but the locations of the corresponding entries or numbers are accurately matched on the base matrix. As described above, the exponent matrix or LDPC sequences may denote the exponent of the circulant permutation matrix, that is, a kind of circular shift value for bits, respectively, and it is easy to identify the locations of the bits corresponding to the circulant permutation matrix by configuring all the locations of entries or numbers to be the same. For reference, since an exponent matrix or LDPC sequence corresponds to the circular shift value of bits corresponding to the block size (Z), the exponent matrix may be variously named, such as a shift matrix, a shift value matrix, a shift sequence, a shift value sequence, or the like.

Partitioning the block size (Z) to be supported into a plurality of block size groups (or sets) is shown in <Equation 11> below. Note that the block size (Z) is a value corresponding to the size Z×Z of the circulant permutation matrix or the circulant matrix in the parity-check matrix of the LDPC code.

$$Z1=\{2,4,8,16,32,64,128,256\}$$

$$Z2=\{3,6,12,24,48,96,192,384\}$$

$$Z3=\{5,10,20,40,80,160,320\}$$

$$Z4=\{7,14,28,56,112,224\}$$

$$Z5=\{9,18,36,72,144,288\}$$

$$Z6=\{11,22,44,88,176,352\}$$

$$Z7=\{13,26,52,104,208\}$$

$$Z8=\{15,30,60,120,240\} \quad \text{[Equation 11]}$$

<Equation 11> above is only an example, and it is possible to use all block size Z values included in the block size groups in <Equation 11>. It is possible to use block size values included in an appropriate subset as shown in <Equation 12> below. It is possible to add or exclude appropriate values to or from the block size group (or set) in <Equation 11> or <Equation 12> and to use the same.

$$Z1'=\{8,16,32,64,128,256\}$$

$$Z2'=\{12,24,48,96,192,384\}$$

$$Z3'=\{10,20,40,80,160,320\}$$

$$Z4'=\{7,14,28,56,112,224\}$$

$$Z5'=\{18,36,72,144,288\}$$

$$Z6'=\{11,22,44,88,176,352\}$$

$$Z7'=\{26,52,104,208\}$$

$$Z8'=\{15,30,60,120,240\} \quad \text{[Equation 12]}$$

The block size groups in <Equation 11> and <Equation 12> above are characterized by not only including different granularities, but the ratio between neighboring block sizes is the same integer. In other words, block sizes included in one group are divisors or multiples with each other. If it is assumed that each exponent matrix corresponding to the p (p=1, 2, . . . , 8)-th group is $E_p=(e_{i,j}^{(p)})$, and the exponent matrix corresponding to the Z value included in the p-th group is $E_p(Z)=(e_{i,j}(Z))$, a sequence conversion method as shown in <Equation 9> is applied using $f_p(x,Z)=x \pmod{Z}$. That is, if the block size Z is determined to be Z=28, for example, with regard to the exponent matrix (or LDPC sequence) $E_4=(e_{i,j}^{(4)})$ corresponding to the fourth block size group in which Z=28 is included, each entry $e_{i,j}(28)$ of the exponent matrix (or LDPC sequence) $E_4(28)=(e_{i,j}(28))$ with respect to Z=28 can be obtained as in <Equation 13> below.

$$e_{i,j}(28) = \begin{cases} e_{i,j}^{(4)} & e_{i,j}^{(4)} \leq 0 \\ e_{i,j}^{(4)} \pmod{28} & e_{i,j}^{(4)} > 0 \end{cases} \quad \text{[Equation 13]}$$

or $$e_{i,j}(28) = \begin{cases} e_{i,j}^{(4)} & e_{i,j}^{(4)} < 0 \\ e_{i,j}^{(4)} \pmod{28} & e_{i,j}^{(4)} \geq 0 \end{cases}$$

The conversion as in <Equation 13> above may also be expressed as in <Equation 14> below.

$$E_p(Z)=E_p \pmod{Z}, Z \in Z_p \quad \text{[Equation 14]}$$

For reference, although it has been described under the assumption that the lifting or exponent matrix conversion scheme according to <Equation 9>, <Equation 10>, or <Equation 11> to <Equation 14> is applied to all of the exponent matrix corresponding to the parity-check matrix, the conversion scheme may also be partially applied to the exponent matrix.

For example, in general, a submatrix corresponding to the parity bit of a parity-check matrix has a special structure for efficient encoding in many cases. Here, lifting may change the encoding method or the degree of complexity. Therefore, in order to maintain the same encoding method or degree of complexity, lifting may not be applied to a part of the exponent matrix relating to the submatrix corresponding to the parity in the parity-check matrix, or lifting may be applied in a different manner from the lifting applied to the exponent matrix relating to the submatrix corresponding to the information word bit. In other words, the lifting scheme applied to the sequence corresponding to the information word bit in the exponent matrix and the lifting scheme applied to the sequence corresponding to the parity bit may be differently configured. According to cases (if necessary), no lifting may be applied to part or all of the sequence corresponding to the parity bit so that a fixed value is used without a sequence conversion.

Figure 4:
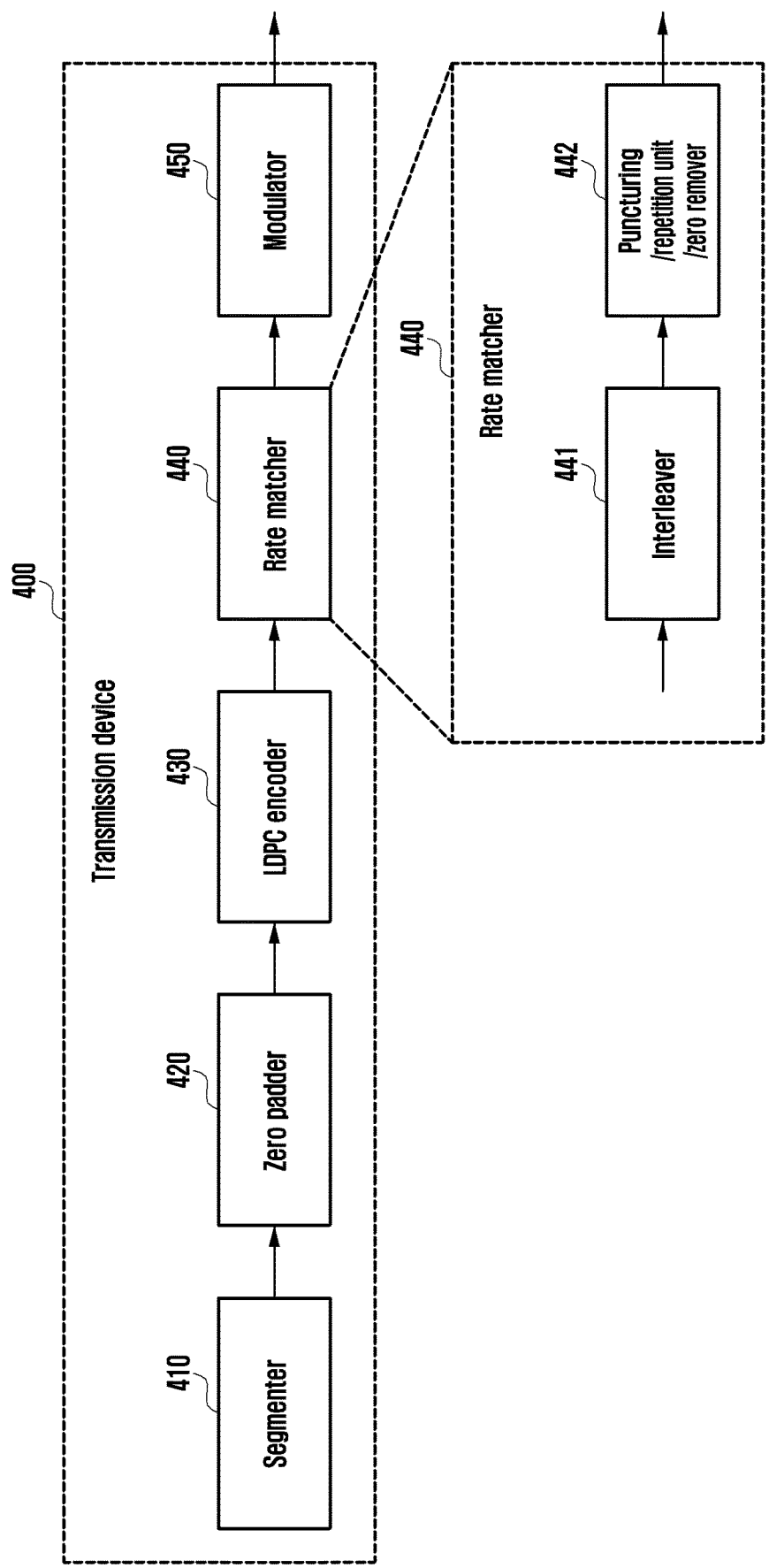
FIG. 4 is a block diagram illustrating an example configuration of a transmission device according to an embodiment.

FIG. 4 is a block diagram illustrating an example configuration of a transmission device according to an embodiment.

For example, as illustrated in FIG. 4, a transmission device 400 may include a segmenter (e.g., including processing circuitry and/or executable program elements) 410, a zero padder (e.g., including processing circuitry and/or executable program elements) 420, an LDPC encoder (e.g., including processing circuitry and/or executable program elements) 430, a rate matcher (e.g., including processing circuitry and/or executable program elements) 440, a modulator (e.g., including processing circuitry and/or executable program elements) 450, and the like, in order to process variable-length input bits. The rate matcher 440 may include an interleaver (e.g., including processing circuitry and/or executable program elements) 441, a puncturing/repetition/zero remover (e.g., including processing circuitry and/or executable program elements) 442, and the like.

The elements illustrated in FIG. 4 are merely example elements for performing encoding and modulation for variable-length input bits. If necessary, some of the elements illustrated in FIG. 4 may be omitted or modified, and other elements may be added. An example of the modulation scheme may include one of QAM schemes, such as QPSK, 16-, 64-, 256-, and 1024-QAM schemes, a phase shift keying (PSK) scheme, or an amplitude and PSK (APSK) scheme.

The transmission device 400 may determine necessary parameters (for example, an input bit length, a modulation and code rate (ModCod), a parameter for zero padding (or shortening), the code rate, information word, or codeword length of the LDPC code, a parameter for interleaving, a parameter for repetition, puncturing, etc., a modulation scheme, and the like), may encode input bits based on the determined parameters, and may transmit a result of encoding to a reception device 500.

Since the number of input bits is variable, the input bits may be segmented to have a length equal to or less than a preconfigured value if the number of input bits is larger than the preconfigured value. In addition, each segmented block may correspond to one LDPC-coded block. If the number of input bits is less than or equal to the preconfigured value, the input bits are not segmented. The input bits may correspond to one LDPC-coded block.

Meanwhile, the transmission device 400 may include various parameters, which have been pre-stored therein, used for encoding, interleaving, and modulation. Here, the parameter used for encoding may include at least one of the code rate, input bit, or information word of the LDPC code, the length of the codeword, and information relating to the parity-check matrix. The parameter used for interleaving may include information relating to an interleaving rule, and the parameter used for modulation may include information relating to the modulation scheme. The information relating to puncturing may include the puncturing length. Information relating to repetition may include the repetition length. The information relating to the parity-check matrix may include the exponent value of the circulant matrix if the parity matrix proposed in the disclosure is used.

Here, respective elements configuring the transmission device 400 may perform operations using these parameters.

Although not illustrated, the transmission device 400 may further include, if necessary, a controller (not illustrated) that may include, for example, various processing circuitry for controlling the operation of the transmission device 400.

Figure 5:
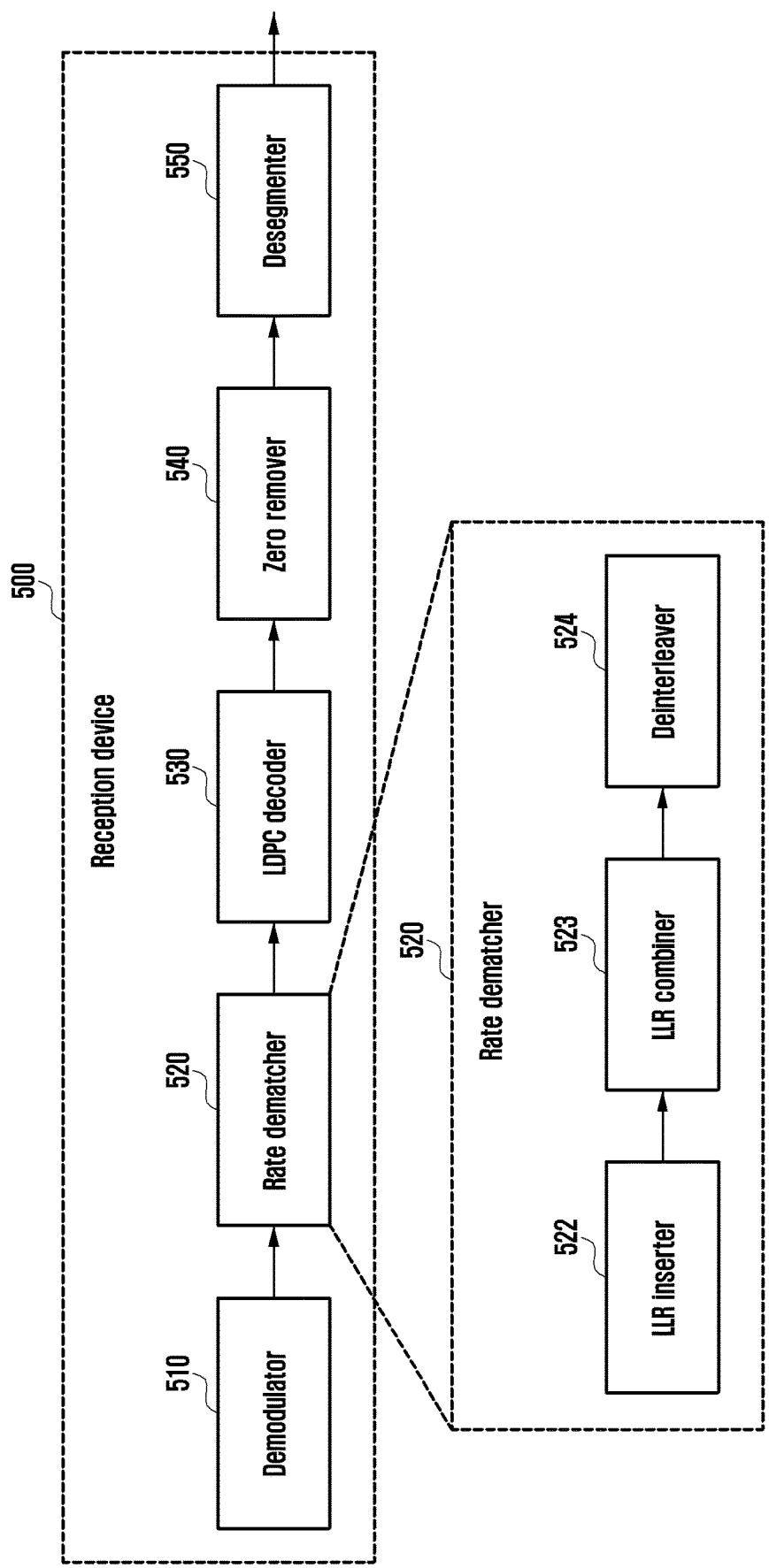
FIG. 5 is a block diagram illustrating an example configuration of a receiving device according to an embodiment.

FIG. 5 is a block diagram illustrating an example configuration of a reception device according to an embodiment.

For example, as illustrated in FIG. 5, a reception device 500 may include a demodulator (e.g., including processing circuitry and/or executable program elements) 510, a rate dematcher (e.g., including processing circuitry and/or executable program elements) 520, an LDPC decoder (e.g., including processing circuitry and/or executable program elements) 530, a zero remover (e.g., including processing circuitry and/or executable program elements) 540, a desegmenter (e.g., including processing circuitry and/or executable program elements) 550, and the like, in order to process pieces of variable length information. The rate dematcher 520 may include a log likelihood ratio (LLR) inserter (e.g., including processing circuitry and/or executable program elements) 522, an LLR combiner (e.g., including processing circuitry and/or executable program elements) 523, a deinterleaver (e.g., including processing circuitry and/or executable program elements) 524, and the like. The LLR inserter 522 and the LLR combiner 523 may be differently referred to according to values used for decoding. For example, when decoding is performed based on values, such as likelihood ratio (LR), instead of LLR, the LLR inserter and the LLR combiner may be referred to as an LR inserter and an LR combiner, based on values used for decoding, and the operation may be slightly different based on the values.

The operation of the demodulator 510 may be subdivided into various processes and expressed, if necessary. For example, the processes may include performing channel estimation based on a received signal, and determining values (e.g., LLR or LR or values corresponding thereto, etc.), necessary for FEC decoding, corresponding to the codeword bits transmitted from a signal or symbol which has been demodulated based on a result of the channel estimation.

Here, the operation within each demodulator may be subdivided into each channel measurement block and a symbol-to-LLR (symbol-to-LLR) conversion block. It is needless to say that various subdivisions are possible according to the structure of a system.

The elements illustrated in FIG. 5 are merely example elements for performing functions corresponding to elements illustrated in FIG. 4, and if necessary, some of the elements illustrated in FIG. 5 may be omitted or modified, and other elements may be added.

The parity-check matrix in the disclosure may be read using a memory, may be given in advance by the transmission device or the reception device, or may be directly generated by the transmission device or the reception device. In addition, the transmission device may store or generate a sequence, an exponent matrix, or the like corresponding to the parity-check matrix, and may apply the same to encoding. Similarly, it may be apparent that the reception device may store or generate a sequence, an exponent matrix, or the like corresponding to the parity-check matrix, and may apply the same to decoding.

Hereinafter, a receiver operation will be described in greater detail with reference to FIG. 5.

The demodulator 510 demodulates a signal received from the transmission device 400.

For example, the demodulator 510, which is an element corresponding to the modulator 450 of the transmission device 400, may receive and demodulate a signal transmitted by the transmission device 400, thereby generating values (e.g., LLR or LR or values corresponding thereto) corresponding to bits transmitted by the transmission device 400.

To this end, the reception device 500 may include information, which has been pre-stored therein, relating to the modulation scheme used by the transmission device 400 for modulation according to a mode. Accordingly, the demodulator 510 may demodulate the signal received from the transmission device 400 according to the mode, thereby generating values corresponding to LDPC codeword bits.

The LR value may denote a ratio between the likelihood that a bit transmitted by the transmission device 400 will be 0 and the likelihood that the same will be 1, and the LLR value may be expressed as the logarithm of the ratio between the likelihood that a bit transmitted by the transmission device 400 will be 0 and the likelihood that the same will be 1. Alternatively, the LR or LLR value may be hard-decided according to the likelihood, the ratio of the likelihood, or the log value for the ratio of the likelihood and expressed as the bit value itself, or the LR or LLR value may be expressed as a representative value defined in advance according to a section to which the likelihood, the ratio of the likelihood, or the log value for the ratio of the likelihood belong. An example of a method of determining the representative value defined in advance according to the section to which the likelihood, the ratio of the likelihood, or the log value for the ratio of the likelihood belong includes a quantization considering method. In addition, various other values corresponding to the likelihood, the ratio of the likelihood, or the log value for the ratio of the likelihood may be used.

In the disclosure, the operation based on the LLR value is shown for convenience in order to describe a receiving method and the operation of a device, but there is no need to be limited thereto.

The demodulator 510 includes a function of performing multiplexing (not illustrated) with respect to the LLR value. Specifically, a mux (not illustrated) is an element corresponding to a bit demux (not illustrated) of the transmission device 400, and may perform an operation corresponding to that of the bit demux (not illustrated).

To this end, the reception device 500 may include information, which has been pre-stored therein, relating to the parameter used by the transmission device 400 for demultiplexing and block interleaving. Accordingly, a mux (not illustrated) may inversely perform demultiplexing and block interleaving operations, performed by the bit demux (not illustrated), with respect to an LLR value corresponding to a cell word (information indicating received symbol for an LDPC codeword as vector values), thereby multiplexing the LLR value corresponding to the cell word in units of bits.

The rate dematcher 520 may additionally insert an LLR value into LLR values output from the demodulator 510. Here, the rate dematcher 520 may insert pre-promised LLR values between LLR values output from the demodulator 510.

For example, the rate dematcher 520 is an element corresponding to the rate matcher 440 of the transmission device 400, and may perform operations corresponding to the interleaver 441, zero removing, and the puncturing/repetition/zero remover 442.

The rate dematcher 520 performs deinterleaving so as to correspond to the interleaver 441 of the transmitter. Output values from the deinterleaver 524 may insert an LLR value corresponding to zero bits in a position in which zero bits have been padded in the LDPC codeword by the LLR inserter 522. The LLR value corresponding to the padded zero bits, that is, shortened zero bits, may be $\infty$ or $-\infty$. However, $\infty$ or $-\infty$ is a theoretical value, and the same may substantially be the maximum value or minimum value of the LLR value used by the reception device 500.

To this end, the reception device 500 may include information, which has been pre-stored therein, relating to the parameter used by the transmission device 400 for padding zero bits. Accordingly, the rate dematcher 520 may determine the position in which zero bits have been padded in the LDPC codeword, and may insert an LLR value corresponding to shortened zero bits into the corresponding position.

In addition, the LLR inserter 522 of the rate dematcher 520 may insert an LLR value corresponding to punctured bits in the position of the punctured bits in the LDPC codeword. Here, the LLR value corresponding to the punctured bits may be 0 or be another predetermined value. In general, when degree-1 parity bits are punctured, there is no effect on performance improvement in the LDPC decoding process, so the degree-1 parity bits may not be used in the LDPC decoding process without LLR insertion into part or all of the corresponding puncture positions. However, in order to increase the efficiency of the LDPC decoding process based on a parallel process, the LLR inserter 522 may insert a predetermined LLR value into a position corresponding to part or all of the punctured degree-1 parity bits regardless of the decoding performance improvement.

To this end, the reception device 500 may have information, which has been pre-stored therein, relating to the parameter used by the transmission device 400 for puncturing. Accordingly, the LLR inserter 522 may insert an LLR value (for example, LLR=0) corresponding to the LDPC information word bits or parity bits into the positions in which the LDPC information word bits or parity bits have been punctured. However, this process may be omitted in positions in which parity bits has been partially punctured.

The LLR combiner 523 may combine (that is, sum up) LLR values output from the LLR inserter 522 and the demodulator 510. Specifically, the LLR combiner 523 is an element corresponding to the puncturing/repetition/zero remover 442 of the transmission device 400, and may perform an operation corresponding to that of the repetition unit 442. First, the LLR combiner 523 may combine an LLR value corresponding to repeated bits with another LLR value. The other LLR value may be an LLR value relating to bits, which served as the basis for repeated bits generated by the transmission device 400, that is, LDPC information word bits or LDPC parity bits having been selected to be repeated. In addition, according to TS 38.212 document defined in the 3GPP 5G standard specification, the repeated bits may be variously determined based on redundancy version (RV) values or parameters such as code rates, configured in a retransmission process such as hybrid ARQ (HARQ).

For example, as described above, the transmission device 400 selects LDPC encoded bits, repeats a part of LDPC information word bits and LDPC parity bits, if necessary, and transmits the same to the reception device 500. Accordingly, the LLR value relating to LDPC encoded bits may include an LLR value relating to repeated LDPC encoded bits and an LLR value relating to non-repeated LDPC encoded bits. Therefore, the LLR combiner 523 may combine LLR values corresponding to the identical LDPC encoded bits.

To this end, the reception device 500 may include information, which has been pre-stored therein, relating to the parameter used by the transmission device 400 for repetition. Accordingly, the LLR combiner 523 may determine the LLR value relating to the repeated LDPC parity bits, and may combine the same with the LLR value relating to LDPC parity bits, which served as the basis of repetition.

In addition, the LLR combiner 523 may combine an LLR value corresponding to bits that have been subjected to retransmission or increment redundancy (IR) with another LLR value. Here, the other LLR value may be the LLR value relating to part or all of LDPC codeword bits, which served as a basis for generating the bits that have been subjected to retransmission or IR by the transmission device 400.

For example, as described above, the transmission device 400 may, if a NACK occurs for a HARQ, transmit part or all of codeword bits to the reception device 500.

Accordingly, the LLR combiner 523 may combine the LLR value relating to bits received through retransmission or IR with the LLR value relating to LDPC codeword bits received through the previous frame.

To this end, the reception device 500 may include information, which has been pre-stored therein, relating to the parameter used by the transmission device 400 to generate the retransmission or IR bits. Accordingly, the LLR combiner 523 may determine the LLR value relating to retransmission or IR bits, and may combine the determined LLR value with an LLR value relating to at least a part of the LDPC encoded bits that served as a basis for generating the retransmission bits.

The deinterleaver 524 may deinterleave an LLR value output from the LLR combiner 523.

For example, the deinterleaver 524 is an element corresponding to the interleaver 441 of the transmission device 400, and may perform an operation corresponding to that of the interleaver 441.

To this end, the reception device 500 may include information, which has been pre-stored therein, relating to the parameter used by the transmission device 400 for interleaving. Accordingly, the deinterleaver 524 may inversely perform the interleaving operation, performed by the interleaver 441, with respect to the LLR value corresponding to LDPC codeword bits, thereby deinterleaving the LLR value corresponding to the LDPC codeword bits.

The LDPC decoder 530 may perform LDPC decoding based on the LLR value output from the rate dematcher 520.

For example, the LDPC decoder 530 is an element corresponding to the LDPC encoder 430 of the transmission device 400, and may perform an operation corresponding to that of the LDPC encoder 430.

To this end, the reception device 500 may have information, which has been pre-stored therein, relating to the parameter used by the transmission device 400 to perform LDPC encoding according to a mode. Accordingly, the LDPC decoder 530 may perform LDPC decoding based on the LLR value output from the rate dematcher 520 according to the mode.

For example, the LDPC decoder 530 may perform LDPC decoding based on an LLR value output from the rate dematcher 520 based on an iterative decoding scheme based on a sum-product algorithm, and may output bits that have been error-corrected as a result of LDPC decoding.

The zero remover 540 may remove zero bits from the bits output from the LDPC decoder 530.

For example, the zero remover 540 is an element corresponding to the zero padder 420 of the transmission device 400, and may perform an operation corresponding to that of the zero padder 420.

To this end, the reception device 500 may include information, which has been pre-stored therein, relating to parameters used by the transmission device 400 to pad zero bits. Accordingly, when the LDPC decoder 530 performs decoding using the padded bits, the zero remover 540 may remove zero bits, which has been padded by the zero padder 420, from bits output from the LDPC decoder 530. The operation of removing the bits having been zero padded (or shortened) by the zero remover 540 may denote an operation of actually removing the padding bits, but that may denote an operation of transmitting the output bits of the LDPC decoder 530 to the next desegmenter after excluding the padded bits. In addition, the bits which have been zero-padded by the transmitting device may not be used in the decoding process because the reception device accurately knows positions thereof. Here, the process of removing the zero-padded bits may be omitted.

The desegmenter 550 is an element corresponding to the segmenter 410 of the transmission device 400, and may perform an operation corresponding to that of the segmenter 410.

To this end, the reception device 500 may include information, which has been pre-stored therein, relating to the parameter used by the transmission device 400 for segmentation. Accordingly, the desegmenter 550 may combine segments relating to bits output from the zero remover 540, that is, variable-length input bits, thereby restoring pre-segmentation bits.

The LDPC code may be decoded using an iterative decoding algorithm based on a sum-product algorithm on the bipartite graph enumerated in FIG. 2, and the sum-product algorithm is a kind of message passing algorithm.

Hereinafter, a message passing operation normally used during LDPC decoding will be described in greater detail with reference to FIG. 6A and FIG. 6B.

Figure 6A:
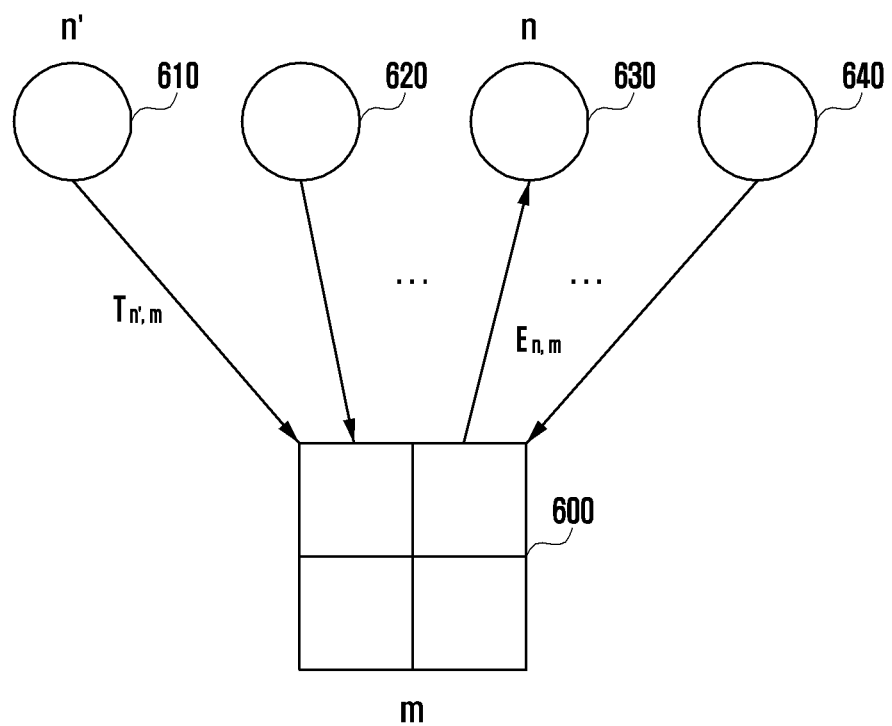
FIG. 6A is a diagram illustrating an example message structure for illustrating a message passing operation in a predetermined check node and a predetermined variable node for LDPC decoding according to an embodiment.
Figure 6B:
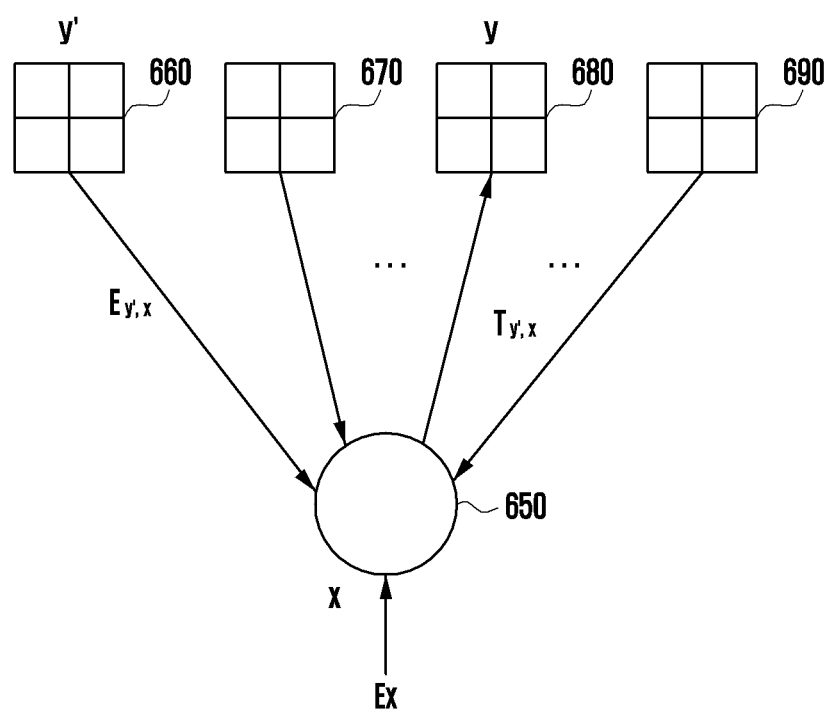
FIG. 6B is a diagram illustrating an example message structure for illustrating a message passing operation in a predetermined check node and a predetermined variable node for LDPC decoding according to an embodiment.

FIG. 6A is a diagram illustrating an example message passing operation in a predetermined check node and a predetermined variable node for LDPC decoding according to an embodiment, and FIG. 6B is a diagram illustrating an example message structure for illustrating a message passing operation in a predetermined check node and a predetermined variable node for LDPC decoding.

FIG. 6A illustrates a check node m 600 and multiple variable nodes 610, 620, 630, and 640 connected to the check node m 600. In addition, illustrated Tn',m refers to a message passed from variable node n' 610 to check node m 600, and En,m refers to a message passed from the check node m 600 to the variable node n 630. Here, a set of all variable nodes connected to the check node m 600 is defined as N(m), and a set obtained by excluding variable node n 630 from N(m) is defined as N(m)\n.

Here, a message update rule based on a sum-product algorithm may be defined by <Equation 15> below.

$$|E_{n,m}| = \Phi\left[\sum_{n' \in N(m)\backslash n} \Phi(|T_{n',m}|)\right] \quad \text{[Equation 15]}$$

$$\text{Sign}(E_{n,m}) = \prod_{n' \in N(m)\backslash n} \text{sign}(T_{n',m})$$

Here, sign(En,m) refers to the sign of message En,m, and |En,m| refers to the magnitude of message En,m. Meanwhile, function $\Phi(x)$ may be defined by <Equation 16> below.

$$\Phi(x) = -\log\left(\tanh\left(\frac{x}{2}\right)\right) \quad \text{[Equation 16]}$$

For reference, the −log(tan h(.)) function of <Equation 16> may be more simply expressed as a log(cot h(.)) function.

FIG. 6B illustrates a variable node x 650 and multiple check nodes 660, 670, 680, and 690 connected to the variable node x 650. In addition, illustrated $E_{y',x}$ refers to a message passed from the check node y' 660 to the variable node x 650, and $T_{y,x}$ refers to a message passed from the variable node x 650 to the variable node y 680. Here, a set of all variable nodes connected to the variable node x 650 is defined as M(x), and a set obtained by excluding the check node y 680 from M(x) is defined as M(x)\y. Here, a message update rule based on a sum-product algorithm may be defined as in <Equation 17> below.

$$T_{y,x} = E_x + \sum_{y' \in M(x)\backslash y} E_{y',x} \quad \text{[Equation 17]}$$

Here, Ex refers to the initial message value of variable node x.

In addition, in case of determining the bit value of node x may be defined by <Equation 18> below.

$$P_x = E_x + \sum_{y' \in M(x)} E'_{y'}, x.$$ [Equation 18]

Here, an encoding bit corresponding to node x may be determined according to the value of Px.

It is to be noted that other methods than those described with reference to FIG. 6A and FIG. 6B may be applied to determine a message value passed between a variable node and a check node, and detailed description thereof will be referred to Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519), which is incorporated by reference herein in its entirety. For example, in <Equation 15> and <Equation 16>, an update formula of the check node is expressed in the form of a sum by expressing the update formula as −log(tan h(.)) function. However, according to the reference document, the update formula is expressed in the form of a product based on the tan h(.) function or the inverse function tan h$^{-1}$(.). As such, there may be various expression methods that are conceptually identical. Further, in order to reduce complexity, various simplified decoding methods such as a min-sum algorithm may exist. In the disclosure, detailed descriptions of these various decoding algorithms are omitted, but it may be apparent that the decoding scheduling scheme and the decoding algorithms proposed in the disclosure as well as various other types of decoding algorithms can be combined.

Figure 7:
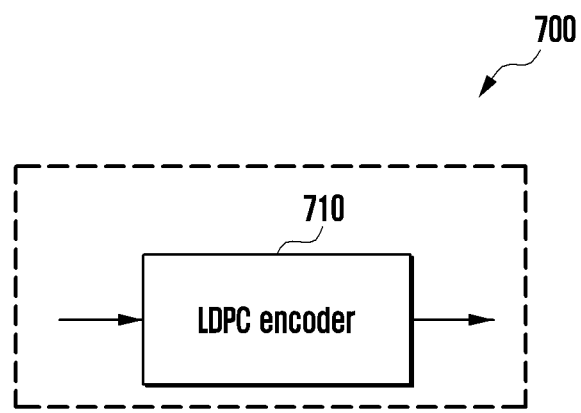
FIG. 7 is a block diagram illustrating an example configuration of an LDPC encoder according to an embodiment.

FIG. 7 is a block diagram illustrating an example configuration of an LDPC encoder according to an embodiment.

The $K_{ldpc}$ bits may configure $K_{ldpc}$ LDPC information word bits $I=(i_0, i_1, \ldots, i_{K_{ldpc}-1})$ for an LDPC encoder (e.g., including processing circuitry and/or executable program elements) 710. The LDPC encoder 710 systematically performs LDPC encoding of $K_{ldpc}$ LDPC information word bits to generate the LDPC codeword $C=(c_0, c_1, \ldots, c_{Nldpc-1})=(i_0, i_1, \ldots, i_{Kldpc-1}, p_0, p_1, \ldots, p_{Nldpc-Kdpc-1})$ formed of $N_{ldpc}$ bits.

As described in <Equation 1>, the codeword is determined so that the product of the LDPC codeword and the parity-check matrix becomes a zero vector.

Referring to FIG. 7, an encoding device 700 includes the LDPC encoder 710. The LDPC encoder 710 may generate an LDPC codeword by performing LDPC encoding of input bits based on a parity-check matrix or an exponent matrix or sequence corresponding thereto. Here, the LDPC encoder 710 may perform LDPC encoding using a parity-check matrix differently defined according to a code rate (that is, a code rate of an LDPC code) or an input bit (or code word or information word) length, or a block length Z.

The encoding device 700 may further include a memory (not shown) for pre-storing information relating to a code rate of an LDPC code, an input bit (or information word or code word) length, and a parity-check matrix. The LDPC encoder 710 may perform LDPC encoding using these information. The information on the parity-check matrix may include information relating to an exponent value of a circulant matrix when the parity matrix presented in the disclosure is used.

Figure 8:
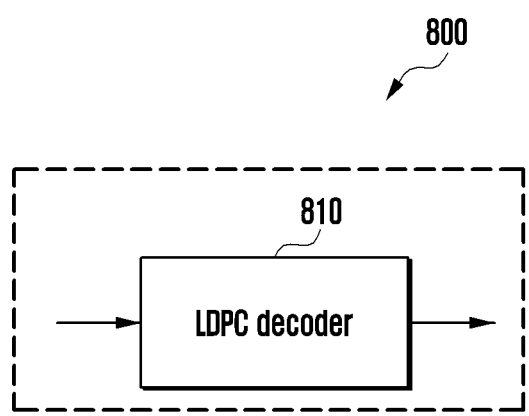
FIG. 8 is a block diagram illustrating an example configuration of a decoding device according to an embodiment.

FIG. 8 is a block diagram illustrating an example configuration of a decoding device according to an embodiment.

Referring to FIG. 8, the decoding device 800 may include an LDPC decoder (e.g., including processing circuitry and/or executable program elements) 810.

The LDPC decoder 810 performs LDPC decoding of the LDPC codeword based on the parity-check matrix or the exponent matrix or sequence corresponding thereto.

For example, the LDPC decoder 810 may generate information word bits by performing LDPC decoding by passing LLR values corresponding to LDPC codeword bits through an iterative decoding algorithm. Here, the LLR value is a channel value corresponding to the LDPC codeword bits transmitted from the transmitter, and can be expressed in various ways.

Here, the LDPC decoder 810 may perform LDPC decoding using a parity-check matrix defined differently according to a code rate (e.g., a code rate of an LDPC code).

Figure 9:
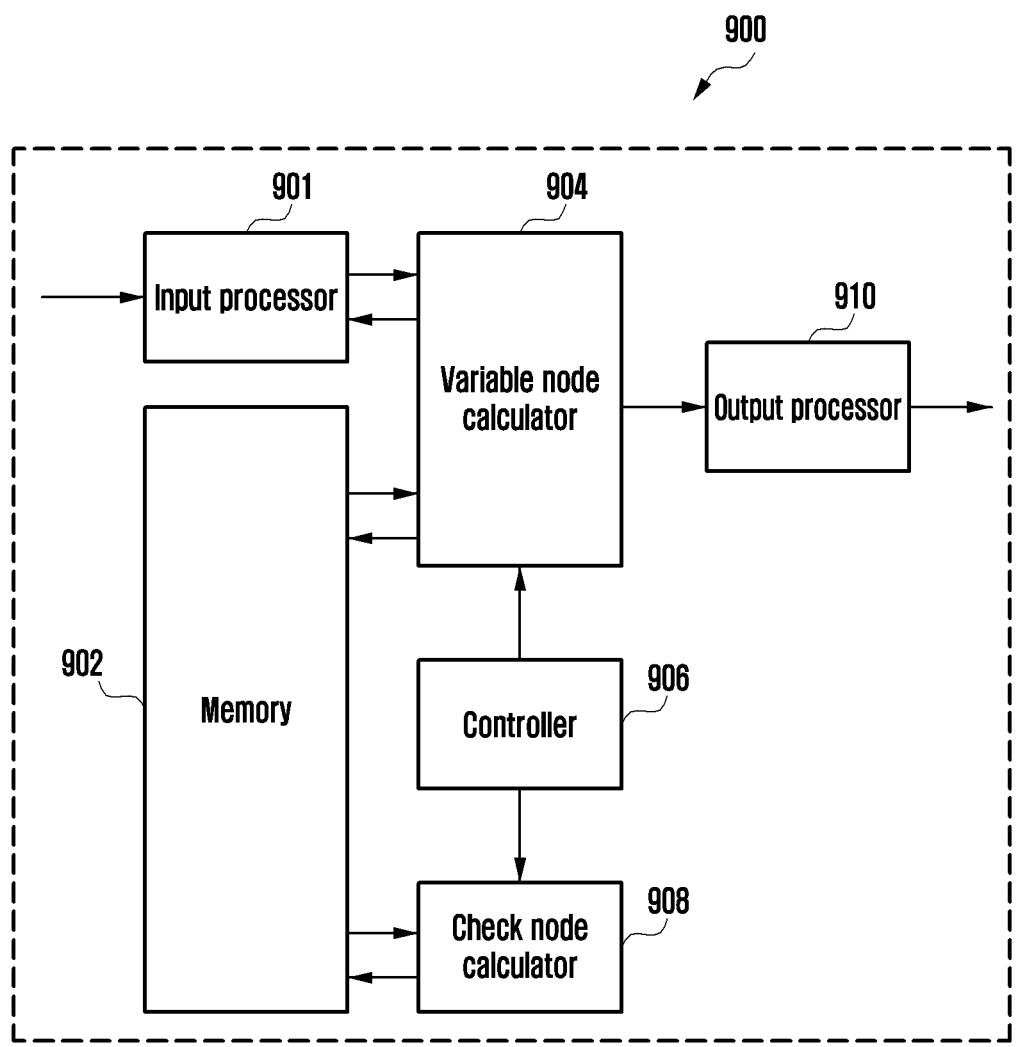
FIG. 9 is a block diagram illustrating an example structure of an LDPC decoder according to an embodiment.

FIG. 9 is a block diagram illustrating an example structure of an LDPC decoder according to an embodiment.

As described above, the LDPC decoder 810 may perform LDPC decoding using an iterative decoding algorithm, and in this case, the LDPC decoder 810 may be configured as the structure shown in FIG. 9. However, the detailed configuration shown in FIG. 9 is also only an example.

Referring to FIG. 9, the decoding device 900 includes an input processor (e.g., including processing circuitry and/or executable program elements) 901, a memory 902, a variable node calculator (e.g., including processing circuitry and/or executable program elements) 904, a controller (e.g., including processing circuitry) 906, a check node calculator (e.g., including processing circuitry and/or executable program elements) 908, an output processor (e.g., including processing circuitry and/or executable program elements) 910, and the like.

The input processor 901 stores an input value. Specifically, the input processor 901 may store an LLR value of a reception signal received through a wireless channel.

The controller 904 may include various processing circuitry and determines the number of values input to the variable node calculator 904, address values of the memory 902, the number of values input to the check node calculator 908, and address values of the memory 902, based on the block size (e.g., a codeword length) of the reception signal received through the wireless channel and a parity-check matrix corresponding to a code rate.

The memory 902 stores input data and output data of the variable node calculator 904 and the check node calculator 908.

The variable node calculator 904 receives an input of data from the memory 902 and performs variable node calculation according to address information of input data received from the controller 906 and information on the number of pieces of the input data. Thereafter, the variable node calculator 904 stores a result of the variable node calculation in the memory 902 based on address information of output data received from the controller 906 and information on the number of pieces of the output data. In addition, the variable node calculator 904 inputs the result of the variable node calculation to the output processor 910 based on data received from the input processor 901 and the memory 902. Here, the variable node calculation has been described based on FIG. 6 in the above.

The check node calculator 908 receives an input of data from the memory 902 and performs check node calculation based on address information of input data received from the controller 906 and the information on the number of pieces of the input data. Thereafter, the check node calculator 908 stores a result of the check node calculation in the memory 902 based on address information of output data received from the controller 906 and information on the number of pieces of the output data. Here, the check node calculation has been described based on FIG. 6 in the above.

The output processor 910 makes a hard decision on whether information word bits of a codeword on a transmitting side were 0 or 1, based on the data received from the variable node calculator 904, and then outputs a result of the hard decision. The output value of the output processor 910 becomes a finally decoded value. Here, a hard decision may be made based on a value obtained by adding all message values input to one variable node (initial message values and all message values input from the check node) in FIG. 6.

The memory 902 of the decoding device 900 may pre-store information on the code rate of the LDPC code, the length of the input bit (or information word or codeword), and the parity-check matrix, and the LDPC decoder 810 may perform LDPC encoding using these information. However, this is only an example, and the corresponding information may be provided from the transmitting side.

Figure 10:
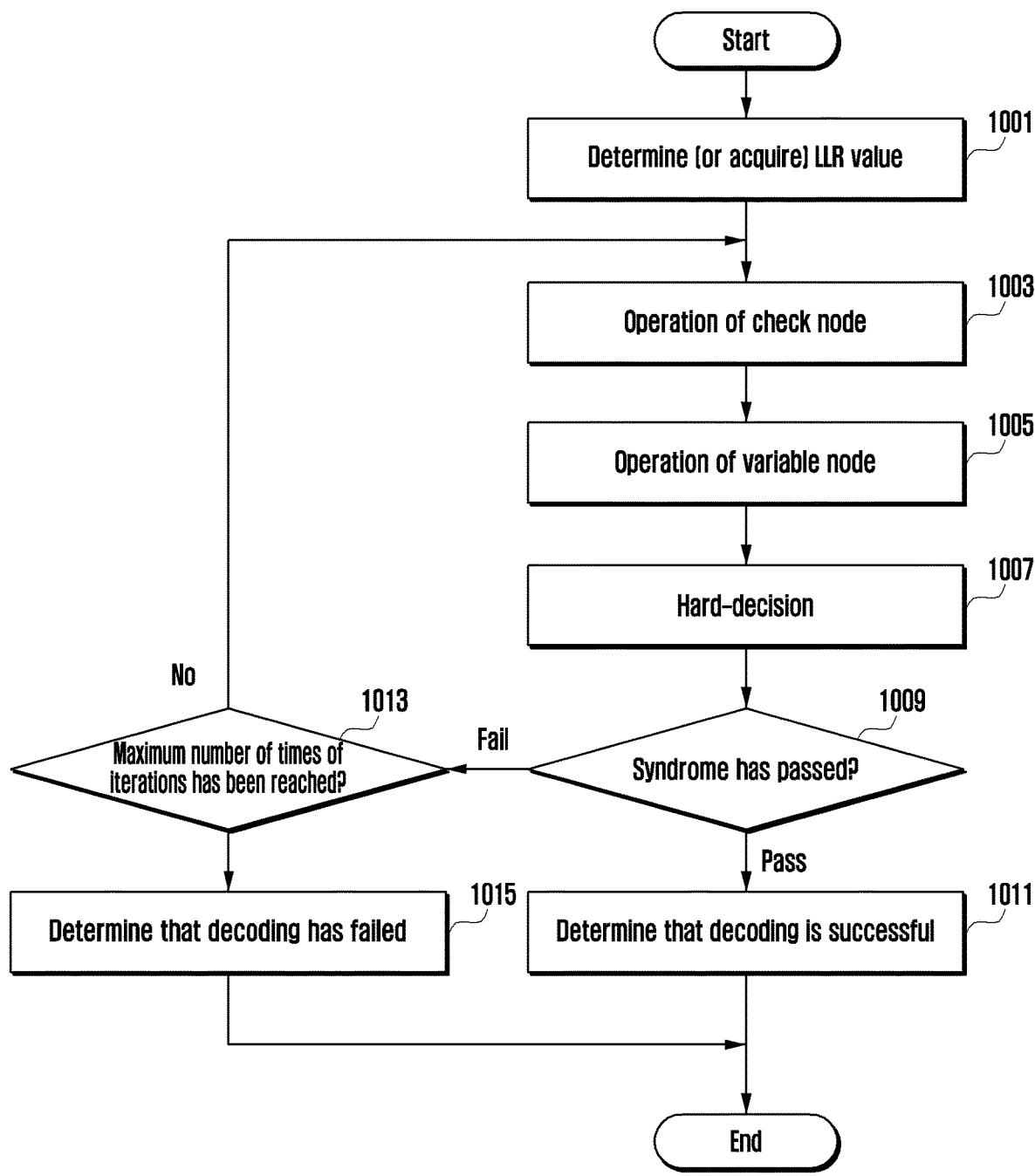
FIG. 10 is a flowchart illustrating an example decoding process in an LDPC decoding device according to an embodiment.

FIG. 10 is a flowchart illustrating an example decoding process in an LDPC decoding device according to an embodiment.

Referring to FIG. 10, in operation 1001, a value, referred to as a channel LLR or intrinsic LLR of a corresponding bit generated from a received signal, is input to each variable node. The input LLR values may be rate de-matched LLR values. In operation 1003, the intrinsic LLR of each variable node is transmitted to a neighboring check node, and all check nodes calculate a message corresponding to an extrinsic LLR to be transferred to each variable node, based on the received message. In a flooding-type LDPC decoder, all check nodes calculate and update message values, and the message corresponding to the calculated extrinsic LLR is transferred to neighboring variable nodes along the connection line.

In operation 1005, all variable nodes generate a complete LLR to determine the message and bit values to be transferred to the check nodes based on the received message corresponding to the extrinsic LLR and the intrinsic LLR values. The final LLR may be referred to as a posterior probability (APP) metric, an APP LLR, or another term having an equivalent technical meaning thereto. In the flooding-type LDPC code decoder, all variable nodes calculate and update message values.

In operation 1007, the variable node estimates a bit value by making hard-decision on the final LLR before transferring the message to the check node.

In operation 1009, it is checked whether the estimated bit value satisfies a syndrome check equation determined by the parity-check matrix. When it is identified that the estimated bit value satisfies the syndrome check equation ("Pass" in operation 1009), in operation 1011, it is determined that decoding is successful, and information indicating successful decoding is output and reported.

If it is determined that the estimated bit value does not satisfy the syndrome check equation ("Fail" in operation 1009), in operation 1013, it is identified whether the number of times of iterative decoding performed so far reaches the predesignated maximum number of times of iterative decoding.

When the number of times of iterative decoding performed so far has not reached the maximum number of times of iterative decoding ("No" in operation 1013), the series of processes are repeated again. If the result of the decoding does not satisfy the syndrome check equation until the number of times of iterative decoding performed so far reaches the maximum number of times of iterative decoding ("Yes" in operation 1013), information indicating a decoding failure is output and reported in operation 1015.

The layered LDPC decoding refers to a method of partitioning check nodes into multiple layers, and then sequentially performing decoding of a check node in turn.

Referring to FIG. 10, in operation 1003, a check node belonging to a layer in turn receives a message from a connected variable node. The check node transfers the calculated and updated message to neighboring variable nodes. In operation 1005, variable nodes having received the updated message calculate and update a message and a final LLR, which will be transferred to the check node. A series of operations for one layer as described above is referred to as layer processing.

When layer processing is performed for all layers, in operation 1007, a receiving terminal calculates a bit estimation value by making hard decision on the final LLR calculated by each variable node. In operation 1009, the receiving terminal checks whether the decoding succeeds or fails by performing a syndrome check based on the bit estimation value. Here, the check nodes of the parity-check matrix corresponding to the syndrome check may be all check nodes or some predetermined check nodes. (For example, some or all of check nodes connected to a variable node of degree 1 may be excluded.)

In general, an LDPC code may detect an error through the syndrome check, but a CRC code, as an outer code, may be additionally applied in order to support a higher level of error detection capability. A general example of an FEC decoding operation when a CRC code, as an outer code, and an LDPC code, as an inner code are applied is shown in FIG. 11.

Figure 11:
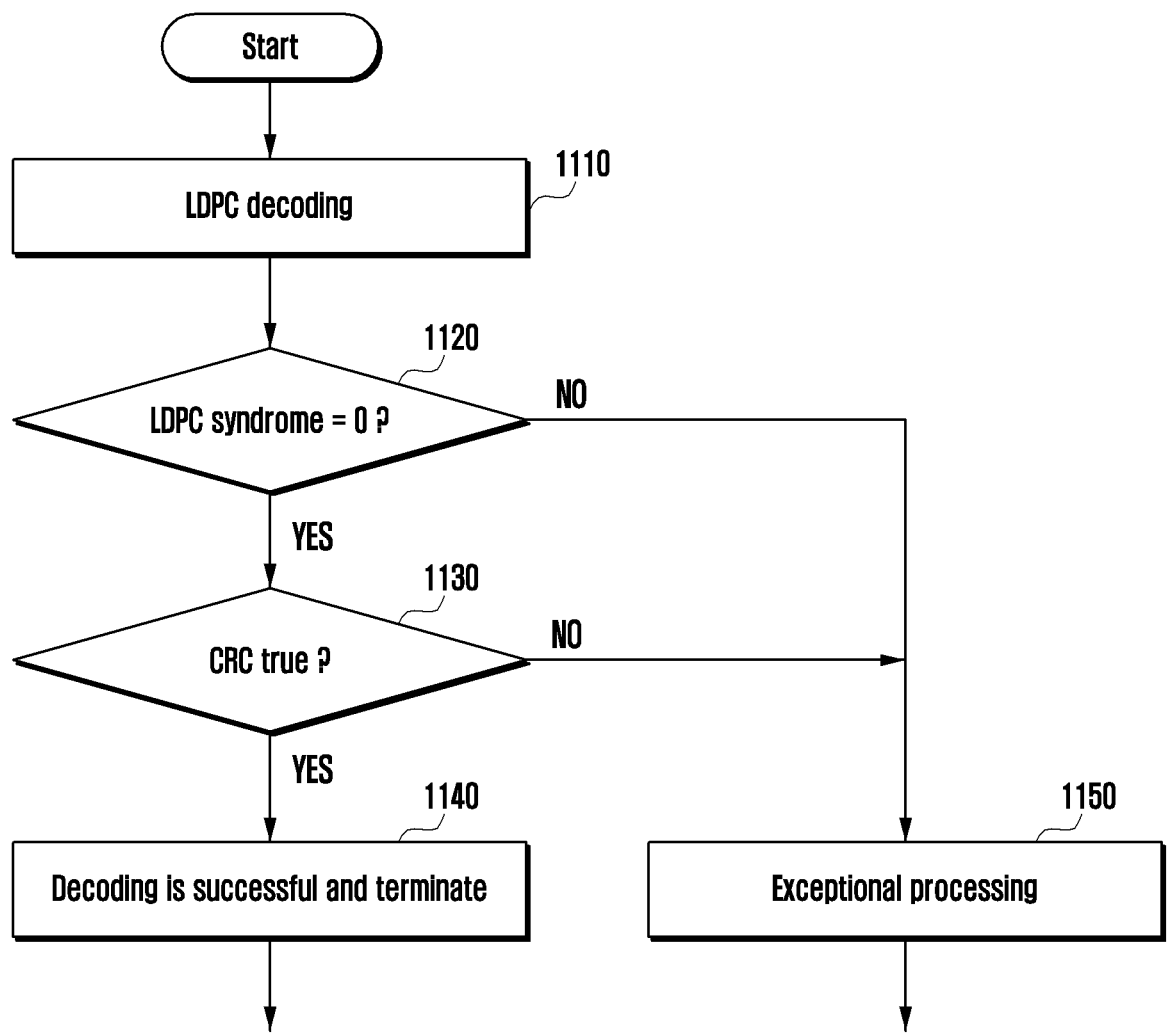
FIG. 11 is a flowchart illustrating an example decoding process based on LDPC and CRC codes according to an embodiment.

FIG. 11 is a flowchart illustrating an example decoding process based on LDPC and CRC codes according to an embodiment.

As shown in FIG. 11, in general, a receiver performs LDPC decoding in operation 1110 and then identifies or checks the LDPC syndrome as in operation 1120 to determine whether an error is detected. Here, the LDPC syndrome refers to a value determined as in <Equation 19> below when the codeword, obtained through the hard decision after LDPC decoding is performed, is ĉ and the parity-check matrix used for decoding is H.

$$S = H \cdot \hat{c}^T \qquad \text{[Equation 19]}$$

If the codeword actually transmitted from a transmitter is c, then $H \cdot c^T = 0$ is established by <Equation 1>, and thus when the decoding is successfully performed, the syndrome s value of <Equation 19> should also be "0". (Depending on circumstances, a case where an LDPC syndrome value is "0" may be expressed as "LDPC syndrome value has been identified and passed".) However, if the syndrome value is not 0 (or if the LDPC syndrome value has not been passed), it may denote $c \neq \hat{c}$.

If the LDPC syndrome s value is not "0" in operation 1120 ("No" in operation 1120) of FIG. 11, the receiver may immediately perform exceptional processing in operation 1150, and may determine whether to use information word bits or code blocks, for which LDPC decoding has been performed, in a higher layer of the system. The receiver may determine whether to discard the information word bits or code blocks for which the LDPC decoding is performed, depending on a predetermined case.

However, even if the LDPC syndrome s value is not "0" in operation 1120, the receiver does not immediately perform exceptional processing in operation 1150, and may perform CRC detection (or confirmation) for the information word bit as in operation 1130. The CRC detection may be performed in operation 1130 because there is a possibility that an error remains only in the parity bit and the information word bit has no error after LDPC decoding, although the codeword decoding has failed according to a result of the LDPC decoding, and thus it may be determined whether an error for the information word bit is detected.

In addition, when the LDPC syndrome value according to LDPC decoding is "0" ("Yes" in operation 1120), the receiver may perform CRC detection in operation 1130.

If it is determined that an information word bit vector has been successfully decoded through CRC detection in operation 1130 ("Yes" in operation 1130), the decoding process is terminated. If it is determined that the information word bit vector includes an error as a result of CRC detection in operation 1130 ("No" in operation 1130), the receiver may perform exception processing of the information word bit vector or code block for which decoding has been performed as in operation 1150, and may determine whether to use the corresponding information word vector or code block in a higher layer of the system or whether to discard the information word vector or code block.

Note that the exceptional processing in the disclosure may denote all operations performed when it is determined that the decoding has failed or is likely to fail, in addition to the operations to be performed when the decoding is successfully performed in all processes.

In addition, the receiver may generate an instruction or flag relating to whether or not the decoding is successful and transmit the same to a higher layer. The higher layer may determine a processing method of the information word bits or code blocks for which decoding has completed, based on the instruction or flag. (Example: determination of a retransmission request, etc.)

For reference, although c≠ĉ in <Equation 19>, if the decoded codeword C is a codeword different from c, the LDPC syndrome may be "0". Since such an error cannot be detected through the LDPC code, it is generally necessary to perform CRC detection after performing LDPC decoding in order to detect the error.

In addition, the syndrome value s may be obtained (or calculated or determined) through a calculation process based on a parity-check matrix and a decoded codeword as shown in <Equation 19>, but may be easily obtained according to implementation characteristics of the LDPC decoder. For example, in <Equation 15>, in order to perform LDPC decoding, a message used in a decoding process may be decoded according to a size and a sign in a distinguishable manner, and the syndrome value s can be easily obtained (or calculated or determined) through the operation of the plus (+) or minus (−) signs of the messages. For example, in actual implementation of a decoder, a plus (+) sign is mapped to a binary number such as 0 and a minus (−) sign is mapped to 1 so that a syndrome value can be easily obtained based on an appropriate XOR operation. In particular, it is possible to easily identify whether the syndrome value is 0 or not from an implementation characteristics in the LDPC iterative decoding process. For reference, a hard decision of an actual LDPC-decoded codeword can be easily made based on the signs of messages for each bit for which LDPC decoding is performed.

In operation 1120, in the case of checking or identifying the LDPC syndrome, it is not necessary to check or identify all syndromes of the LDPC code, and only some syndrome values may be checked or identified. For example, syndrome values related to a check node connected to a variable node of degree 1, that is, syndrome values related to a check node corresponding to a parity bit of degree 1 may not be used for checking or identification of the LDPC syndrome in operation 1120. Since bits corresponding to the variable node of degree 1 have a significantly low probability of correcting an error, it is highly likely to always be detected as an error having occurred even when the LDPC syndrome is checked. Therefore, in order to avoid an erroneous error check result, in many cases, the LDPC syndrome is checked or identified for all or part of the check nodes connected only to variable nodes or bits of degree 2 or more.

Figure 3A:
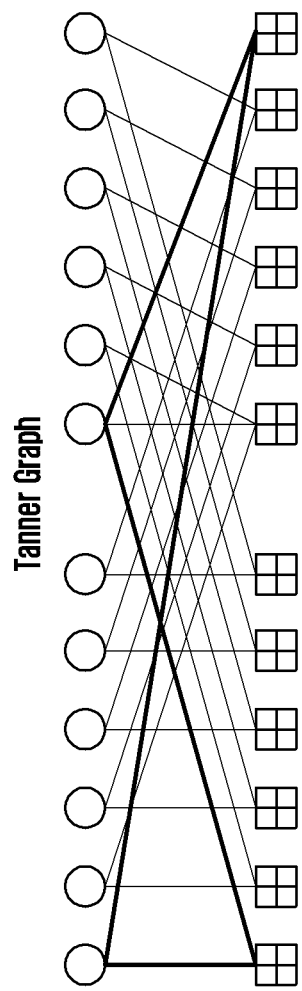
FIG. 3A is a diagram illustrating an example of cycle characteristics of a QC-LDPC codeword according to an embodiment.
Figure 3B:
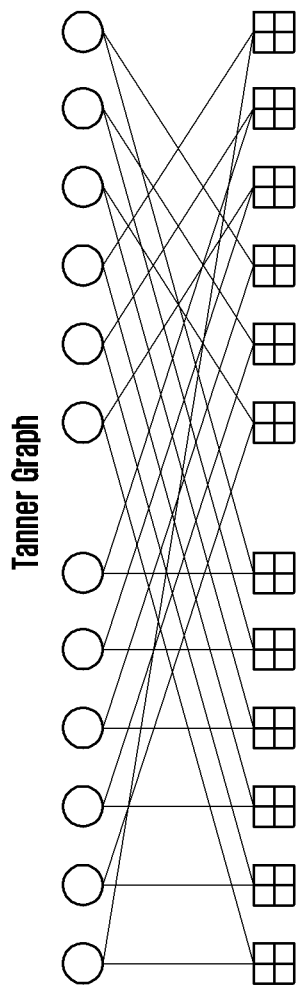
FIG. 3B is a diagram illustrating an example of cycle characteristics of a QC-LDPC codeword according to an embodiment.
Figure 3B:
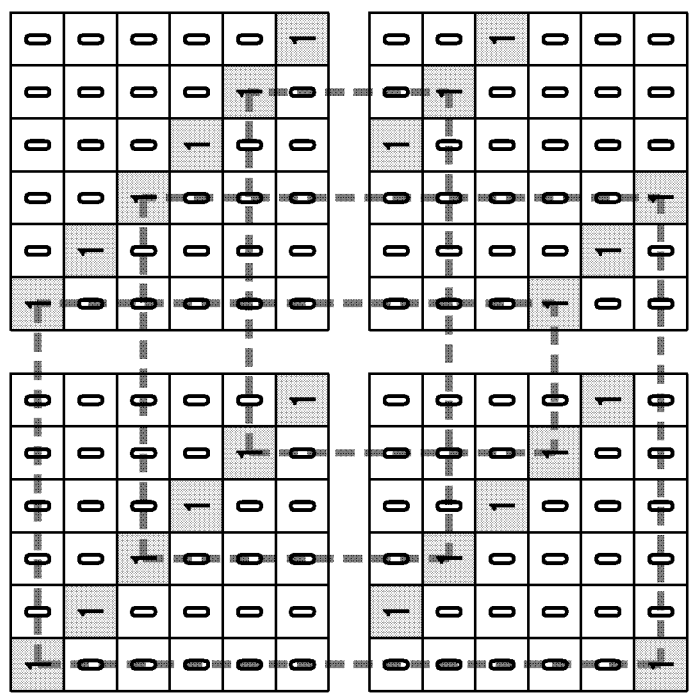

The LDPC code considered in the disclosure is a quasi-cyclic LDPC code that can be defined as a quasi-cyclic parity-check matrix of FIGS. 3A and 3B, and generally has algebraic characteristics according to a block size represented by L or Z as shown in <Equation 11>. For example, the cycle characteristics on the Tanner graph of the quasi-cyclic LDPC code are related to the block size, and if the parity-check matrix has complete coefficients, the length of the LDPC information word can also be expressed in the form of a multiple of the block size. Due to these algebraic characteristics, not only encoding but also decoding of the quasi-cyclic LDPC code can be performed more efficiently based on the block length.

However, since a transport block generally has various lengths, the transport block may not necessarily be expressed as the number of information word bits of the LDPC code that can be defined in the parity-check matrix of the quasi-cyclic LDPC code, that is, in the form of a multiple of the specific block size Z. Even after the segmentation described in FIG. 4, the transport block may not be expressed in the form of a multiple of the block size Z. As described above, when information word bits or code blocks that are less than the maximum number of LDPC information word bits or a maximum code block size that can perform LDPC encoding on the parity-check matrix at a time or that are not expressed in the form of a multiple of the block size are encoded, an operation such as zero padding (or shortening) may be additionally performed to satisfy a multiple of the block size, for convenience of encoding or decoding.

In the disclosure, the maximum number of bits of the LDPC information word that can be encoded at one time for the parity-check matrix of the LDPC code or the base matrix (or mother matrix) of the parity-check matrix, etc. may be referred to as the maximum number of LDPC information word bits of the parity-check matrix or the maximum code block size, which may be expressed as $K_{cb}$.

The maximum number of LDPC information word bits or the maximum code block size may be differently defined for each predetermined parity-check matrix or base matrix. For example, with regard to encoding using a parity-check matrix defined based on a base matrix B1, the maximum code block size may be defined as $K_{cb1}=8448$, and with regard to coding using a parity-check matrix defined based on a base matrix B2, the maximum code block size may be defined as $K_{cb2}=3840$. Note that $K_{cb1}=8448$ and $K_{cb2}=3840$ need to be multiples of the maximum value of the block size Z applicable to each base matrix.

For example, if the maximum value of the applicable block sizes for the base matrices B1 and B2 is equal to 384, it may be expressed by $K_{cb1}=8448=22*384$ and $K_{cb2}=3840=10*384$, and it may denote that a submatrix corresponding to the information word bits of the base matrix B1 is formed of 22 column blocks, and a submatrix corresponding to the information word bits of the base matrix B2 is formed of 10 column blocks.

As described above, in the disclosure, since the number of columns of the submatrix corresponding to the information word bit is a multiple of the block size, the size of the code block to which LDPC encoding has been applied may be configured to be a multiple of the block size Z of the LDPC parity-check matrix by adding <Null> bits to the transport block to be transmitted, for convenience of encoding and decoding. <Null> bits may be added regardless of whether segmentation is applied or not, and may be added to configure the size of a code block to be constant. Adding <Null> bits to the information word bits of LDPC codes is generally referred to as "shortening", and since <Null> bits are configured as promised bit values (for example, "0") at a promised position in the transmitter and receiver, it may not be actually transmitted. Since the receiver is able to accurately know the value, decoding may be performed by excluding <Null> bits from the decoding process, or decoding may be performed by applying a promised value during the decoding process.

For example, if the promised value of the shortened bits is "0", the decoder may perform decoding by applying a value (e.g., in the case of LLR, the maximum value configured in the system corresponding to the infinity value) corresponding to the probability in which the bit at the shortened position is 0 is "1".

In general, in the case of a system of suitably converting and using a sequence with respect to various block sizes L (or Z) from a single LDPC exponent matrix, a sequence, or a parity-check matrix, like the lifting method described in <Equation 9> to <Equation 14>, there are many advantages in system implementation because it only needs to be implemented with one or a few sequences. However, it is very difficult to design an LDPC code having good performance for all block sizes as the number of types of block sizes to be supported increases.

Flowcharts illustrating an example LDPC encoding and decoding process based on a designed base matrix or an exponent matrix are illustrated and described below with reference to FIG. 12 and FIG. 13.

Figure 12:
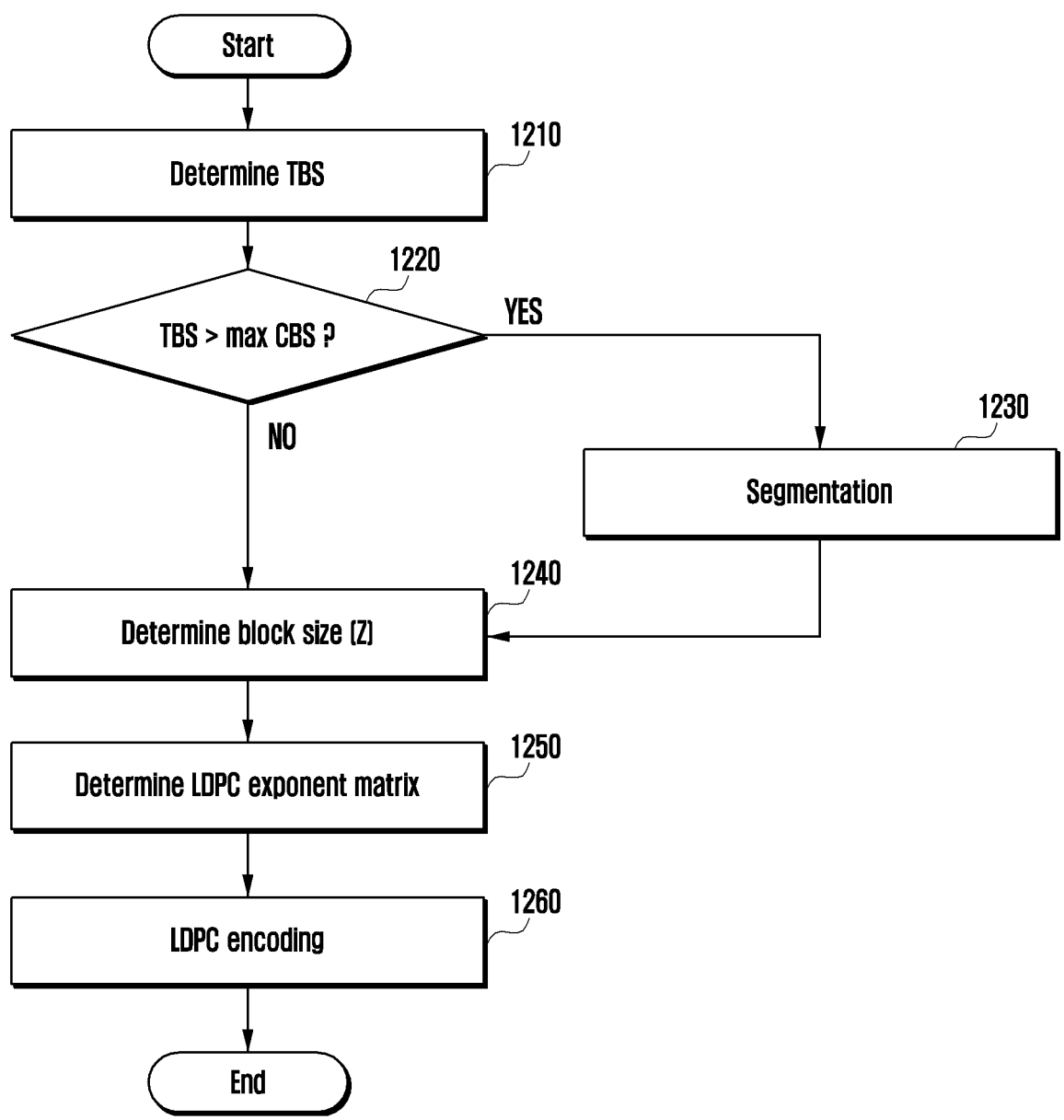
FIG. 12 is a flowchart illustrating an example LDPC encoding process according to an embodiment.

FIG. 12 is a flowchart illustrating an example of an LDPC encoding process according to an embodiment.

As shown in operation 1210 of FIG. 12, a transmitter determines a transport block size (TBS) to be transmitted. Further, in operation 1220, the transmitter determines whether the TBS is greater than a max CBS, which is the maximum code block size, or determines whether the TBS is equal to or less than the CBS.

If the TBS is greater than the max CBS ("Yes" in operation 1220), the transmitter determines a new CBS by segmenting the transport block in operation 1230, and if the TBS is equal to or less than the max CBS ("No" in operation 1220), the segmentation operation is omitted and the TBS is determined as the CBS.

In operation 1240, the transmitter determines, based on the CBS, a block size (Z) value to be applied to LDPC encoding.

In operation 1250, the transmitter suitably determines the LDPC exponent matrix or sequence according to the TBS, the CBS, or the block size (Z) value.

In operation 1260, the transmitter performs LDPC encoding based on the determined block size, exponent matrix, or sequence. In operation 1250, a process of converting the determined LDPC exponent matrix or sequence based on the determined block size may be included in some cases. It may be apparent that the LDPC exponent matrix, sequence, or parity-check matrix for LDPC encoding may be determined in various ways based on the TBS or CBS depending on the system. For example, it is possible to first determine a base matrix through the TBS, and then determine an LDPC exponent matrix or a sequence parity-check matrix based on the determined base matrix and CBS, and various other methods can be applied.

Figure 13:
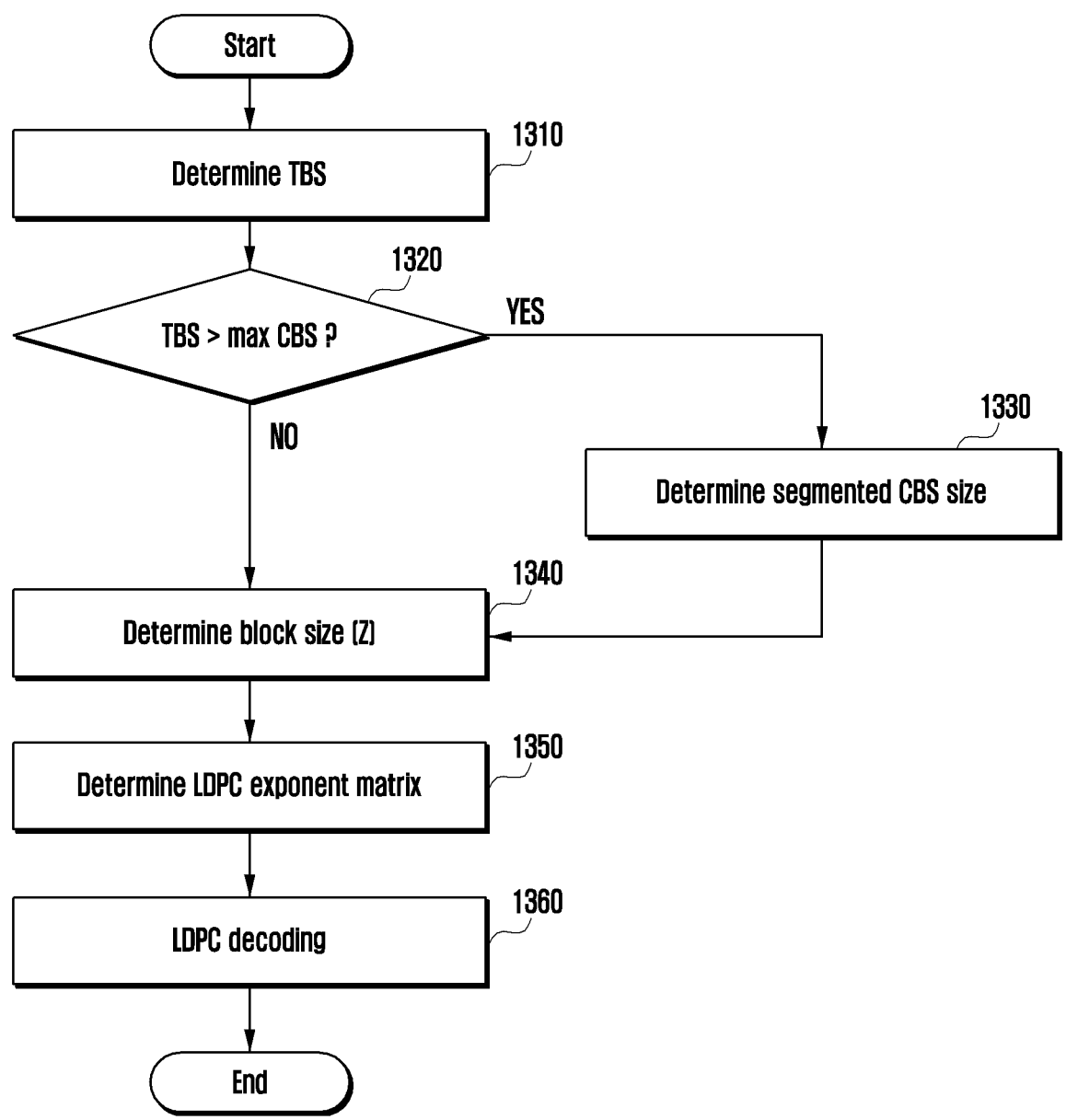
FIG. 13 is a flowchart illustrating an example LDPC decoding process according to an embodiment.

The LDPC decoding process may also be expressed as shown in FIG. 13 to correspond to the encoding process.

FIG. 13 is a flowchart illustrating an example of an LDPC decoding process according to an embodiment.

The receiver may receive an input bit or a signal corresponding to a transport block or a code block. In the disclosure, the input bit may denote an LDPC information word bit, a TB, or bits (TB+CRC) having a CRC added to the TB, or a code block bit. In operation 1310, the receiver determines the number of transport blocks or input bits based on the signal. In operation 1320, the receiver determines whether the TBS is greater than the max CBS. Here, since the max CBS may differ according to the base matrix or parity-check matrix used for LDPC encoding, a process (not shown) of determining the max CBS according to the TBS or code rate may be additionally required.

If the TBS is greater than the max CBS ("Yes" in operation 1320), the receiver determines the size of the segmented CBS in operation 1330. If the TBS is determined to be less than or equal to the max CBS ("No" in operation 1320), the TBS is immediately determined to be the same as the CBS.

In operation 1340, the receiver determines a block size (Z) value to be applied to LDPC decoding. Operations 1310 to 1330 are operations of determining a block size and may be expressed as one operation.

Further, in operation 1350, the receiver determines an LDPC parity-check matrix, an exponent matrix, or a sequence based on the TBS, the CBS, the block size (Z) value, or the code rate. In addition, in operation 1360, the receiver may perform LDPC decoding using the determined block size, parity-check matrix, exponent matrix, or sequence. In operation 1350, in some cases, a process of converting the determined LDPC parity-check matrix, exponent matrix, or sequence based on the determined block size may be included. It may be apparent that the LDPC exponent matrix, sequence, or parity-check matrix for LDPC decoding may be determined in various ways based on the TBS or CBS depending on a system. For example, a base matrix is first determined based on the TBS or code rate, the max CBS is determined (or configured) based on the determined base matrix, and the CBS is determined based on the determined or configured max CBS, and then it is possible to determine the block size Z and LDPC exponent matrix, the sequence, or the parity-check matrix based on the determined CBS, and various other methods can be applied.

According to the above embodiment, with respect to the process of determining the exponent matrix or sequence of the LDPC code in operations 1250 and 1350 of FIGS. 12 and 13, respectively, the case in which the exponent matrix or sequence is determined based on one of TBS, CBS, or block size (Z) has been described, but various other methods may be applied.

In an embodiment of the LDPC encoding and decoding process based on the base matrix and the exponent matrix (or LDPC sequence) of the LDPC code of FIGS. 12 and 13, by suitably shortening a part of information word bits and puncturing a part of codeword bits with respect to the LDPC code, it is possible to support the LDPC encoding and decoding with various coding rates and various lengths. For example, various information word lengths (or code block lengths) and various code rates can be supported by applying shortening to a part of information word bits in the base matrix or exponent matrix determined for LDPC encoding and decoding in FIGS. 12 and 13, and then puncturing a part of input bits, code blocks, information word bits corresponding to the first two column blocks, puncturing a part of parity, or repeating a part of the LDPC codeword in the parity-check matrix.

In addition, when a variable information word length or a variable coding rate is supported using the shortening or zero-padding of the LDPC code, the code performance may be improved according to the sequence or method of shortening. If the shortening order is already configured, the encoding performance may be improved by rearranging the entirety or a part of the base matrix. In addition, the performance may be improved by suitably determining a block size or the number of column blocks, to which the shortening is to be applied, with respect to a specific information word length (or code block length).

In general, the LDPC code may adjust the code rate by applying puncturing to the codeword bit according to the code rate. When a parity bit corresponding to a column of degree 1 is punctured, it has an advantage in that decoding complexity is reduced because the LDPC decoder can perform decoding without using part or all of the corresponding part of the parity-check matrix. In consideration of the coding performance, there is a method for improving the performance of the LDPC code by adjusting the puncturing sequence of parity bits or the transmission sequence of the generated LDPC codeword. For example, rather than simply puncturing parity bits to support a variable code rate, better performance can be supported when part of the information word bits and parity bits are properly punctured. In addition, when part of LDPC codewords are repeated in order to support a lower code rate, the sequence of repeating the LDPC codewords may be suitably determined in advance to improve LDPC encoding performance.

In general, in the LDPC encoding process, the transmitter first determines the number (or size) of input bits (or code blocks) to which LDPC encoding is applied, determines the block size (Z) to which the LDPC encoding is applied according to the determined number, determines a suitable LDPC exponent matrix or sequence according to the block size, and performs LDPC encoding based on the block size Z and the determined exponent matrix or LDPC sequence. Here, the LDPC exponent matrix or sequence may be applied to LDPC encoding without conversion, and in some cases, the LDPC exponent matrix or sequence may be suitably converted according to a block size (Z) so as to perform LDPC encoding.

Similarly, in the LDPC decoding process, the receiver determines the number (or size) of input bits (or code blocks) relating to the transmitted LDPC codeword, then determines the block size (Z) to which LDPC decoding is applied according to the determined number, determines a suitable LDPC exponent matrix or sequence according to the block size, and performs LDPC decoding based on the block size (Z) and the determined exponent matrix or LDPC sequence. Here, the LDPC exponent matrix or sequence may be applied to LDPC decoding without conversion. In some cases, the LDPC exponent matrix or sequence may be suitably converted according to the block size (Z) so as to perform LDPC decoding.

Figure 14:
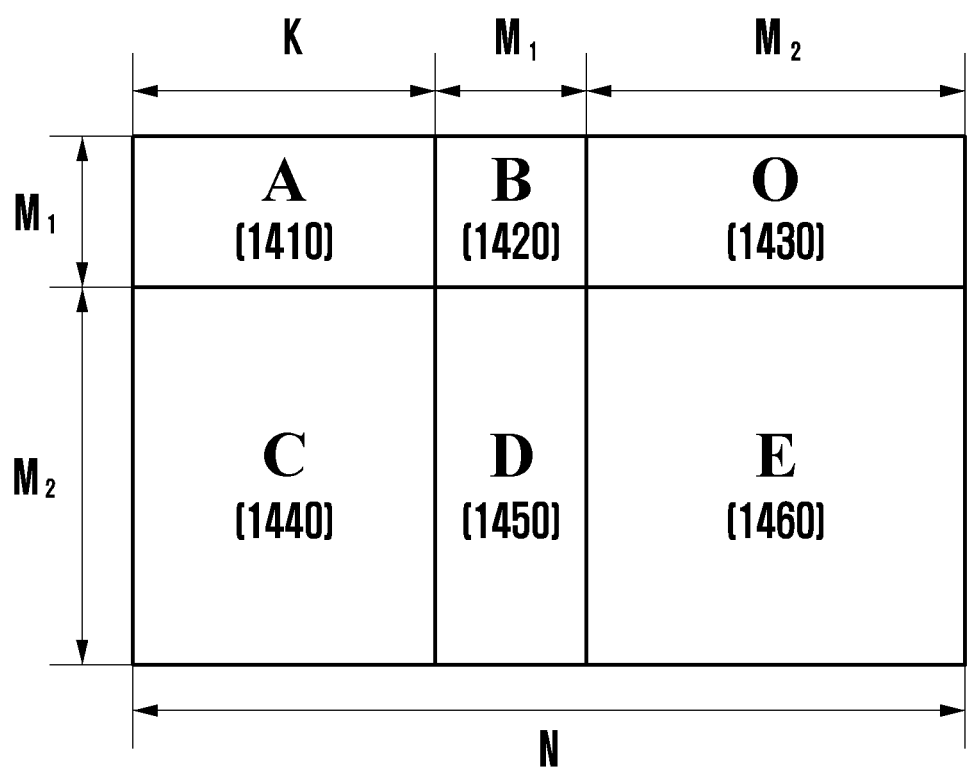
FIG. 14 is a diagram illustrating an example structure of a parity-check matrix of an LDPC code according to an embodiment.

FIG. 14 is a diagram illustrating an example structure of a parity-check matrix of an LDPC code, which may be an inner code applied to an FEC encoder and an FEC decoder according to an embodiment.

Referring to FIG. 14, the parity-check matrix is formed of N columns and $(M_1+M_2)$ rows. In general, when the parity-check matrix has full rank, the number of columns corresponding to information word bits in the parity-check matrix is equal to the number obtained by subtracting the total number of rows from the total number of columns. That is, if the parity-check matrix of FIG. 13 has full rank $(M_1+M_2)$, the number of information word bits, that is K becomes equal to $N-(M_1+M_2)$. In the disclosure, for convenience, only the case where the parity-check matrix of FIG. 14 has full rank is described, but it is not necessarily limited thereto.

First, the parity-check matrix of FIG. 14 can be partitioned into the first part of parity-check matrix formed of submatrices A 1410 and B 1420, and the second part of parity-check matrix formed of submatrices C 1440, D 1450, and E 1460. A submatrix O 1430 denotes a 0-matrix of size $(M_1 \times M_2)$. Since the submatrix O 1430 is a 0-matrix of size $(M_1 \times M_2)$, even if the submatrix O is included in the first part of the parity-check matrix, it does not affect the operation of the matrix. For this reason, in the disclosure, for convenience, a matrix formed of submatrices A 1410 and B 1420 and excluding the submatrix O 1430, which is the 0-matrix of size $(M_1 \times M_2)$, is defined as the first part of the parity-check matrix, but in some cases, the first part of the parity-check matrix may include the submatrix O 1430.

For convenience, if the parity-check matrix of FIG. 14 is referred to as H, information word bits (or information word bit vectors) corresponding to submatrix A 1410 or C 1440 are referred to as $i=(i_0, i_1, \ldots, i_{K-1})$, the first parity bits (or the first parity bit vectors) corresponding to submatrix B 1420 or D 1450 are referred to as $p_1=(p_{1,0}, p_{1,1}, \ldots, p_{1,M_1-1})$, and the second parity bits (or the second parity bit vectors) corresponding to submatrix E 1460 are referred to as $p_2=(p_{2,0}, p_{2,1}, \ldots, p_{2,M_2-1})$, then a relational expression such as <Equation 20> below can be obtained from <Equation 1>.

$$H \cdot c^T = H \cdot \begin{bmatrix} i^T \\ p_1^T \\ p_2^T \end{bmatrix} = \begin{bmatrix} A & B & O \\ C & D & E \end{bmatrix} \cdot \begin{bmatrix} i^T \\ p_1^T \\ p_2^T \end{bmatrix} \quad \text{[Equation 20]}$$

$$\begin{cases} A \cdot i^T + B \cdot p_1^T = 0 \\ C \cdot i^T + D \cdot p_1^T + E \cdot p_2^T = 0 \end{cases}$$

Referring to Equation 20, the first parity vector $p_1$ may be obtained (or calculated or determined) based on the information word bit vector i and the first part of the parity-check matrix. In addition, after obtaining the parity vector $p_1$, a parity vector $p_2$ can be obtained (or calculated or determined) based on the information word bit vector i, the parity vector $p_1$, and the second part of the parity-check matrix.

As described above, the error probability for each bit of the LDPC code differs depending on the degree. In particular, when the degree is 2 or more, the bit error rate (BER, or bit error ratio) is sharply reduced compared to the bit of degree 1. In particular, when the information word bits are successfully decoded, the codeword bits of degree 2 or more rarely cause an error, but the codeword bits of degree 1 (especially parity bits) may include a large number of bit errors even if the information word bits are successfully decoded. For this reason, in the communication system to which LDPC encoding and decoding based on the parity-check matrix of FIG. 14 is applied, there is a very high probability that some of the syndrome values corresponding to the second part of the parity-check matrix formed of submatrices C 1440, D 1450 and E 1460 may not have a value of 0 regardless of whether an error occurs in the information word bits. That is, when the syndrome values, which are determined based on the first part of the parity-check matrix formed of submatrices A 1410 and B 1420 of the parity-check matrix of FIG. 14 (submatrix O 1430 may be included) and the second part of the parity-check matrix formed of submatrices C 1440, D 1450, and E 1460, are referred to as the first part of LDPC syndrome $s_1$ and the second part of LDPC syndrome $s_2$, respectively, there is a very high probability in that the value of $s_2$, as shown in <Equation 21> below, has a non-zero vector value regardless of the decoding result. (In Equation 21, $i^T$, $p_1^T$, $P_2^T$ denote hard-decision result values for LDPC decoding results of the information word bit vector, the first parity vector, and the second parity vector, respectively.)

$$s = \begin{bmatrix} s_1 \\ s_2 \end{bmatrix} = \begin{bmatrix} A & B & O \\ C & D & E \end{bmatrix} \cdot \hat{c}^T = \begin{cases} A \cdot \hat{i}^T + B \cdot \hat{p}_1^T \\ C \cdot \hat{i}^T + D \cdot \hat{p}_1^T + E \cdot \hat{p}_2^T \end{cases} \quad \text{[Equation 21]}$$

As a result, the entire LDPC syndrome may be used to determine whether the LDPC decoding is successful. However, the syndrome, based on the submatrix [A 1410 B 1420] formed of columns of degree 2 or more and independent rows of parity bits of degree 1 in the parity-check matrix as in the first part of the syndrome si, or at least part of the syndrome may be used to determine whether the LDPC decoding is successful. (Even when the first part of the parity-check matrix includes a 0-matrix such as submatrix O 1430, the actual syndrome values are determined based on submatrices A 1410 and B 1420 formed of columns of degree 2 or more.)

Example embodiments having the structure of the parity-check matrix of FIG. 14 are illustrated and discussed in greater detail below with reference to FIG. 15 and FIG. 16.

Figure 15:
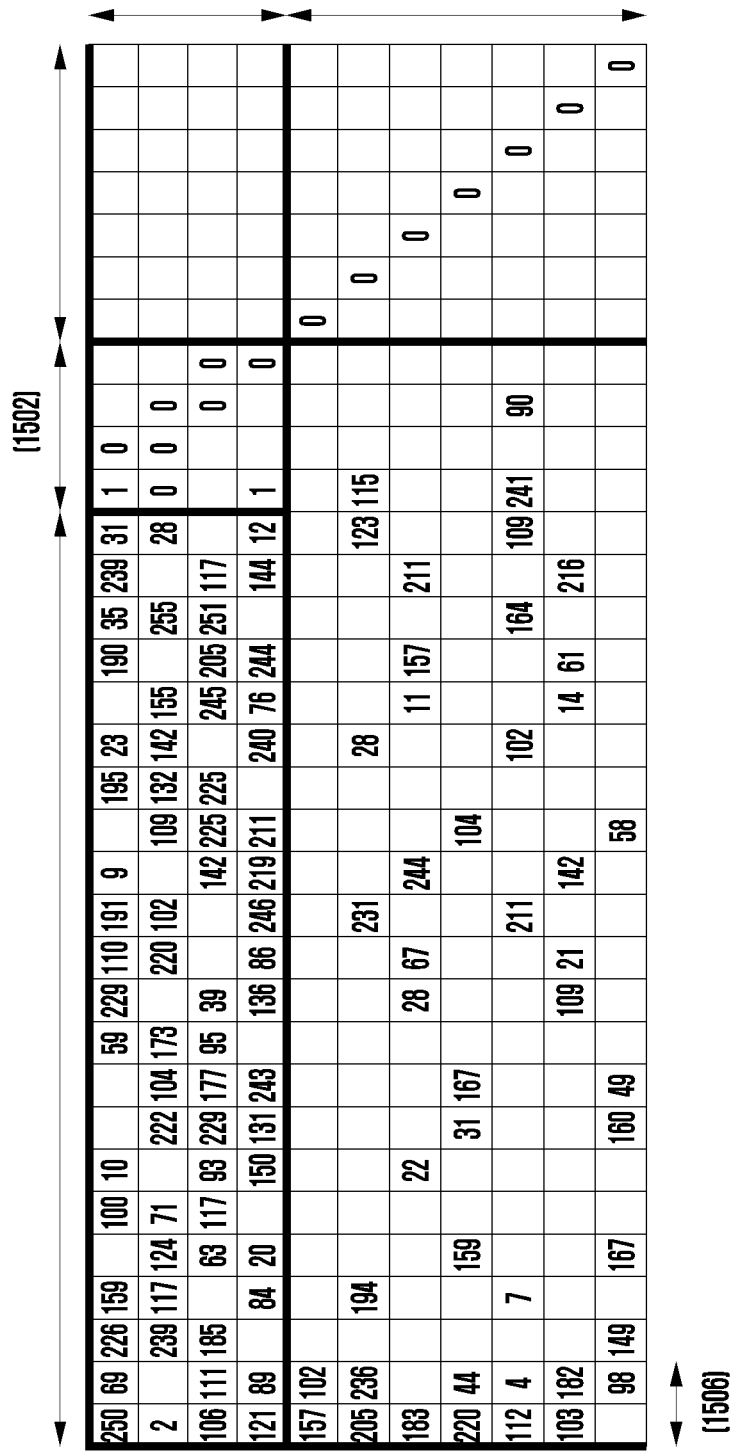
FIG. 15 is a diagram illustrating an example of a parity-check matrix for an LDPC code according to an embodiment.

FIG. 15 and FIG. 16 are diagrams illustrating examples of the parity-check matrix for the LDPC code according to embodiments of the disclosure.

Referring to FIG. 15, the matrix shown in FIG. 15 is an example illustrating the case of K=22*Z, $M_1$=4*Z, and $M_2$=7*Z in FIG. 14, and referring to FIG. 16, the matrix shown in FIG. 16 is an example illustrating the case of K=10*Z, $M_1$=4*Z, and $M_2$=6*Z in FIG. 14.

Here, Z denotes the block size defined in <Equation 9> to <Equation 14>, and since the parity-check matrices of FIG. 15 and FIG. 16 represent the exponent matrix of the quasi-cyclic parity check matrix, the block size corresponds to the size of the cyclic permutation matrices at the time of being represented by an exponent matrix such as <Equation 4> based on the cyclic permutation matrices of <Equation 2>. In FIG. 14, a submatrix formed of $M_2$ columns of degree 1 corresponding to E 1460 is regarded as a submatrix corresponding to the parity of a single parity-check code, and is easily extendable. That is, portions corresponding to C 1440, D 1450, and E 1460 of FIG. 14 may be configured in a form of extending the parity-check matrix of the single parity-check code, and since N=K+$M_1$+$M_2$, as $M_2$ increases, the codeword length N may also increase.

Since the code rate of the LDPC code corresponding to the parity-check matrix of FIG. 14, FIG. 15, and FIG. 16 is K/N, a codeword having a lower code rate may be generated as $M_2$ increases. In other words, LDPC encoding and decoding may be performed based on the parity-check matrix capable of supporting a lower code rate by further extending columns of degree 1 and including FIG. 15 and FIG. 16.

The exponent matrix shown in FIG. 15 and FIG. 16 may be expressed in various forms, and for example, the exponent matrix may be expressed using each sequence as shown in <Equation 22> to <Equation 23> below. <Equation 22> and <Equation 23> represent each entry of the 11×33-sized exponent matrix of FIG. 15 and the 10×20-sized exponent matrix of FIG. 16 by each row. In the exponent matrix, a specific entry value (for example: −1) corresponding to the Z×Z-sized zero matrix may be excluded. For example, the fourth value "63" of the second sequence in <Equation 22> denotes that the exponential value (or cyclic shift value of bits) of the second cyclic permutation matrix, which does not correspond to the Z×Z-sized zero matrix in the second row of the exponent matrix of FIG. 15, is "63". (In the above example, the starting sequence of entries in the sequence and matrix has been considered as starting from "0".)

[Equation 22]
250 69 226 159 100 10 59 229 110 191 9 195 23 190 35 239 31 1 0
2 239 117 124 71 222 104 173 220 102 109 132 142 155 255 28 0 0 0
106 111 185 63 117 93 229 177 95 39 142 225 225 245 205 251 117 0 0
121 89 84 20 150 131 243 136 86 246 219 211 240 76 244 144 12 1 0
157 102 0
205 236 194 231 28 123 115 0
183 22 28 67 244 11 157 211 0
220 44 159 31 167 104 0
112 4 7 211 102 164 109 241 90 0
103 182 109 21 142 14 61 216 0
98 149 167 160 49 58 0
[Equation 23]
9 117 204 26 189 205 0 0
167 166 253 125 226 156 224 252 0 0
81 114 44 52 240 1 0 0
8 58 158 104 209 54 18 128 0 0
179 214 71 0
231 41 194 159 103 0
155 228 45 28 158 0
129 147 140 3 116 0
142 94 230 0
203 205 61 247 0

The exponent matrix shown in FIG. 15 and FIG. 16, that is, the base matrix for the exponent matrix expressed as <Equation 22> and <Equation 23> may also be expressed in various forms, for example, it can also be expressed using sequences such as <Equation 24> and <Equation 25> below. <Equation 24> denotes the position of entry 1 in the base matrix corresponding to the exponent matrix of FIG. 15 and <Equation 22> for each row. <Equation 25> denotes the position of the column in which entry 1 is located in the base matrix corresponding to the exponent matrix of FIG. 16 and <Equation 23> for each row. For example, in <Equation 24>, the third value 4 of the second sequence denotes that the fourth column of the second row in the base matrix includes entry 1. (In the above example, the starting sequence of entries in the sequence and matrix has been considered as starting from "0".)

[Equation 24]
0: 0 1 2 3 5 6 9 10 11 12 13 15 16 18 19 20 21 22 23
1: 0 2 3 4 5 7 8 9 11 12 14 15 16 17 19 21 22 23 24
2: 0 1 2 4 5 6 7 8 9 10 13 14 15 17 18 19 20 24 25
3: 0 1 3 4 6 7 8 10 11 12 13 14 16 17 18 20 21 22 25
4: 0 1 26
5: 0 1 3 12 16 21 22 27
6: 0 6 10 11 13 17 18 20 28
7: 0 1 4 7 8 14 29
8: 0 1 3 12 16 19 21 22 24 30

```
9: 0 1 10 11 13 17 18 20 31
10: 1 2 4 7 8 14 32
[Equation 25]
0: 0 1 2 3 6 9 10 11
1: 0 3 4 5 6 7 8 9 11 12
2: 0 1 3 4 8 10 12 13
3: 1 2 4 5 6 7 8 9 10 13
4: 0 1 11 14
5: 0 1 5 7 11 15
6: 0 5 7 9 11 16
7: 1 5 7 11 13 17
8: 0 1 12 18
9: 1 8 10 11 19
```

In the LDPC encoding/decoding process of using the parity-check matrix shown in FIG. 15 and FIG. 16 and <Equation 22> to <Equation 25>, various code block lengths and code rates may be supported by applying shortening and puncturing. Also, in the case of an LDPC code, when a part of the information word bits (e.g., a part of a code block) is properly punctured, error correction and error floor performance may be improved. For this reason, the LDPC encoding/decoding performance can be improved by always puncturing, modulating, and transmitting a part of the information word bits or a part of the code block regardless of the code rate.

For example, as shown in reference numeral 1506 of FIG. 15 or reference numeral 1606 of FIG. 16, a method of not transmitting a part of the information word bits of size 2*Z corresponding to two column blocks or the code block to the receiving side by always puncturing the part of the information word bits or code block regardless of the code rate or the size of the allocated resource may be considered.

Although the transmitter does not transmit the punctured bits, the receiver may regard the punctured bits as the bits that have been transmitted through the channel but have lost information thereof, that is, the bits that have been erased. Since the receiver may not substantially distinguish between the probability of 0 and 1 for the erased bits, the receiver determines that the probability of 0 is ½ and the probability of 1 is ½. Accordingly, the receiver may determine that the probability of the erased bits (or punctured bits) is 1 when expressed as an LR value, and determine that the probability of the erased bits (or punctured bits) is 0 when expressed as an LLR value. In the disclosure, for convenience of explanation, only the case of using the LLR value in the LDPC decoder is described, but the punctured bits may be expressed as different values according to the requirements of the LDPC decoder.

These punctured bits may correspond to "0" as message values of the LDPC decoder, and may be processed differently by the LDPC decoder according to the degree of the punctured LDPC codeword bits. For example, when LDPC encoding and decoding are performed using a parity-check matrix corresponding to FIG. 15 and FIG. 16 or <Equation 22> to <Equation 25>, if the parity bits of degree 1 are punctured, decoding can be performed by configuring the LLR values to 0. However, in general, if the parity bits of degree 1 are punctured, the LLR values corresponding to the punctured bits may not be used in the decoding process because there is no performance improvement even if iterative decoding is performed. In some cases, the LLR values of the parity bits of degree 1, which are partially punctured for efficient parallel processing, may be configured as 0 and used for decoding. For example, when parallel processing of the LDPC decoder is performed in units of Z, a part of parity bits of degree 1, which has been punctured so that the number of LLR values corresponding to bits used for LDPC decoding is a multiple of Z, may be used.

In the case of performing LDPC encoding and decoding using the parity-check matrix corresponding to FIG. 15 and FIG. 16 or <Equation 22> to <Equation 25>, if a part of the code blocks or information word bits corresponding to two column blocks are punctured as shown in reference numeral 1506 or 1606, the characteristics of the decoding process are simply illustrated and discussed below with reference FIG. 17A and FIG. 17B.

Figure 17A:
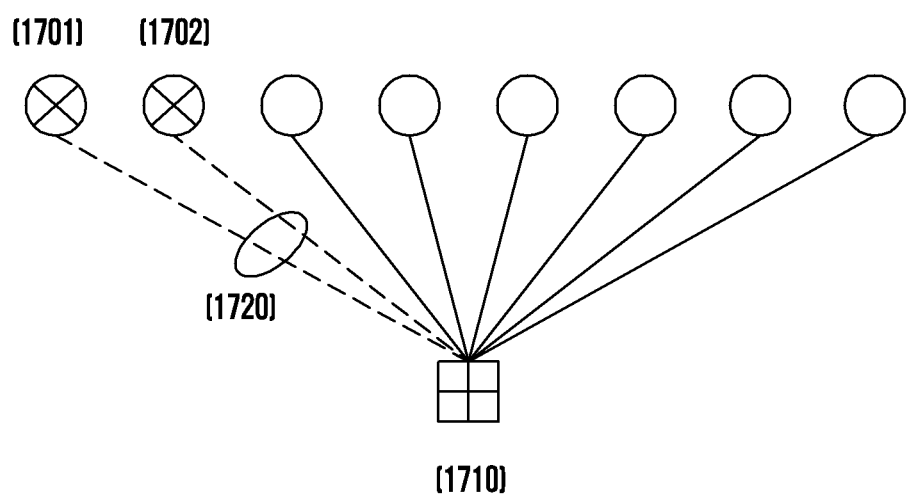
FIG. 17A is a diagram illustrating an example of a case in which two punctured bits are connected to one check node according to an embodiment.
Figure 17B:
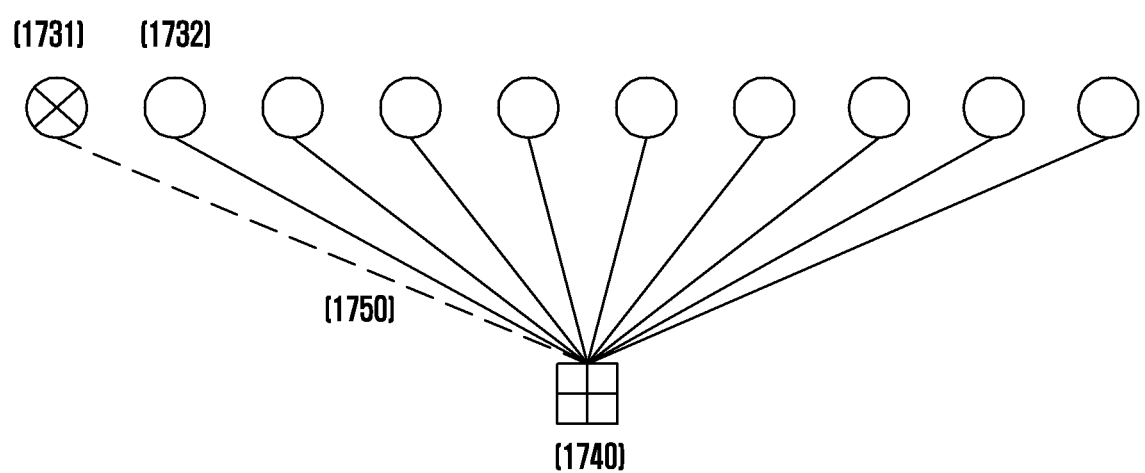
FIG. 17B is a diagram illustrating an example of a case in which one punctured bit is connected to one check node according to an embodiment.

FIG. 17A is a diagram illustrating an example in which one punctured bit is connected to one check node according to an embodiment, and FIG. 17B is diagram illustrating an example in which two punctured bits are connected to one check node according to an embodiment.

FIG. 17A illustrates a Tanner graph corresponding to a first row block in the parity-check matrix of FIG. 15 and FIG. 16. In FIG. 17A, for convenience, eight variable nodes and one check node 1710 are illustrated. However, since the parity-check matrix of FIG. 15 and FIG. 16 represents a quasi-cyclic LDPC code having a block of size of Z, the parity-check matrix is actually and easily extendable to a case in which 8*Z variable nodes and Z check nodes are formed.

If two or more variable nodes, punctured as shown in reference numerals 1701 and 1702 of FIG. 17A, are connected to one check node, the LLR value corresponding to the variable node is configured as 0, and the values thereby are transmitted, along the line 1720 connected to each of the variable nodes, to the check node 1710. In other words, in the case of applying an update equation based on the method described in <Equation 15> and <Equation 16>, the check node processor may include one or more cases in which the value obtained therefrom diverges to infinity in the decoding operation process so that the check node calculation becomes meaningless. Similarly, referring to Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, FEBRUARY 2001, pp 498-519), which is incorporated by reference herein in its entirety, tan h(0)=0 in the case of applying the decoding update equation based on the product rule using the tan h(.) function, and thus one or more cases in which tan h(0)=0 in the update equation may occur. Therefore, the product equation always becomes 0, and thus the LLR value is not updated even if decoding is performed on any variable node.

FIG. 17B illustrates a Tanner graph corresponding to a second row block in the parity-check matrix of FIG. 15 and FIG. 16. In FIG. 17B, for convenience, 10 variable nodes and one check node 1740 are illustrated, however, since the parity-check matrix of FIG. 15 and FIG. 16 represents a quasi-cyclic LDPC code having a block of size of Z, the case is easily extendable to a case actually formed of 10*Z variable nodes and Z check nodes.

If only one variable node, punctured as shown in reference numeral 1731 of FIG. 17B, is connected to one check node, the LLR value corresponding to the variable node is configured as 0, and a value thereby is transmitted, along the line 1750 of each variable node, to the check node 1740. In other words, the check node processor includes, when applying the update method based on <equation 15> and <equation 16> in the process of calculating the updated LLR value corresponding to other lines except for the line 1750, a case in which an operation value thereof diverges to infinity due to the value LLR=0 corresponding to the line 1750, or since tan h(0)=0 when applying the decoding update equation based on the product rule using the tan h(.) function, the product equation becomes 0, so that LLR values are not updated for bits corresponding to variable nodes except for the variable node 1731. However, since update is performed based on values corresponding to lines except for the line 1750 in order to calculate the updated LLR corresponding to the line 1750, the LLR value for the bit corresponding to the variable node 1731 may be updated as a value other than 0.

In the case of the punctured information word bit, the LLR value may or may not be reconstructed immediately after layered decoding is performed on a specific layer or a specific row block according to the structure of the parity check matrix. Meanwhile, in the disclosure, a layer may be configured by at least one row block. In addition, layered decoding refers to an operation of sequentially performing decoding for each layer. Accordingly, decoding may be sequentially performed in units of one row block, or decoding may be performed by configuring a plurality of row blocks into one layer. In addition, depending on the structure of one parity check matrix, some layers may be configured as one row block and other layers may be configured as a plurality of row blocks.

In general, row blocks having orthogonal or quasi-orthogonal characteristics may be regarded as one layer. Here, in the case where circulant permutation matrices included in two or more row blocks are located in different column blocks, the row blocks have orthogonal characteristics. In other words, in the case of generating one row block by adding row blocks having orthogonal characteristics in block units, the circulant permutation matrix is not overlapped in each column block of the generated row block, and is configured as one circulant permutation matrix or zero-matrix. In addition, in a case of defining in terms of a base matrix, it may be denoted that there is no case in which weight 1 is overlappingly added when rows corresponding to the row blocks having orthogonal characteristic are added. For example, in FIG. 15, the sixth row block and the tenth and final row block have orthogonal characteristics to each other. (The first row block has been regarded as the 0th row block.)

In addition, the row blocks satisfying the quasi-orthogonal characteristic denote a case in which the orthogonal characteristic is satisfied only for the remaining column blocks except for the column blocks at some identical positions in each row block. For example, in FIG. 15, the fifth row block and the sixth row block have quasi-orthogonal characteristics because the fifth and the sixth row block satisfy orthogonal characteristics for all column blocks except for the 0th column block. In FIG. 16, the seventh row block and the eighth row block also have quasi-orthogonal characteristics because the seventh and the eighth row block satisfy orthogonal characteristics for all column blocks except for the first column block.

In general, for convenience of implementation, layered decoding is performed by configuring, as one layer, one row block or successive or preconfigured plurality of row blocks having an orthogonal characteristic or quasi-orthogonal characteristic, but even non-successive row blocks having an orthogonal characteristic or quasi-orthogonal characteristic may be configured as one layer. In the case where row blocks satisfying the quasi-orthogonal characteristic are configured as one layer, the implementation complexity increases as the number of column blocks that do not satisfying the quasi-orthogonal characteristic increases, and thus a layer can be configured by considering the complexity allowed in the system. For this reason, the row blocks satisfying the orthogonal characteristic for the remaining column blocks except for one or two column blocks are usually configured as one layer, but there is no need to be limited thereto. In addition, in order to reduce a wait time for a plurality of row blocks satisfying the orthogonal or quasi-orthogonal characteristic, the plurality of row blocks may be simultaneously processed, but may also be processed sequentially or successively according to a predetermined order.

The sequential layer decoding may denote performing decoding on the first selected layer and then performing decoding on other layers, and the sequence of decoding layers may be changed. That is, a method of performing decoding on the first layer, performing decoding on the fourth layer, and then performing decoding on the second layer, etc. is also possible. Meanwhile, in the following embodiments, for convenience of explanation, a case in which one row block configures one layer is assumed.

For example, in a communication system in which a part of information word bits or code blocks corresponding to the 0th and 1st column blocks is punctured for the parity-check matrix corresponding to the exponent matrix of FIG. 15, even if, for LDPC decoding, the receiver selects one of the 0th, 2nd, 3rd, 4th, 5th, 7th, 8th, and 9th row blocks and performs the first layered decoding on the selected row block, or performs layered decoding successively on the row blocks, update for each bit is not performed and thus the first layered decoding or the successive layered decoding has no effect.

On the other hand, if one of the 1st, 6th, and 10th row blocks is selected and the first layered decoding thereon is performed, the LLR values corresponding to the punctured information word bit or the code block corresponding to the 0th or 1st column block are updated, and thus even if layered decoding is performed on any row block thereafter, the LLR values are updated for at least a part of the information word bits. In particular, if layered decoding is performed sequentially for the first row block and the tenth row block or the sixth row block and the tenth row block, all the LLR values for the transmitted information word bits and parity bits have meaningful values, and thus in the subsequent layered decoding process, the layered decoding is performed as if all the codeword bits were not punctured.

Applying decoding scheduling that can recover LLR values from the first layered decoding, in consideration of the punctured information word bits or code blocks, is an important matter when the code rate is very high and the information throughput per hour that the system intends to support is high. In general, when a system intends to transmit data corresponding to several hundred Mbps to several Gbps, not only does the channel environment need to be good but also a high LDPC coding rate needs to be applied, and the number of times of iterative decoding performed by the receiver needs to not be high. The reason is that since the number of times of iterative decoding is generally inversely proportional to decoding information throughput per time by the receiver, the smaller the number of times of iterative decoding, the greater the information throughput that can be supported. In particular, when a very high decoding information throughput per time is required, the number of times of iterative decoding is reduced in many cases. Here, the first few invalid layered decoding processes may have a great influence on the reduction of the information throughput per time. Accordingly, it is possible to increase decoding efficiency by appropriately configuring the scheduling for layered decoding in consideration of the information word bits or code blocks punctured as described above and the structure of the parity check matrix.

In order to configure the scheduling for the layered decoding, it is important not only to quickly reconstruct LLR values corresponding to the punctured information word bits or code blocks by the receiver, but also to optimize decoding performance in consideration of a proper degree distribution. In general, since LDPC codes have an irregular degree distribution, performance may differ according to whether layered decoding is performed on a row block having a predetermined degree distribution.

In order to optimize the performance of layered decoding, the disclosure proposes a method of determining the sequence of a layer to be decoded (or a row block when a layer is configured by one row block) and an example embodiment thereof. To this end, various factors to be considered in order to determine the sequence of layers to be decoded are examined, and a specific method of configuring a proper decoding scheduling by combining these factors is proposed. In addition, in the disclosure, for convenience of explanation, an example embodiment is shown only in the case of using a quasi-cyclic LDPC code, but it is noted that the case is be easily extendable to a general LDPC code.

Example Conditions for Determining Layered Decoding Scheduling

Condition 1)
In the case where a part of information word bits (or code blocks) are punctured and transmitted, prioritize the initial decoding for a row block corresponding to a row having degree 0 or 1 or having weight 0 or 1 in a submatrix formed only of columns or column blocks corresponding to the punctured information word bit in the base matrix. If there is no punctured information word bit, ignore condition 1).

Condition 2)
Prioritize decoding of a row block for which the theoretical decoding performance is maximized, by considering the degree, the weight distribution, or the modulation order or methods. In many cases, in the initial decoding process, the lower the degree of the check node, that is, the row weight, the greater the decoding performance can be. In addition, since the reliability or bit error rate of respective bits configuring the modulation symbol is different according to the modulation method, an optimized scheduling method may differ according to the modulation method. For the theoretical performance, various methods such as density evolution analysis or extrinsic information transfer (EXIT) chart analysis, etc. may be applied.

Condition 3)
Prioritize a row block to be decoded, by considering the part of a base matrix or a parity-check matrix of an LDPC code that is substantially used in decoding or affects performance according to code rate or rate matching. That is, the sequence of layers to be decoded may be changed according to code rate or rate matching.

Condition 4)
Prioritize a row block to be decoded, by considering the part of a base matrix or a parity-check matrix of an LDPC code that is substantially used or affects the performance according to the TBS or CBS. That is, the sequence of layers to be decoded may be changed according to the TBS size.

The condition 1) is a condition for fast LLR reconstruction by considering a substantially limited number of times of iterative decoding. For convenience of explanation, the disclosure assumes encoding/decoding based on LDPC code having the parity-check matrix having a structure of FIG. 14 to FIG. 16 or the exponent matrix or the base matrix of <Equation 22> to <Equation 25>, only puncturing of the information word bits has been described in the condition 1). The reason is that in general, in the case of the LDPC code having the structure of FIG. 14 to FIG. 16 or the exponent matrix or the base matrix of <Equation 22> to <Equation 25>, not only is the puncturing of the parity part variable, but also in the case where the parity of degree 1 has been punctured, there is no problem even if the parity-check matrix part corresponding thereto is excluded from a decoding process and then decoding process is performed. However, in general, condition 1 may be applied by considering not only the information word bits but also the parity bit puncturing.

As an example of determining the sequence of the layers to be decoded for layered decoding by considering the condition 1), one of the first, sixth or tenth row blocks in FIG. 15 may be determined as a row block to be first decoded, and the remaining row blocks may also be used for initial decoding. (Note that the first row block is regarded as the 0th row block.) In the case of FIG. 16, decoding may be performed first on one of the first, the third, the sixth, the seventh, or the ninth row blocks, and the remaining row blocks may also be used for initial decoding.

In the case of condition 2), it is considered that sufficient iterative decoding has been performed and the theoretical performance is maximized. In general, the higher the degree of the variable node and the lower the degree of the check node, the greater the performance improvement effect is. However, in general, since the degree of the variable node and the degree of the check node increase or decrease on average at the same time, the performance of the LDPC code significantly differs depending on the configuration of degree distribution for the LDPC code. Since the disclosure assumes a layered decoding method, there is a possibility to have a great performance improvement effect when a row block having a lower degree is first decoded in the initial decoding process.

As an example embodiment, in the case of the parity-check matrix corresponding to FIG. 15 and FIG. 16, the degree or weight of the 0th, 1st, 2nd, and 3rd rows is significantly greater than the degree or weight of the fourth and subsequent rows from the perspective of the base matrix. Therefore, initial decoding performance may be improved at the time of performing decoding on a row block corresponding to rows including the fourth and subsequent rows of the base matrix in the initial decoding. If considered together with condition 1), initial decoding performed using the 6th row block or 10th row block in FIG. 15 may have a great performance improvement effect, and initial decoding performed using the 6th, 7th, or 9th row block in FIG. 16 may have a great performance improvement effect.

In the case of applying a higher-degree modulation scheme such as 16-QAM, 64-QAM, 256-QAM, 1024-QAM, . . . , reliability may differ according to each bit configuring a modulation symbol. For example, most significant bits (MSBs) in each modulation symbol have a low bit error rate, in general, that is, high reliability, and least significant bits (LSBs) have a high bit error rate, in general, that is, low reliability. Therefore, according to a scheme in which LDPC codeword bits to be transmitted are mapped to modulation symbols, LDPC decoding performance may greatly differ. When a rule for mapping LDPC codeword bits to modulation symbols is predetermined, the sequence of layers to be initially decoded may be changed in order to maximize performance according to a modulation method (or order) and the mapping rule.

In a communication system that applies proper rate matching in order to support variable code rates, since the submatrix of the parity-check matrix corresponding to the rate matching substantially affects performance, condition 3) is added to reflect this characteristic. For example, if the LDPC encoding/decoding system supports a very high code rate close to "1" using the parity-check matrix corresponding to the exponent matrix of FIG. 15 and FIG. 16 or the exponent matrix and the base matrix of <Equation 22> to <Equation 25>, a case in which a part of parity bits corresponding to the last two column blocks in submatrices 1502 and 1602 corresponding to parity bits in FIGS. 15 and 16 are punctured through rate matching may occur. If a situation in which parity bits corresponding to the first two column blocks in the submatrices 1502 and 1602 are punctured occurs, the situation denotes that the code rate is greater than 1, and thus if the situation is not a special case occurring in the system, parity bits corresponding to the first two column blocks in the submatrices 1502 and 1602 are not punctured. Here, an invalid decoding process can be minimized only when initial decoding is performed on the first row block.

On the other hand, if the code rate 22/27 is supported in FIG. 15 or the code rate 10/15 is supported FIG. 16, parity bits corresponding to the 6th row block are transmitted, and if initial decoding is first applied to the sixth row block according to condition 1) and condition 2), the best encoding/decoding performance can be supported.

If the code rate supported by the system is not significantly variable, and the code rate is determined to be different from the above examples, since the optimal decoding scheduling sequence is determined for a given parity-check matrix, performance may be optimized only when initial decoding is performed on first row block, 6th row block, and another row block.

As described above, since the size and range of the submatrix that affects the performance in the parity-check matrix differ according to a code rate, if one fixed layered decoding scheduling method is applied, implementation of the parity-check matrix is easy but performance may slightly be degraded. Therefore, when implementation is possible, coding/decoding performance is improved when variable decoding scheduling is applied based on all or part of a maximum code rate that can be supported, a minimum code rate, or an actual supported code rate.

For reference, the code rate used in condition 3) may use an effective code rate which is obtained by dividing the number of information word bits or the code block size by the number of transmitted bits, and may use a code rate, etc. defined from MCS or channel quality indicator (CQI)-related system information (for example, an MCS index or CQI index, etc.) If the effective code rate is used, it may have an advantage that a scheduling order or pattern that enables more accurate performance prediction can be defined, an additional process of calculating the effective code rate may be required. In the case of using the code rate defined in the MCS or CQI, an additional calculation operation may not be required. However, since the defined code rate may differ from the code rate optimized for a predetermined scheduling sequence or pattern, there is a possibility that some performance degradation may occur.

The condition 4) may be applied to the case where a part of the base matrix or the parity-check matrix of the LDPC code that is substantially used for decoding or affecting performance is different according to the TBS or CBS. In fact, according to the 3GPP 5G standard TS 38.212 document, when a code block (or information word bit) is mapped to a submatrix corresponding to an information word in a parity check matrix, the range thereof is differently configured according to CBS. For example, when encoding is performed based on the second base matrix BG2 defined in the TS 38.212 (in TS 38.212, the base matrix is expressed as a basic graph), $K_b$=10 column blocks if the CBS or TBS length is longer than 640, $K_b$=9 column blocks if the CBS or TBS length is equal to or shorter than 640 or exceeds 560, $K_b$=8 column blocks if the CBS or TBS length is equal to or shorter than 560 or exceeds 192, or $K_b$=6 column blocks if the CBS or TBS length is equal to or shorter than 192 are selected, and then encoding of the selected $K_b$ column blocks are performed. Accordingly, in the submatrix of the parity-check matrix corresponding to the information word bit or the code block, the remaining column blocks except for the $K_b$ column blocks may not be used in the encoding process. As described above, an operation of not using a part of the given parity-check matrix in the encoding process is an operation such as shortening, which results in the change of degree distribution that affects the actual performance. Therefore, as mentioned in the above condition 2), since the theoretical performance of the LDPC code may be greatly affected, the optimal scheduling sequence or pattern may differ according to the TBS or CBS length.

Hereinafter, an example embodiment of an efficient decoding scheduling method applicable by a receiver is proposed by considering each of the four conditions presented in <Conditions for determining layered decoding scheduling> or considering a plurality of conditions at the same time. For convenience of explanation, it is assumed that in a system using a parity-check matrix corresponding to a base matrix such as <Equation 26> and <Equation 27> below, a part of the information word bit or the code block corresponding to the 0th column block and the first column block is punctured. However, the details of the disclosure may be applied to an embodiment in which a part of the information word bit or the code block corresponding to second or subsequent column blocks is punctured. In addition, the block size is expressed as Z, the base matrix of <Equation 26> is expressed as BM1, and the base matrix of <Equation 27> is expressed as BM2, respectively.

[Equation 26]
0: 0 1 2 3 5 6 9 10 11 12 13 15 16 18 19 20 21 22 23
1: 0 2 3 4 5 7 8 9 11 12 14 15 16 17 19 21 22 23 24
2: 0 1 2 4 5 6 7 8 9 10 13 14 15 17 18 19 20 24 25
3: 0 1 3 4 6 7 8 10 11 12 13 14 16 17 18 20 21 22 25
4: 0 1 26
5: 0 1 3 12 16 21 22 27
6: 0 6 10 11 13 17 18 20 28
7: 0 1 4 7 8 14 29
8: 0 1 3 12 16 19 21 22 24 30
9: 0 1 10 11 13 17 18 20 31
10: 1 2 4 7 8 14 32
11: 0 1 12 16 21 22 23 33
12: 0 1 10 11 13 18 34
13: 0 3 7 20 23 35
14: 0 12 15 16 17 21 36
15: 0 1 10 13 18 25 37
16: 1 3 11 20 22 38
17: 0 14 16 17 21 39
18: 1 12 13 18 19 40
19: 0 1 7 8 10 41
20: 0 3 9 11 22 42
21: 1 5 16 20 21 43
22: 0 12 13 17 44
23: 1 2 10 18 45
24: 0 3 4 11 22 46
25: 1 6 7 14 47
26: 0 2 4 15 48
27: 1 6 8 49
28: 0 4 19 21 50

-continued

```
29: 1 14 18 25 51
30: 0 10 13 24 52
31: 1 7 22 25 53
32: 0 12 14 24 54
33: 1 2 11 21 55
34: 0 7 15 17 56
35: 1 6 12 22 57
36: 0 14 15 18 58
37: 1 13 23 59
38: 0 9 10 12 60
39: 1 3 7 19 61
40: 0 8 17 62
41: 1 3 9 18 63
42: 0 4 24 64
43: 1 16 18 25 65
44: 0 7 9 22 66
45: 1 6 10 67
```
[Equation 27]
```
0: 0 1 2 3 6 9 10 11
1: 0 3 4 5 6 7 8 9 11 12
2: 0 1 3 4 8 10 12 13
3: 1 2 4 5 6 7 8 9 10 13
4: 0 1 11 14
5: 0 1 5 7 11 15
6: 0 5 7 9 11 16
7: 1 5 7 11 13 17
8: 0 1 12 18
9: 1 8 10 11 19
10: 0 1 6 7 20
11: 0 7 9 13 21
12: 1 3 11 22
13: 0 1 8 13 23
14: 1 6 11 13 24
15: 0 10 11 25
16: 1 9 11 12 26
17: 1 5 11 12 27
18: 0 6 7 28
19: 0 1 10 29
20: 1 4 11 30
21: 0 8 13 31
22: 1 2 32
23: 0 3 5 33
24: 1 2 9 34
25: 0 5 35
26: 2 7 12 13 36
27: 0 6 37
28: 1 2 5 38
29: 0 4 39
30: 2 5 7 9 40
31: 1 13 41
32: 0 5 12 42
33: 2 7 10 43
34: 0 12 13 44
35: 1 5 11 45
36: 0 2 7 46
37: 10 13 47
38: 1 5 11 48
39: 0 7 12 49
40: 2 10 13 50
41: 1 5 11 51
```

For reference, the receiver may determine a block size shown in <Equation 11> or <Equation 12>, and may determine a parity-check matrix of the LDPC code required for performing decoding based on the block size, the base matrix BM1 of [Equation 26], and a sequence (or exponent matrix) such as <Equation 28> below. Similarly, the receiver may determine the block size shown in <Equation 11> or <Equation 12>, and may determine a parity-check matrix of the LDPC code required for performing decoding based on the block size, the base matrix BM2 of <Equation 27>, and a sequence (or exponent matrix) such as <Equation 29> below. Here, the method according to <Equation 8> to <Equation 10> may be applied to the process of determining the parity-check matrix.

[Equation 28]
```
0: 250, 69, 226, 159, 100, 10, 59, 229, 110, 191, 9, 195, 23, 190, 35, 239, 31, 1, 0,
1: 2, 239, 117, 124, 71, 222, 104, 173, 220, 102, 109, 132, 142, 155, 255, 28, 0, 0, 0,
2: 106, 111, 185, 63, 117, 93, 229, 177, 95, 39, 142, 225, 225, 245, 205, 251, 117, 0, 0,
3: 121, 89, 84, 20, 150, 131, 243, 136, 86, 246, 219, 211, 240, 76, 244, 144, 12, 1, 0,
4: 157, 102, 0,
5: 205, 236, 194, 231, 28, 123, 115, 0,
6: 183, 22, 28, 67, 244, 11, 157, 211, 0,
7: 220, 44, 159, 31, 167, 104, 0,
8: 112, 4, 7, 211, 102, 164, 109, 241, 90, 0,
9: 103, 182, 109, 21, 142, 14, 61, 216, 0,
10: 98, 149, 167, 160, 49, 58, 0,
11: 77, 41, 83, 182, 78, 252, 22, 0,
12: 160, 42, 21, 32, 234, 7, 0,
13: 177, 248, 151, 185, 62, 0,
14: 206, 55, 206, 127, 16, 229, 0,
15: 40, 96, 65, 63, 75, 179, 0,
16: 64, 49, 49, 51, 154, 0,
17: 7, 164, 59, 1, 144, 0,
18: 42, 233, 8, 155, 147, 0,
19: 60, 73, 72, 127, 224, 0,
20: 151, 186, 217, 47, 160, 0,
21: 249, 121, 109, 131, 171, 0,
22: 64, 142, 188, 158, 0,
23: 156, 147, 170, 152, 0,
24: 112, 86, 236, 116, 222, 0,
25: 23, 136, 116, 182, 0,
26: 195, 243, 215, 61, 0,
27: 25, 104, 194, 0,
28: 128, 165, 181, 63, 0,
29: 86, 236, 84, 6, 0,
30: 216, 73, 120, 9, 0,
31: 95, 177, 172, 61, 0,
32: 221, 112, 199, 121, 0,
33: 2, 187, 41, 211, 0,
34: 127, 167, 164, 159, 0,
35: 161, 197, 207, 103, 0,
36: 37, 105, 51, 120, 0,
37: 198, 220, 122, 0,
38: 167, 151, 157, 163, 0,
39: 173, 139, 149, 0, 0,
40: 157, 137, 149, 0,
41: 167, 173, 139, 151, 0,
42: 149, 157, 137, 0,
43: 151, 163, 173, 139, 0,
44: 139, 157, 163, 173, 0,
45: 149, 151, 167, 0
```
[Equation 29]
```
0: 9, 117, 204, 26, 189, 205, 0, 0,
1: 167, 166, 253, 125, 226, 156, 224, 252, 0, 0,
2: 81, 114, 44, 52, 240, 1, 0, 0,
3: 8, 58, 158, 104, 209, 54, 18, 128, 0, 0,
4: 179, 214, 71, 0,
5: 231, 41, 194, 159, 103,0,
6: 155, 228, 45, 28, 158, 0,
7: 129, 147, 140, 3, 116, 0,
8: 142, 94, 230, 0,
9: 203, 205, 61, 247, 0,
10: 11, 185, 0, 117, 0,
11: 11, 236, 210, 56, 0,
12: 63, 111, 14, 0,
13: 83, 2, 38, 222, 0,
14: 115, 145, 3, 232, 0,
15: 51, 175, 213, 0,
16: 203, 142, 8, 242, 0,
17: 254, 124, 114, 64, 0,
18: 220, 194, 50, 0,
19: 87, 20, 185, 0,
20: 26, 105, 29, 0,
21: 76, 42, 210, 0,
22: 222, 63, 0,
23: 23, 235, 238, 0,
24: 46, 139, 8, 0,
25: 228, 156, 0,
26: 29, 143, 160, 122, 0,
27: 8, 151, 0,
28: 98, 101, 135, 0,
```

29: 18, 28, 0,
30: 71, 240, 9, 84, 0,
31: 106, 1, 0,
32: 242, 44, 166, 0,
33: 132, 164, 235, 0,
34: 147, 85, 36, 0,
35: 57, 40, 63, 0,
36: 140, 38, 154, 0,
37: 219, 151, 0,
38: 31, 66, 38, 0,
39: 239, 172, 34, 0,
40: 0, 75, 120, 0,
41: 129, 229, 118, 0

According to an embodiment, a row block that is always used for decoding in a parity-check matrix regardless of a code rate may be determined by considering a maximum code rate Rmax that can substantially be supported by a system. The supportable maximum code rate Rmax may denote the maximum code rate that enables decoding by a structural characteristic itself of the parity-check matrix of the LDPC code when the codeword bits transmitted after all rate matchings are normally received under the assumption that there is no retransmission, and may also denote a simple theoretically possible maximum code rate regardless of the parity-check matrix of the LDPC code, such as code rate 1.

Among the row blocks always used for decoding, a row block, in which condition 1) among <Conditions for determining layered decoding scheduling> is satisfied even when parity puncture occurs by considering the maximum code rate Rmax, and in which the LLR value can be reconstructed from the time of applying the first layered decoding, is selected. Here, the row block in which the LLR value can be reconstructed may denote a row block of degree 1 (e.g., only one circulant permutation matrix is included therein) in a submatrix corresponding to a column block to be punctured as described above.

For example, when it is assumed that Rmax is a value close to 1, since a first row block in the BM1 or BM2 can always be LLR updated, the first row block may be selected as a first row block in the layered decoding order or pattern. For example, when a decoding order or pattern is configured by indexes of the row blocks according to the sequence of row blocks performing decoding, the first number of the decoding order or pattern may be 1. If layered decoding is sequentially performed for other row blocks after layered decoding of the first row block, the layered decoding order or pattern may be expressed in the forms of [1, 0, 2, 3, 4, . . . 45] for BM1, and [1, 0, 2, 3, 4, . . . , 41] for BM2.

As described above, if the layered decoding order or pattern is fixed, the sequence of the row blocks of the base matrix of <Equation 26> and <Equation 27>, or the exponent matrix or parity-check matrix corresponding thereto is changed and stored, and then layered decoding thereof may be performed. For example, in <Equation 26>, the first two row blocks of BM1, that is, the 0th row block and the first row block may be swapped and stored as follows, and then layered decoding thereof may be sequentially performed.

0: 0 2 3 4 5 7 8 9 11 12 14 15 16 17 19 21 22 23 24
1: 0 1 2 3 5 6 9 10 11 12 13 15 16 18 19 20 21 22 23

Similarly, for BM2, the 0th row block and the first row block may be swapped and stored as follows, and then layered decoding thereof may be sequentially performed.

0: 0 1 2 3 6 9 10 11
1: 0 3 4 5 6 7 8 9 11 12

In the example embodiment, an example of first decoding a first row block has been described, but the embodiment of the disclosure is not limited thereto. In other words, it may be apparent that in the submatrix corresponding to the column block to be punctured, a predetermined row block or a row block satisfying a predetermined criterion among row blocks of degree 1 can be first decoded.

In addition, the layered decoding may be decoded based on a layer corresponding to the row block to be first decoded. Here, a layer may include a row block having orthogonality or quasi-orthogonality among row blocks adjacent to a row block to be first decoded.

Similar to the example embodiment described above, the first row block is configured as the row block to be decoded first.

After layered decoding is performed on the first row block in order to improve performance by reflecting the characteristics of condition 2) among <Conditions for determining layered decoding scheduling>, decoding can be performed on the remaining row blocks in reverse order.

To this end, after performing a de-segmentation operation including: an operation of determining a TBS or CBS value, an operation of determining a base matrix which has been used among the base matrices BM1 and BM2; and an operation of determining a block size (Z), it is possible to determine a codeword bit Er, which has been transmitted after rate matching for the r-th code block, by considering the determined value, the allocated resource, the modulation scheme, and the like. However, in the 3GPP 5G communication system, when transmission is required for a case where the number of ACK or NACK bits, which are an acknowledgment signal, is 1 or 2, the same effect as that of the case where a part of the CSI-part2 and/or UL-SCH (data) is punctured may occur, and thus a part of the Er bits may not be actually transmitted. However, the receiver may consider that the corresponding transmission codeword bits have been transmitted, and may process the codeword bits at the corresponding location to be punctured bits by configuring LLR=0. In other words, the transmitted codeword bit Er value may denote a bit physically and actually transmitted by the transmitter, but in some cases, it can be determined, by the receiver, as the size of the codeword bit that has been transmitted.

When the number of transmitted codeword bits Er is identified, the number of valid row blocks of the parity check matrix (or actually affecting performance) in the encoding/decoding process or the number of rows $N_{RowBlk}$ of the base matrix can be obtained by <Equation 30> as follows.

$$N_{RowBlk} = \min\left(\left\lceil \frac{E_r - (K_b - K_{punc}) \times Z}{Z} \right\rceil, N_{RowBlk\_Total}\right) \quad \text{[Equation 30]}$$
$$= \min\left(\left\lceil \frac{E_r}{Z} \right\rceil - (K_b - K_{punc}), N_{RowBlk\_Total}\right)$$

Here, $K_b$ denotes the number of column blocks actually used for LDPC encoding of a given code block in the base matrix while corresponding to information word bits in the parity check matrix, $K_{punc}$ denotes the number of column blocks corresponding to bits to which puncturing is applied among the information word bits or the code blocks, and $N_{RoWBlk\_Total}$ denotes the total number of row blocks defined in the parity check matrix given in the system. In general, in a case where transmission is performed through sufficient resources, repeated transmission of some bits are possible when rate matching is applied, and the $$\left\lceil \frac{E_r}{Z} \right\rceil - (K_b - K_{punc})$$

value may be greater than the $N_{RowBlk\_Total}$ value. Therefore, the maximum value for the number of the maximum row block required for LDPC decoding may be configured as $N_{RowBlk\_Total}$, as shown in <Equation 30>.

<Equation 30> is an example of a method of obtaining a total number of row blocks or layers required for LDPC decoding in case of initial transmission. In the case of retransmission, the Er value may be changed due to rate matching corresponding to different RV values or different allocated resource amounts, and thus a value different from the $N_{RowBlk}$ value (determined in the initial transmission) of <Equation 30> may be determined as the total number of row blocks or layers. As a specific example, if it is assumed that the encoding bit is transmitted after rate matching based on RV0 in the initial transmission and the encoding bit is transmitted after rate matching based on RV2 in the case of retransmission, bits between the last bit of the initial transmission and a bit corresponding to a start point of RV2 may not be transmitted or received even once according to a transmission code rate. Therefore, accurate determination on the information about the number or location of row blocks or layers required for LDPC decoding is possible based on a resource amount Er(i) determined according to each i-th transmission, an RV value corresponding to rate matching (e.g., RV(i)), and the maximum number of row blocks $N_{RowBlk\_Total}$.

However, since the Er(i) and RV(i) values are variable according to initial transmission and retransmission conditions, it may be somewhat complicated not only to accurately identify the number or location of required row blocks or layers but also to adjust optimized decoding scheduling according to the variable row blocks or layers. Therefore, in the case of considering both initial transmission and retransmission, rather than accurately determining the number and location of row blocks or layers, which are essentially required based on the number of transmitted encoded bits (e.g., substantially affect LDPC decoding performance), the number of row blocks or layers required for LDPC decoding may be roughly determined based on the index of the last column among the columns of the parity check matrix of the LDPC code corresponding to the transmitted encoded bits.

For example, even if some rows in the middle of the parity check matrix are not required because the some rows do not substantially affect LDPC decoding performance according to the number of encoded bits initially transmitted or retransmitted and the RV value corresponding thereto, when the location or index of the last column among the columns of the parity check matrix corresponding to all the transmitted encoded bits is called (D−1), LDPC decoding can be performed based on the submatrix of the parity check matrix in which all columns after the D-th and only rows corresponding thereto are assumed to be non-existent. In some cases, the above method has a problem in that decoding operations that are unnecessary due to rows that do not substantially affect the LDPC decoding performance may be somewhat added, but has an advantage in that layer scheduling for layered decoding can be simply implemented with respect to all cases implemented based on HW and SW.

As an example, when the initially transmitted LDPC encoded bits are mapped 1:1 to columns of the parity check matrix, an index corresponding to the last column thereamong is called D(0). The index may denote the last index for a value (e.g., LLR) obtained by demodulating the received signal corresponding to the transmitted LDPC encoded bits, by the rate dematcher of the receiver. If a circular buffer is assumed, the index may denote the last index in which a value obtained through demodulation or a message (e.g., LLR) value is stored.

When the last index of the columns of the parity check matrix corresponding to the received message values (e.g., LLR values) corresponding to the encoded bits transmitted in the initial transmission is assumed to be D(0), and the last index of the columns of the parity check matrix corresponding to message values corresponding to the encoded bit transmitted according to the i-th retransmission is assumed to be D(i), the largest value among the indexes is called $D^* = \max(D(0), D(1), \ldots)$. (For convenience, each index D(i) may be referred to as the last index of the encoded bit, the index of the received message, or the LLR index.) The D* may be used to determine the actual layer, and may be implemented based on <Equation 31> below. Meanwhile, in the case of performing LDPC encoding/decoding based on the parity check matrix corresponding to the base matrix of <Equation 26>, the maximum value of the number of columns in the parity check matrix is 68*Z, and thus each D(i) has a value less than 68*Z. In the case of performing LDPC encoding/decoding based on the parity check matrix corresponding to the base matrix of <Equation 27>, the maximum value of the number of columns in the parity check matrix is 52*Z, and thus the index D(i) has a value smaller than 52*Z.

As a result, for LDPC decoding, $N_{ColBlk} = \lceil D^*/Z \rceil$ column blocks may be required in the parity check matrix. In addition, generally, when the structure of the parity check matrix of FIGS. 14 to 16 is satisfied, like the parity check matrix corresponding to the base matrix of <Equation 26> and <Equation 27>, $K_b^* + M_1$ column blocks and at least $M_1$ row blocks may be required for LDPC decoding. Here, $K_b^*$ denotes the total number of column blocks that may correspond to information word bits in the parity check matrix, and $M_1$ denotes the number of row blocks corresponding to the submatrix [A B] in which all columns have degree of 2 or more in the parity check matrix. For example, $K_b^* = 22$, $M_1 = 4$ with respect to the base matrix of <Equation 26> or a parity check matrix corresponding thereto, and $K_b^* = 10$, $M_1 = 4$ with respect to the base matrix of <Equation 27> or a parity check matrix corresponding thereto. Accordingly, the number of column blocks required for LDPC decoding may be expressed as $N_{ColBlk} = \min(\lceil D^*/Z \rceil, K_b^* + M_1)$, and the number of columns of the parity check matrix substantially required may be equal to or less than $N_{Col} = \min(\lceil D^*/Z \rceil, K_b^* + M_1) \times Z$.

For reference, if the received message, or received messages or LLR messages corresponding to the last index D(i) of the LLR value and indexes preceding the last index, are repeatedly received, the messages are properly combined and stored in a memory for decoding (e.g., an LLR memory and a buffer memory). For example, when LDPC decoding is performed based on the LLR value, combination may be performed by adding LLR values corresponding to the same encoded bit.

From the number of column blocks required for LDPC decoding, the number of row blocks or layers required for LDPC decoding may be determined as shown in <Equation 31> below.

$$N_{RoWBlk} = \min(\lceil D^*/Z \rceil, K_b^* + M_1) - K_b^* \qquad [\text{Equation 31}]$$

If $M_1$ is fixed ($M_1$=4) as in the base matrix of <Equation 26> and <Equation 27>, $M_1$ may be replaced by 4 in <Equation 31>. In addition, since the $N_{RowBlk\_Total}$ corresponding to the base matrix of <Equation 26> has a value of 46, and the $N_{RoWBk\_Total}$ corresponding to the base matrix of <Equation 27> has a value of 42, the $N_{ROWBlk}$ may have a value of 46 or a value equal to or less than 42 depending on the base matrix. In addition, the number of rows actually required for LDPC decoding and substantially affecting thereon may be equal to or less than $$N_{RowBlk} \times Z = \left( \min\left( \left\lceil \frac{D^*}{Z} \right\rceil, K_b^* + M_1 \right) - K_b^* \right) \times Z.$$

If successive shortening is applied as many times as a specific bit (hereinafter referred to as an F bit) among LDPC information word bits, the number of column blocks substantially affecting LDPC decoding may be expressed as $$N_{ColBlk} = \min(\lceil D^*/Z \rceil, K_b^* + M_1) - \left\lfloor \frac{F}{Z} \right\rfloor.$$

This value also denotes the number of column blocks required in the actual LDPC decoding, and the number of columns required in the actual LDPC decoding is equal to or less than $$N_{Col} = \left( \min\left( \left\lceil \frac{D^*}{Z} \right\rceil, K_b^* + M_1 \right) - \left\lfloor \frac{F}{Z} \right\rfloor \right) \times Z.$$

Due to the shortening of the information word bit as described above, even if the number of column blocks substantially required for LDPC decoding is changed, the number of required row blocks may not change.

As described above, the number of column blocks or row blocks required for LDPC decoding may be determined based on all or at least a part of parameters, such as the last index D* corresponding to the received message value, the lifting size Z, the number of column blocks, $K_b^*$, which may correspond to the information word bits, and the number of row blocks, $M_1$, corresponding to the submatrix [A B] in which all columns have degree 2 or more in FIG. 14, and the number of shortened bits, F value.

Meanwhile, as an example, by referring to 3GPP standard document TS 38.212, it is assumed that the input bit (TB+CRC) is 5632 bits, the code rate according to the MCS index is greater than ⅔, and Er=7632. In these conditions, BM1 is determined as a base matrix for LDPC encoding, and the block size is also determined as Z=5632/22=256. In the case of the 3GPP standard TS 38.212, $K_{punc}$ is fixed ($K_{punc}$=2), and when BM1 is used, Kb is always 22, and thus $$N_{RowBlk} = \left\lceil \frac{11072}{256} \right\rceil - 20 = 10.$$

That is, a total of 10 row blocks in the parity check matrix substantially affect LDPC encoding/decoding performance.

As another example, by referring to 3GPP standard document TS 38.212, it is assumed that the input bit (TB+CRC) is 3840 bits, the code rate according to the MCS index is less than ⅔, and Er=11072. In these conditions, BM2 is determined as a base matrix for LDPC encoding, and the block size is also determined as Z=384. In the case of the 3GPP standard TS 38.212, $K_{punc}$ is fixed ($K_{punc}$=2), and when the number of input bits is 3840, $K_b$=10, and thus $$N_{RowBlk} = \left\lceil \frac{11072}{384} \right\rceil - 8 = 21.$$

That is, a total of 21 row blocks in the parity check matrix substantially affect the LDPC encoding/decoding performance. For reference, according to the 3GPP standard TS 38.212, the base matrix to be used is determined according to the TBS and the code rate, in particular, when the base matrix BM2 is used, the $K_b$ value is determined according to the number of input bits, and thus the value of ($K_b$-$K_{punc}$) may also be determined according to the number of input bits. For example, if the number of input bits is greater than 640, $K_b$=10, and thus ($K_b$-$K_{punc}$)=8, and if the number of input bits is greater than 560 and equal to or less than 640, $K_b$=9, and thus ($K_b$-$K_{punc}$)=7, and if the number of input bits is greater than 192 and equal to or less than 560, $K_b$=8 and thus ($K_b$-$K_{punc}$)=6, otherwise $K_b$=6, and thus ($K_b$-$K_{punc}$)=4. Therefore, the number of row blocks to be used needs to be determined using different values depending on the TBS and the code rate.

As a result, when layered decoding is first performed on the first row block and decoding is performed in reverse order for the remaining row blocks, the layered scheduling order or pattern may be expressed as [1, ($N_{RowBlk}$-1), ($N_{RowBlk}$-2), . . . , 3, 2, 0].

In some cases, in a case where parity bits corresponding to a part of the last ($N_{RowBlk}$-1)-th row block are punctured because the last Er value is not a multiple of the block size Z value, the punctured parity bits and the information word bits connected thereto on the Tanner graph are not immediately decoded when layered decoding is first applied. Therefore, in some cases, the order or pattern may be applied in a somewhat modified form such as [1, ($N_{RowBlk}$-2), ($N_{RowBlk}$-1), ($N_{RowBlk}$-3), . . . 3, 2, 0].

In the disclosure, the general definition of reverse-order layered decoding denotes prioritizing at least one of "row blocks or layers corresponding to parity bits of degree 1", first applying layered decoding thereof, and performing decoding on the remaining row blocks or layers in reverse order. If there is no parity bit of degree 1, it denotes that decoding is performed in reverse order from the last row block or layer of the parity check matrix. On the other hand, in the case of an LDPC system using base matrices such as BM1 of <Equation 26> and BM2 of <Equation 27>, the order or pattern modified as follows may be applied by additionally considering condition 1) among <Conditions for determining layered decoding scheduling>.

[1, [($N_{RowBlk}$-4) row blocks corresponding to parity bits of degree 1], . . . , 3, 2, 0]

In a case of applying reverse-order layered decoding, with respect to a part of specific row blocks, the decoding order or pattern thereof may be determined in advance. For example, in a communication system based on the base matrix of <Equation 26> or <Equation 27>, if the decoding order of parity bits corresponding to a column block of a degree other than 1 is defined in advance according to a requirement condition, the reverse order pattern can be variously modified. More specifically, when the sequence of the first four row blocks in the base matrix of <Equation 26> and <Equation 27> is always configured to satisfy the sequence of [1, 0, 2, 3], the reverse order pattern can be modified as follows: [1, [($N_{RowBlk}$−4) row blocks corresponding to parity bit of degree 1], 0, 2, 3] or [1, 0, [($N_{RowBlk}$−4) row blocks corresponding to parity bit of degree 1], 2, 3] or [1, 0, 2, [($N_{RowBlk}$−4) row blocks corresponding to parity bit of degree 1], 3] or [1, 0, 2, 3, [($N_{RowBlk}$−4) row blocks corresponding to parity bit of degree 1]].

Meanwhile, an example of first decoding a first row block has been described, but the embodiment of the disclosure is not limited thereto. In other words, it may be apparent that, in the submatrix corresponding to a column block to be punctured, a predetermined row block or a row block satisfying a predetermined criterion among row blocks of degree 1 may be first decoded.

In addition, the layered decoding may be decoded based on a layer corresponding to the row block to be first decoded. Here, the layer may include a row block having orthogonality or quasi-orthogonality among row blocks adjacent to a row block to be first decoded.

After performing a de-segmentation operation including: an operation of determining a TBS or CBS value, an operation of determining a base matrix which has been used among the base matrices BM1 and BM2; and an operation of determining a block size (Z), BM1 is determined as the base matrix for LDPC encoding/decoding, then, in the case where the code rate R is greater than (or greater than or equal to) the reference code rate $R_{BM(1)}$, the $X_{BM(1)}$-th row block may be configured as the very first row block to be decoded. If BM2 has been determined and in the case where the code rate R is greater than (or greater than or equal to) the reference code rate $R_{BM(2)}$, the $X_{BM(2)}$-th row block may be configured as the very first row block to be decoded. Here, $R_{BM(1)}$ and $R_{BM(2)}$ may be the same value or different values. (For convenience, the base matrices BM1 and BM2 are also expressed as BM(i), i=1, 2.)

In the case where BM1 is used for LDPC encoding/decoding, if the code rate R is less than or equal to (or less than) the reference code rate $R_{BM(1)}$, condition 1) and condition 2) among <Conditions for determining layered decoding scheduling> may be considered at the same time, and the $Y_{BM(1)}$-th row block may be configured as the row block to be decoded initially. Similarly, in the case where BM2 is used for LDPC encoding/decoding, if the code rate R is less than or equal to (or less than) the reference code rate $R_{BM(2)}$, the $Y_{BM(2)}$-th row block may be configured as the row block to be decoded very first.

As such, the position of a row block to start layered decoding first may be variably applied according to a code rate, and in summary, the layered decoding order or pattern may be defined as follows:

i) in a case where R>$R_{BM(i)}$ (or R≥$R_{BM(i)}$); [$X_{BM(i)}$, . . . ], ii) in a case where R≤$R_{BM(i)}$ (or R<$R_{BM(i)}$); [$Y_{BM(i)}$, . . . ].

Here, the values of $X_{BM(1)}$, $X_{BM(2)}$, $Y_{BM(1)}$, and $Y_{BM(2)}$ may be determined as one of the row blocks of weight 1 or degree 1 in the 0th and 1st column blocks to which puncturing is applied. For example, $Y_{BM(1)}$, which is selected when the code rate R is less than the reference code rate, may be determined as an index of a row block, the entire degree or weight of which is less than $X_{BM(1)}$, among row blocks of degree 1 in the corresponding column block. However, the embodiment of the disclosure is not limited thereto, and $Y_{BM(1)}$, which is selected when the code rate R is less than the reference code rate, may be determined as an index of a row block, the entire degree or weight of which is greater than $X_{BM(1)}$, among the row blocks of degree 1 in the corresponding column block. The method of determining $Y_{BM(1)}$ and $X_{BM(1)}$ may be predetermined or may be configured in the receiver. Here, the method may be determined by considering the stability and efficiency of decoding.

As an example embodiment, referring to the exponent matrix of FIG. 15, the base matrix of <Equation 24> corresponding thereto, or the base matrix of <Equation 26> including <Equation 24>, row blocks of weight 1 in the 0th and 1st column blocks, to which information word bit (or code block) puncturing is always applied, are the 1st and 6th row blocks. Therefore, the Er value in which all seven row blocks are not used or the code rate $$\frac{K_b}{K_b - 2 + 7} = \frac{22}{27}$$

corresponding thereto is defined as the reference code rate $R_{BM(1)}$, and if it is satisfied that R>22/27, the layered decoding order or pattern is defined as [1, . . . ], otherwise, an order or pattern such as [6, . . . ] may be applied. (With regard to the above orders or patterns [1, . . . ], [6, . . . ], etc., other patterns such as reverse order patterns may be applied to patterns for row blocks after the first row block.)

As an example embodiment, referring to the exponent matrix of FIG. 16, the base matrix of <Equation 25> corresponding thereto, or the base matrix of <Equation 27> including <Equation 25>, row blocks of weight 1 in the 0th and 1st column blocks to which information word bit (or code block) puncturing is always applied are the 1st and 6th row blocks. Therefore, the Er value in which all seven row blocks are not used or the maximum value $$\frac{K_b}{K_b - 2 + 7} = \frac{10}{15}$$

of the code rate corresponding thereto is defined as the reference code rate $R_{BM(2)}$, and if it is satisfied that R>10/15, the layered decoding order or pattern is configured as [1, . . . ], otherwise, an order or pattern such as [6, . . . ] may be applied.

In the orders or patterns of the example embodiment, with regard to the order or pattern for row blocks after the first row block, various patterns such as the reverse order pattern described in Embodiment 2) may be applied as follows.

in a case where R>$R_{BM(i)}$ (or R≥$R_{BM(i)}$);

[$X_{BM(i)}$, ($N_{RowBlk}$−1), ($N_{RowBlk}$−2), . . . , ($X_{BM(i)}$+1), ($X_{BM(i)}$−1), . . . ], in a case where R≤$R_{BM(i)}$ (or R≤$R_{BM(i)}$);

[$Y_{BM(i)}$, ($N_{RowBlk}$−1), ($N_{RowBlk}$−2), . . . , ($Y_{BM(i)}$+1), ($Y_{BM(i)}$−1) . . . ],

When describing a specific example of BM1 of <Equation 26>, if R>22/27 and $N_{RowBlk}$ value is 7, a decoding order or pattern such as [1, 6, 5, 4, 3, 2, 0] may be applied, and if R≤22/27, a decoding order or pattern such as [6, 5, 4, 3, 2, 1, 0] may be applied. In general, if $N_{RowBlk}$ is 8, a decoding order or pattern is [6, 7, 5, 4, 3, 2, 1, 0], and if $N_{RowBlk}$ is greater than 8, a decoding order or pattern such as [6, ($N_{RowBlk}$−1), ($N_{RowBlk}$−2), . . . , 7, 5, 4, 3, 2, 1, 0] may be applied.

In the various example embodiments, for convenience of explanation, the case where the reference code rate is 1 has been described, but multiple reference code rates may be configured, and the layered decoding order or pattern may be configured differently accordingly. (Not all of orders or patterns need to be different, but at least two different orders or patterns may be defined.)

In the various example embodiments, a case in which a layered decoding order or pattern varies based on a code rate has been described, but it is not necessarily limited thereto. For example, as in embodiment 2, the number $N_{RowBlk}$ or Er value, etc. of row blocks actually used in the base matrix or the parity check matrix may be configured as a reference. For BM(i), a reference value such as a reference $N_{RowBlk, BM}(i)$ for the number of row blocks may be determined, and an order or pattern may be variably applied by comparing the reference value with the value of $N_{RowBlk}$.

Like in the case of using BM2 for LDPC encoding in 3GPP 5G standard, if the number $K_b$ of column blocks actually used in the submatrix corresponding to the information word part in the parity check matrix is variable according to TBS or CBS, the submatrices actually used in the parity check matrix for LDPC encoding and decoding becomes different, and thus the layered decoding order or pattern for which performance is optimized may be different. Therefore, different layered decoding orders or patterns may be applied according to the TBS or CBS. In addition, when the $K_b$ value is defined differently according to the TBS, the reference code rate suggested in the present embodiment may be changed according to the TBS, and a specific value defined in advance may be defined as the reference code rate.

In addition, the layered decoding may be decoded based on a layer corresponding to a row block to be first decoded. Here, the layer may include a row block having orthogonality or quasi-orthogonality among row blocks adjacent to a row block to be first decoded.

Row blocks of weight 0 may exist in a column block corresponding to information word bits (or code blocks) to which puncturing is applied according to the base matrix. LLR update for these row blocks is possible even when layered decoding is performed for the first time. Accordingly, in the case of determining a layered decoding scheduling order or pattern, these row blocks may be first decoded with a top priority.

Here, after determining a $N_{RowBlk}$ value based on <Equation 30>, layered decoding is performed on all row blocks of weight 0 in the column block corresponding to the information word bits to which the puncturing is applied among the $N_{RowBlk}$ numbers of row blocks (with respect to the row blocks, reverse-ordered layered decoding or forward layered decoding may be performed), and then the layered decoding may be applied to the remaining row blocks by combining at least one of the methods suggested in the embodiment 1, the embodiment 2, and the embodiment 3 together. In addition, the layered decoding may be performed based on a layer corresponding to the row block to be first decoded. Here, the layer may include a row block having orthogonality or quasi-orthogonality among the row block to be first decoded and adjacent row blocks.

The actual optimal layered decoding order or pattern may differ according to the number of row blocks actually used for decoding in the parity-check matrix. However, in general, since the performance difference decreases when the code rate is low, and the performance difference is relatively large when the code rate is high, when the layered decoding order or pattern for a high code rate is optimized using a greedy algorithm and then the order or pattern for a lower code rate is optimized based on the result of optimization of layered decoding order or pattern for the high code rate, a quasi-optimized order or pattern can be derived as a sequence of a simple form. As a method of maximizing the performance according to the transmitted codeword length Er, even if the complexity increases to a certain degree, the disclosure suggests a nested-sequence approach (NSA) layered decoding method for storing the layered decoding order or pattern using a sequence of nested structure (or overlapped structure) and then performing decoding thereof.

When the greedy algorithm is properly used while considering all conditions 1), 2), 3), and 4) among <Conditions for determining layered decoding scheduling>, the decoding order or pattern of the nested structure that shows stable performance according to the TBS or code rate may be determined.

According to an example, as a layered decoding order or pattern based on the base matrix BM1 corresponding to <Equation 26>, the sequence is defined as follows:

Pattern 5-1:

[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

Similarly, as a layered decoding order or pattern based on the base matrix BM2 corresponding to <Equation 27>, the sequence is defined as follows:

Pattern 5-2:

[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3]

However, the decoding order or pattern of the nested structure of the disclosure is not limited to the above sequence or pattern. That is, it may be apparent that the embodiment of the disclosure may be applied to the decoding order or pattern of the nested structure generated using the greedy algorithm.

Further, the numbers included in the order or pattern may correspond to an index of a row block of a parity-check matrix or a row index of a base matrix.

Hereinafter, a method of using the pattern-1 and pattern-2 will be described in detail.

The number of row blocks, $N_{RowBlk}$, that are substantially used or affect performance in a given base matrix or a parity-check matrix corresponding thereto is determined based on <Equation 30> (In the disclosure, it is described that the number of row blocks is determined based on <Equation 30>, but can be determined in a different way). Next, only sequences having smaller values than $N_{RowBlk}$ in the sequences of pattern-1 or pattern-2 are selected, and then the selected sequences are applied as a layered decoding order or pattern used for actual decoding. For convenience, such a scheme is referred to as an NSA layered decoding method.

As an example embodiment, with respect to the case of performing LDPC decoding based on the base matrix of <Equation 27>, it is assumed that the input bit (TB+CRC) is 3840 bits (including CRC 16 bits), the code rate according to the MCS index is less than ⅔, and Er=11072. In the case of 3GPP standard TS 38.212, BM2 is determined as a base matrix for LDPC encoding, and also the block size is determined as Z=384, and $K_{punc}$ is fixed ($K_{punc}$=2). In addition, in the case where the number of input bits is 3840, the number of row blocks becomes $$N_{RowBlk} = \left\lceil \frac{11072}{384} \right\rceil - 8 = 21$$

since $K_b=10$. That is, a total of 21 row blocks in the parity-check matrix substantially affect the LDPC encoding/decoding performance. Here, a sequence configured by only numbers less than the $N_{RowBlk}$ value 21 is selected from the pattern-2 sequence. That is, a sequence (or a pattern) configured by only the indexes of valid row blocks may be determined from the pattern-2 sequence.

The indexes of valid row blocks in the pattern-2 sequence is as shown as follows.

[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3]

Accordingly, the sequence or pattern determined based on the indexes of the valid row blocks in the pattern-2 sequence is as follows.

[20, 12, 17, 16, 18, 15, 9, 14, 11, 19, 6, 7, 8, 10, 13, 1, 4, 5, 0, 2, 3]

The selected sequence [20, 12, 17, 16, 18, 15, 9, 14, 11, 19, 6, 7, 8, 10, 13, 1, 4, 5, 0, 2, 3] denotes the layered decoding pattern to be applied in the LDPC decoder, which denotes that one cycle of iterative decoding is performed by sequentially performing layered decoding from the 20th row block to the 3rd row block.

The NSA layered decoding scheme can be modified in various forms as well as the above embodiment. For example, in <Equation 30>, in the case where the Er value is not a multiple of Z, since a part of the parity bit corresponding to the last $(N_{RowBlk}-1)$th row block corresponds to the LLR=0 value, a sequence configured by only the numbers smaller than $(N_{RowBlk}-1)$ is selected for the NSA layered decoding method and then the corresponding layered decoding is performed, but the layered decoding may be performed on the $(N_{RowBlk}-1)$th row block in a predefined order. For example, assuming that i-th layered decoding is always applied to the case of the $(N_{RowBlk}-1)$th row block, the $(N_{RowBlk}-1)$ value may be applied between the (i−1)th number and the i-th number in the order or pattern configured by a sequence of only numbers smaller than $(N_{RowBlk}-1)$.

As an example embodiment, it is assumed that the last $(N_{RowBlk}-1)$th row block is always applied to the first one after the 0th layered decoding is promised in the system. In the same manner as in the above-described embodiment, when TBS=3840 bits (including CRC 16 bits), the code rate according to the MCS index is less than ⅔, and Er=11072, instead of applying [20, 12, 17, 16, 18, 15, 9, 14, 11, 19, 6, 7, 8, 10, 13, 1, 4, 5, 0, 2, 3] as a layered decoding order or pattern, the location of 20 may be changed in order to apply row block 20, which is the $(N_{RowBlk}-1)$th row block, to the first one.

The above-described method is only an example, and there may be an NSA layered decoding method properly combined with other techniques based on a sequence of various nested structures.

In the above embodiment, basically it has been described under the assumption that part of the information word bits (or code blocks) is always punctured. However, in the case where puncturing of the information word bits may not be applied depending on a situation in a system, the sequence or pattern for the proposed layered decoding scheduling may not be optimal.

For example, if the puncturing is not applied, the LLR value is updated no matter which layer is decoded first, and thus the reverse-ordered layered decoding is performed by considering condition 2) among <Conditions for determining layered decoding scheduling>, and if the puncturing is applied, various methods suggested in the above embodiment and the like may be applied.

Depending on whether the information word bit or the code block is partially punctured, performance can be improved if layered decoding is applied based on a first pattern when the information word bit or the code block is partially punctured and if layered decoding is applied based on a second pattern when the information word bit or the code block is not partially punctured.

If implementation complexity is not a big problem, a layered decoding scheme may be applied using a plurality of optimized orders or patterns based on a base matrix, a code rate, or a modulation order of each LDPC code.

For example, in the case of a system using an LDPC base matrix corresponding to the base matrix BM2 corresponding to <Equation 27> and using some of the modulation schemes such as QPSK, 16QAM, 64QAM, 256QAM, and 1024QAM, LDPC decoding may be performed by applying the following sub-optimal layered decoding order or pattern (or sequence) according to each modulation scheme being used:

Pattern 7-1: Order or Pattern for QPSK or 4QAM
[37, 40, 29, 27, 25, 22, 31, 28, 36, 33, 32, 34, 24, 41, 38, 21, 20, 35, 18, 12, 23, 39, 17, 30, 16, 15, 9, 14, 7, 11, 19, 6, 8, 26, 13, 10, 1, 4, 5, 0, 2, 3]

Pattern 7-2: Order or Pattern for 16-QAM
[37, 40, 29, 27, 25, 22, 31, 34, 28, 33, 36, 24, 21, 32, 39, 20, 41, 38, 35, 18, 12, 23, 17, 16, 30, 15, 9, 14, 6, 11, 7, 19, 10, 8, 26, 1, 4, 5, 13, 0, 2, 3]

Pattern 7-3: Order or Pattern for 64-QAM
[37, 40, 33, 29, 25, 27, 32, 23, 22, 36, 31, 28, 24, 26, 34, 20, 18, 21, 39, 12, 41, 38, 35, 17, 30, 16, 14, 11, 15, 6, 7, 9, 19, 10, 8, 13, 1, 4, 5, 0, 2, 3]

Pattern 7-4: Order or Pattern for 256-QAM
[40, 37, 33, 32, 30, 29, 28, 41, 27, 26, 25, 39, 23, 22, 24, 38, 36, 21, 20, 18, 12, 35, 31, 17, 15, 9, 14, 34, 16, 6, 11, 7, 19, 10, 8, 1, 4, 5, 13, 0, 2, 3]

Pattern 7-5: Order or Pattern for 1024-QAM
[41, 40, 39, 38, 37, 36, 35, 34, 33, 32, 31, 30, 29, 28, 27, 26, 25, 24, 23, 22, 21, 20, 18, 15, 12, 17, 11, 9, 16, 14, 6, 7, 1, 19, 10, 13, 4, 8, 5, 0, 2, 3]

The transmitter may transmit data bits according to each modulation scheme or order. In addition, the receiver may appropriately demodulate the received signal according to each modulation scheme or order, determine an LLR value for each received data bit, and then perform layered decoding based on the LLR value and the patterns.

Meanwhile, for convenience of explanation, it has been described that the above patterns or 7-1 to 7-5 are defined for a specific modulation scheme, but the embodiments are not limited thereto. That is, it may be apparent that the above patterns or orders 7-1 to 7-5 may be applied to each modulation scheme or order according to the configurations of the transmitter or the receiver.

Meanwhile, as described above, the embodiment may also be applied when decoding is performed based on a layer configured by one or more row blocks. For example, in the case where a row block to be first decoded is determined among row blocks of degree 1 in the embodiment 1 or embodiment 2, decoding may be performed on a layer corresponding to the row block to be first decoded. Specifically, if a row block adjacent to the determined row block has a characteristic that is orthogonal to or quasi-orthogonal to the row block, decoding may be performed based on a layer including the corresponding row blocks. Further, it may be apparent that layered decoding can be performed by configuring one layer of row blocks having orthogonality or quasi-orthogonality even when sequential decoding is performed or reverse-ordered decoding is performed later.

In addition, it may be apparent that layered decoding of a layer configured by the two or more row blocks may be performed in the above-described embodiment 3 to embodiment 6 as well. In addition, in the case where at least one layer is configured by two or more row blocks, the layered decoding order or patterns may be defined as a sequence shorter than the total number of row blocks, and additional information relating to what row blocks are combined in the layer including a plurality of row blocks combined therein may be required.

Meanwhile, the layered decoding described above may be implemented in various schemes, such as block parallel decoding and row-block parallel decoding (or row parallel decoding).

Here, a block parallel decoding is a layered decoding method which is generally performed based on one or a plurality of blocks in the parity-check matrix, that is, a cyclic permutation matrix having a size of Z*Z. In addition, a row block parallel decoding (or row parallel decoding) is a layered decoding method which is generally performed based on one row block.

The row block parallel decoding method may be considered as an extension of the block parallel decoding method in a broad sense because the method performs decoding on all blocks (cyclic permutation matrices) included in a given row block or a layer configured by a plurality of row blocks. In addition, implementation complexity may increase compared to a block parallel decoding method which is based on one block (cyclic permutation matrix), but higher decoding information throughput may be supported.

A block parallel decoding may be performed based on one block (cyclic permutation matrix), but, in general, may be performed based on a plurality of blocks. In addition, the block parallel decoding may be performed on a criterion smaller than one block, and here, the block parallel decoding may be performed based on a factor of the block size Z in general. In performing the block parallel decoding, when a layered decoder is implemented based on a plurality of blocks, the implementation complexity increases and the decoding information throughput increases as well.

The operation of a receiver according to an example embodiment is summarized as follows. According to an example embodiment, a decoding method by a receiver in a communication system includes: receiving a signal corresponding to an input bit transmitted from a transmitter; identifying a number of input bits based on the signal; identifying a size of a code block based on the number of input bits; and performing layered decoding based on a parity-check matrix corresponding to the size of the code block, wherein the layered decoding is first performed on a layer corresponding to at least one row block among row blocks of degree 1 in a submatrix corresponding to a column block corresponding to a part of a code block to be punctured. In addition, the layered decoding may be performed by combining various embodiments.

In addition, a method by a receiver according to an example embodiment or a decoding method by a receiver according to the disclosure in order to address the above-mentioned problem includes: receiving a signal corresponding to an input bit transmitted from a transmitter; identifying the number of input bits based on the signal; identifying a size of a code block based on the number of input bits; and performing layered decoding based on a parity-check matrix corresponding to the size of the code block, wherein the layered decoding is performed based on the decoding order or pattern as follows:

Pattern 5-1:
[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

Pattern 5-2:
[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

In addition, in order to address the problem described above, a decoding method by a receiver according to an example embodiment the disclosure includes: receiving a signal corresponding to an input bit transmitted from a transmitter; identifying a number of input bits based on the signal; identifying a size of a code block based on the number of input bits; and performing layered decoding based on a base matrix of the LDPC code corresponding to the number of input bits and the code rate or a parity-check matrix corresponding to the size of the code block, wherein the layered decoding is performed by considering a modulation order, a code rate, and the like, based on at least one of decoding orders or patterns as follows:

Pattern 7-1: Order or Pattern for QPSK or 4QAM
[37, 40, 29, 27, 25, 22, 31, 28, 36, 33, 32, 34, 24, 41, 38, 21, 20, 35, 18, 12, 23, 39, 17, 30, 16, 15, 9, 14, 7, 11, 19, 6, 8, 26, 13, 10, 1, 4, 5, 0, 2, 3]

Pattern 7-2: Order or Pattern for 16-QAM
[37, 40, 29, 27, 25, 22, 31, 34, 28, 33, 36, 24, 21, 32, 39, 20, 41, 38, 35, 18, 12, 23, 17, 16, 30, 15, 9, 14, 6, 11, 7, 19, 10, 8, 26, 1, 4, 5, 13, 0, 2, 3]

Pattern 7-3: Order or Pattern for 64-QAM
[37, 40, 33, 29, 25, 27, 32, 23, 22, 36, 31, 28, 24, 26, 34, 20, 18, 21, 39, 12, 41, 38, 35, 17, 30, 16, 14, 11, 15, 6, 7, 9, 19, 10, 8, 13, 1, 4, 5, 0, 2, 3]

Pattern 7-4: Order or Pattern for 256-QAM
[40, 37, 33, 32, 30, 29, 28, 41, 27, 26, 25, 39, 23, 22, 24, 38, 36, 21, 20, 18, 12, 35, 31, 17, 15, 9, 14, 34, 16, 6, 11, 7, 19, 10, 8, 1, 4, 5, 13, 0, 2, 3]

Pattern 7-5: Order or Pattern for 1024-QAM
[41, 40, 39, 38, 37, 36, 35, 34, 33, 32, 31, 30, 29, 28, 27, 26, 25, 24, 23, 22, 21, 20, 18, 15, 12, 17, 11, 9, 16, 14, 6, 7, 1, 19, 10, 13, 4, 8, 5, 0, 2, 3]

The modulation order may be determined by an MCS index. Further, the code rate may be determined by the MCS index. Alternatively, the code rate may be determined based on an effective code rate value, and the effective code rate value may be determined based on the number of bits, Er, actually transmitted through an allocated resource.

Meanwhile, as described above, the layered decoding order or pattern is not limited to a specific modulation order.

Meanwhile, in the disclosure, an order or pattern for determining a layered decoding order may be determined and used based on each of a base matrix (or a parity-check matrix) or a code rate (or the number of row blocks being used) of the LDPC code or modulation order, and the order or pattern may be determined based on two or more conditions. In addition, the embodiments may be applied independently of each other or combined with each other in a hybrid manner, and when different decoding orders or patterns according to each base matrix, modulation order, and code rate (or the number of row blocks being used) are applied, performance may be optimized but complexity may increase, and accordingly the same pattern may be applied in some cases.

For example, in a layered decoding pattern for the modulation order, with respect to the case where the modulation order is less or equal to a predetermined modulation order or to the case where the modulation order is greater than or equal to a predetermined modulation order, it may be configured to use one pattern or order among patterns or orders determined for each modulation order.

According to an example embodiment of the disclosure, the disclosure provides a method of a low density parity check (LDPC) decoding performed by a receiving device in a wireless communication system comprising: receiving, from a transmitting device, a signal corresponding to input bits; performing demodulation based on the signal to determine values corresponding to the input bits; identifying a number of the input bits based on the signal; identifying a base matrix and a lifting size based on the number of the input bits; identifying a parity check matrix based on the base matrix; identifying an index corresponding to the values; determining a number of layers based on the index and the lifting size; determining an order for LDPC decoding based on the number of layers and a predetermined sequence; and performing LDPC decoding to determine the input bits based on the values, the parity check matrix and the order.

According to an example embodiment of the disclosure, the disclosure provides a receiving device configured to provide low density parity check (LDPC) decoding in a wireless communication system comprising a transceiver; and a controller coupled with the transceiver and configured to: control the receiver to receive, from a transmitting device, a signal corresponding to input bits, perform demodulation based on the signal to determine values corresponding to the input bits, identify a number of the input bits based on the signal, identify a base matrix and a lifting size based on the number of the input bits, identify a parity check matrix based on the base matrix, identify an index corresponding to the values, determine a number of layers based on the index and the lifting size, determine an order for LDPC decoding based on the number of layers and a predetermined sequence, and perform LDPC decoding to determine the input bits based on the values, the parity check matrix and the order.

In the drawings in which methods of the disclosure are described, the order of the description does not always correspond to the order in which steps of each method are performed, and the order relationship between the steps may be changed or the steps may be performed in parallel.

Alternatively, in the drawings in which methods of the disclosure are described, some elements may be omitted and only some elements may be included therein without departing from the essential spirit and scope of the disclosure.

Further, in methods of the disclosure, some or all of the contents of each embodiment may be combined without departing from the essential spirit and scope of the disclosure.

It will be apparent that operations represented by different blocks for the convenience of description in the operation flowcharts of the disclosure may be separately implemented by multiple processors in the actual system, but may also be implemented by a single integrated processor.

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:

1. A method for low density parity check (LDPC) decoding performed by a receiving device in a wireless communication system, the method comprising:
   receiving, from a transmitting device, a signal corresponding to input bits;
   performing demodulation based on the signal to determine values corresponding to the input bits;
   identifying a number of the input bits based on the signal;
   identifying a base matrix and a lifting size based on the number of the input bits;
   identifying a parity check matrix based on the base matrix;
   identifying an index corresponding to the values;
   determining a number of layers based on the index and the lifting size;
   determining an order for LDPC decoding based on the number of layers and a predetermined sequence; and
   performing LDPC decoding to determine the input bits based on the values, the parity check matrix and the order.

2. The method of claim 1, wherein the order for LDPC decoding is determined based on a sequence including a set of numbers less than the number of layers in the predetermined sequence.

3. The method of claim 1, wherein the index is determined based on a last column index among column indices corresponding to the values in the parity check matrix.

4. The method of claim 1, wherein the predetermined sequence includes values including:
   42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3.

5. The method of claim 1, wherein the predetermined sequence is identified based on a modulation order.

6. The method of claim 1, wherein the values include at least one of a log likelihood ratio (LLR) or likelihood ratio (LR).

7. A receiving device for low density parity check (LDPC) decoding in a wireless communication system, the receiving device comprising:
   a transceiver; and
   a controller coupled with the transceiver and configured to:
   receive, from a transmitting device, a signal corresponding to input bits,
   perform demodulation based on the signal to determine values corresponding to the input bits,
   identify a number of the input bits based on the signal,
   identify a base matrix and a lifting size based on the number of the input bits,
   identify a parity check matrix based on the base matrix,
   identify an index corresponding to the values,
   determine a number of layers based on the index and the lifting size,
   determine an order for LDPC decoding based on the number of layers and a predetermined sequence, and
   perform LDPC decoding to determine the input bits based on the values, the parity check matrix and the order.

8. The receiving device of claim 7, wherein the order for LDPC decoding is determined based on a sequence including a set of numbers less than the number of layers in the predetermined sequence.

9. The receiving device of claim 7, wherein the index is determined based on a last column index among column indices corresponding to the values in the parity check matrix.

10. The receiving device of claim 7, wherein the predetermined sequence includes values including:
   42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3.

11. The receiving device of claim 7, wherein the predetermined sequence is identified based on a modulation order.

12. The receiving device of claim 7, wherein the values include at least one of a log likelihood ratio (LLR) or likelihood ratio (LR).

\* \* \* \* \*